(12) United States Patent
Aketa et al.

(10) Patent No.: US 10,192,865 B2
(45) Date of Patent: Jan. 29, 2019

(54) METHOD OF MANUFACTURING A SEMICONDUCTOR DEVICE

(71) Applicant: ROHM CO., LTD., Kyoto (JP)

(72) Inventors: Masatoshi Aketa, Kyoto (JP); Yuki Nakano, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/442,170

(22) Filed: Feb. 24, 2017

(65) Prior Publication Data

US 2017/0162564 A1 Jun. 8, 2017

Related U.S. Application Data

(63) Continuation of application No. 15/226,913, filed on Aug. 2, 2016, now Pat. No. 9,620,588, which is a
(Continued)

(30) Foreign Application Priority Data

Aug. 2, 2011 (JP) .................................. 2011-169349
Oct. 25, 2011 (JP) .................................. 2011-234058
Dec. 14, 2011 (JP) .................................. 2011-273401

(51) Int. Cl.
*H01L 27/07* (2006.01)
*H01L 21/82* (2006.01)
(Continued)

(52) U.S. Cl.
CPC .... *H01L 27/0716* (2013.01); *H01L 21/02378* (2013.01); *H01L 21/02529* (2013.01); *H01L 21/02634* (2013.01); *H01L 21/046* (2013.01); *H01L 21/0475* (2013.01); *H01L 21/30604* (2013.01); *H01L 21/8213* (2013.01); *H01L 23/3114* (2013.01); *H01L 23/49844* (2013.01); *H01L 24/05* (2013.01); *H01L 24/32* (2013.01); *H01L 25/072* (2013.01); *H01L 25/18* (2013.01);
(Continued)

(58) Field of Classification Search
None
See application file for complete search history.

(56) References Cited

U.S. PATENT DOCUMENTS 5,554,561 A 9/1996 Plumton
6,054,748 A 4/2000 Tsukuda et al.
(Continued)

FOREIGN PATENT DOCUMENTS

DE 10-2005-019178 A1 11/2006
EP 1835544 A2 9/2007
(Continued)

OTHER PUBLICATIONS

Extended European Search Report dated Feb. 13, 2015.

*Primary Examiner* — Mounir S Amer
(74) *Attorney, Agent, or Firm* — Rabin & Berdo, P.C.

(57) ABSTRACT

A method for manufacturing a semiconductor device having an SiC-IGBT and an SiC-MOSFET in a single semiconductor chip, including forming a second conductive-type SiC base layer on a substrate, and selectively implanting first and second conductive-type impurities into surfaces of the substrate and base layer to form a collector region, a channel region in a surficial portion of the SiC base layer, and an emitter region in a surficial portion of the channel region, the emitter region serving also as a source region of the SiC-MOSFET.

10 Claims, 46 Drawing Sheets

Related U.S. Application Data continuation of application No. 14/236,567, filed as application No. PCT/JP2012/069336 on Jul. 30, 2012, now Pat. No. 9,419,117.

(51) Int. Cl.

| | |
|---|---|
| *H01L 29/66* | (2006.01) |
| *H01L 21/02* | (2006.01) |
| *H01L 29/739* | (2006.01) |
| *H01L 21/306* | (2006.01) |
| *H01L 29/10* | (2006.01) |
| *H01L 29/08* | (2006.01) |
| *H01L 29/06* | (2006.01) |
| *H01L 29/417* | (2006.01) |
| *H01L 23/00* | (2006.01) |
| *H01L 29/16* | (2006.01) |
| *H01L 25/18* | (2006.01) |
| *H01L 21/04* | (2006.01) |
| *H01L 23/31* | (2006.01) |
| *H01L 23/498* | (2006.01) |
| *H01L 25/07* | (2006.01) |
| *H01L 25/00* | (2006.01) |
| *H01L 29/40* | (2006.01) |
| *H01L 29/78* | (2006.01) |
| *H01L 29/872* | (2006.01) |
| *H01L 29/47* | (2006.01) |
| *H02P 27/06* | (2006.01) |

(52) U.S. Cl.

CPC .......... *H01L 25/50* (2013.01); *H01L 29/0619* (2013.01); *H01L 29/0661* (2013.01); *H01L 29/0692* (2013.01); *H01L 29/0804* (2013.01); *H01L 29/0821* (2013.01); *H01L 29/0834* (2013.01); *H01L 29/0865* (2013.01); *H01L 29/1004* (2013.01); *H01L 29/1033* (2013.01); *H01L 29/1095* (2013.01); *H01L 29/1608* (2013.01); *H01L 29/408* (2013.01); *H01L 29/41766* (2013.01); *H01L 29/6606* (2013.01); *H01L 29/66068* (2013.01); *H01L 29/66325* (2013.01); *H01L 29/66333* (2013.01); *H01L 29/66666* (2013.01); *H01L 29/66712* (2013.01); *H01L 29/7393* (2013.01); *H01L 29/7395* (2013.01); *H01L 29/7396* (2013.01); *H01L 29/7397* (2013.01); *H01L 29/7802* (2013.01); *H01L 29/7805* (2013.01); *H01L 29/7827* (2013.01); *H01L 29/872* (2013.01); H01L 23/3171 (2013.01); H01L 24/06 (2013.01); H01L 24/48 (2013.01); H01L 24/49 (2013.01); H01L 24/73 (2013.01); *H01L 29/0696* (2013.01); *H01L 29/47* (2013.01); H01L 2224/02166 (2013.01); H01L 2224/04026 (2013.01); H01L 2224/04042 (2013.01); H01L 2224/05018 (2013.01); H01L 2224/05155 (2013.01); H01L 2224/05166 (2013.01); H01L 2224/05552 (2013.01); H01L 2224/05557 (2013.01); H01L 2224/05567 (2013.01); H01L 2224/05568 (2013.01); H01L 2224/05624 (2013.01); H01L 2224/06181 (2013.01); H01L 2224/32245 (2013.01); H01L 2224/48091 (2013.01); H01L 2224/48247 (2013.01); H01L 2224/4917 (2013.01); H01L 2224/49113 (2013.01); H01L 2224/73265 (2013.01); H01L 2924/00014 (2013.01); H01L 2924/01029 (2013.01); H01L 2924/10155 (2013.01); H01L 2924/10158 (2013.01); H01L 2924/12032 (2013.01); H01L 2924/12036 (2013.01); H01L 2924/1305 (2013.01); H01L 2924/1306 (2013.01); H01L 2924/13055 (2013.01); H01L 2924/13091 (2013.01); H02P 27/06 (2013.01)

(56) References Cited

U.S. PATENT DOCUMENTS

| | | |
|---|---|---|
| 6,097,046 A | 8/2000 | Plumton |
| 2002/0190340 A1 | 12/2002 | Moriguchi et al. |
| 2007/0181975 A1 | 8/2007 | Koops et al. |
| 2007/0215938 A1 | 9/2007 | Yanagida et al. |
| 2008/0135870 A1 | 6/2008 | Okada et al. |
| 2008/0150021 A1 | 6/2008 | Koops et al. |
| 2009/0302444 A1 | 12/2009 | Ueda et al. |
| 2010/0096692 A1 | 4/2010 | Saito et al. |
| 2010/0259201 A1 | 10/2010 | Kawano et al. |
| 2011/0012132 A1 | 1/2011 | Otsuka et al. |
| 2011/0018005 A1 | 1/2011 | Nakano |
| 2011/0092063 A1 | 4/2011 | Kawai et al. |
| 2011/0266617 A1 | 11/2011 | Nakazawa et al. |
| 2013/0001703 A1 | 1/2013 | Sugawara |

FOREIGN PATENT DOCUMENTS

| | | | |
|---|---|---|---|
| EP | 1918980 | A2 | 5/2008 |
| JP | 07-153951 | A | 6/1995 |
| JP | 07-326754 | A | 12/1995 |
| JP | 10-173175 | A | 6/1998 |
| JP | H10-321877 | A | 12/1998 |
| JP | 2002-373989 | A | 12/2002 |
| JP | 2003-133553 | A | 5/2003 |
| JP | 2006-156658 | A | 6/2006 |
| JP | 2007-528598 | A | 10/2007 |
| JP | 2008-218651 | A | 9/2008 |
| JP | 2009-253139 | A | 10/2009 |
| JP | 2010-050307 | A | 3/2010 |
| JP | 2010-074051 | A | 4/2010 |
| JP | 2010-098123 | A | 4/2010 |
| JP | 2010-135573 | A | 6/2010 |
| JP | 2010-244977 | A | 10/2010 |
| JP | 2010-251517 | A | 11/2010 |
| JP | 2011-044688 | A | 3/2011 |
| JP | 2011-049267 | A | 3/2011 |
| WO | WO 2011-129443 | A1 | 10/2011 |

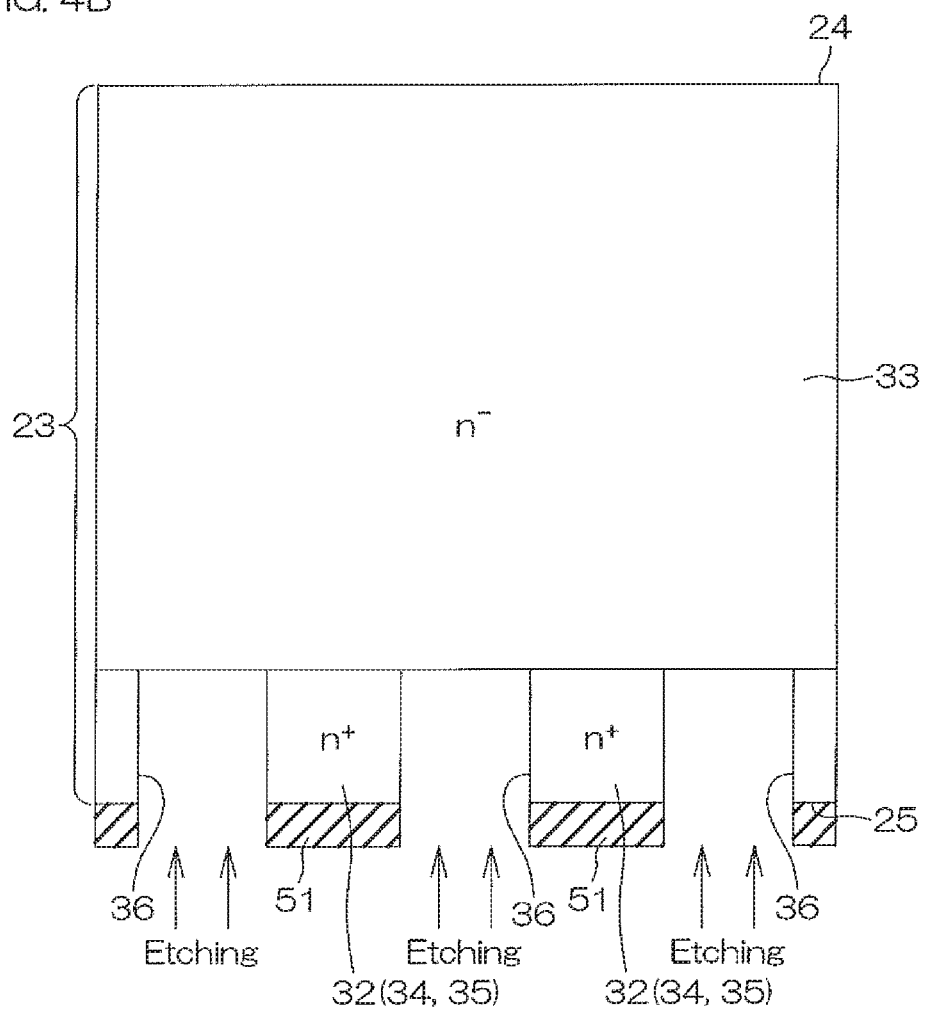

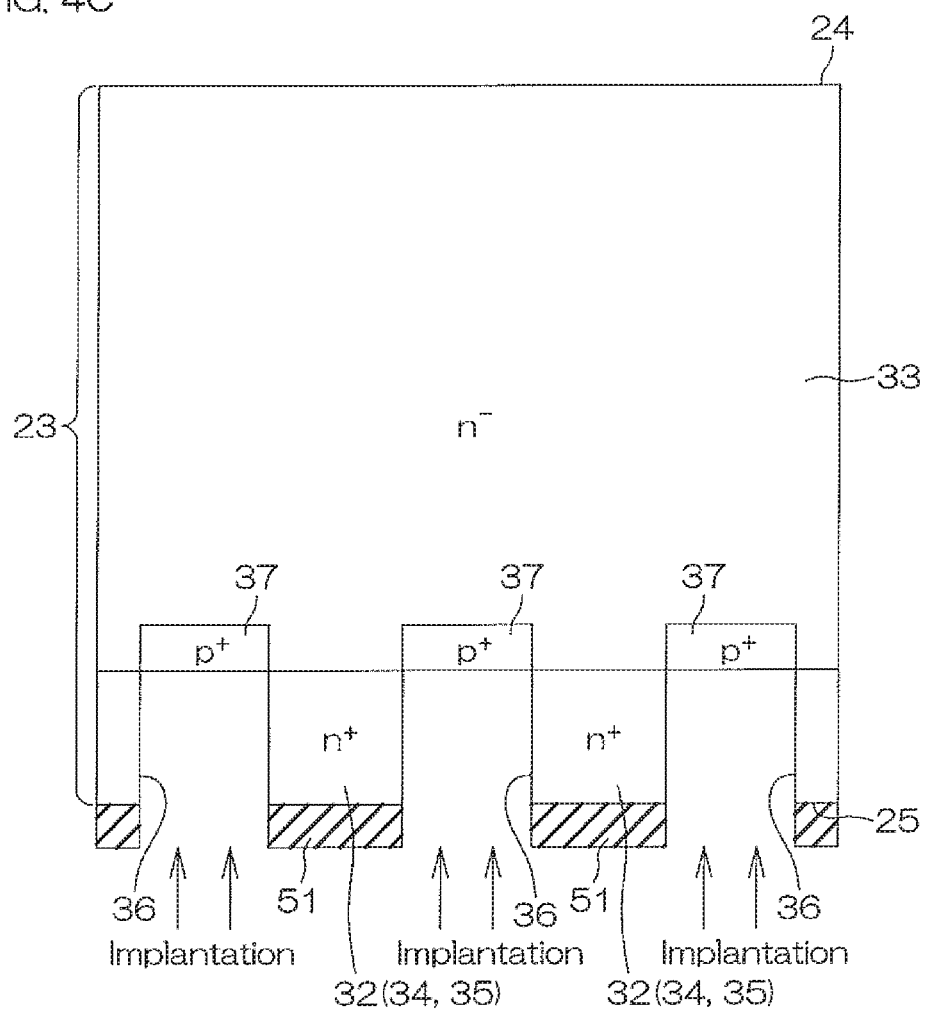

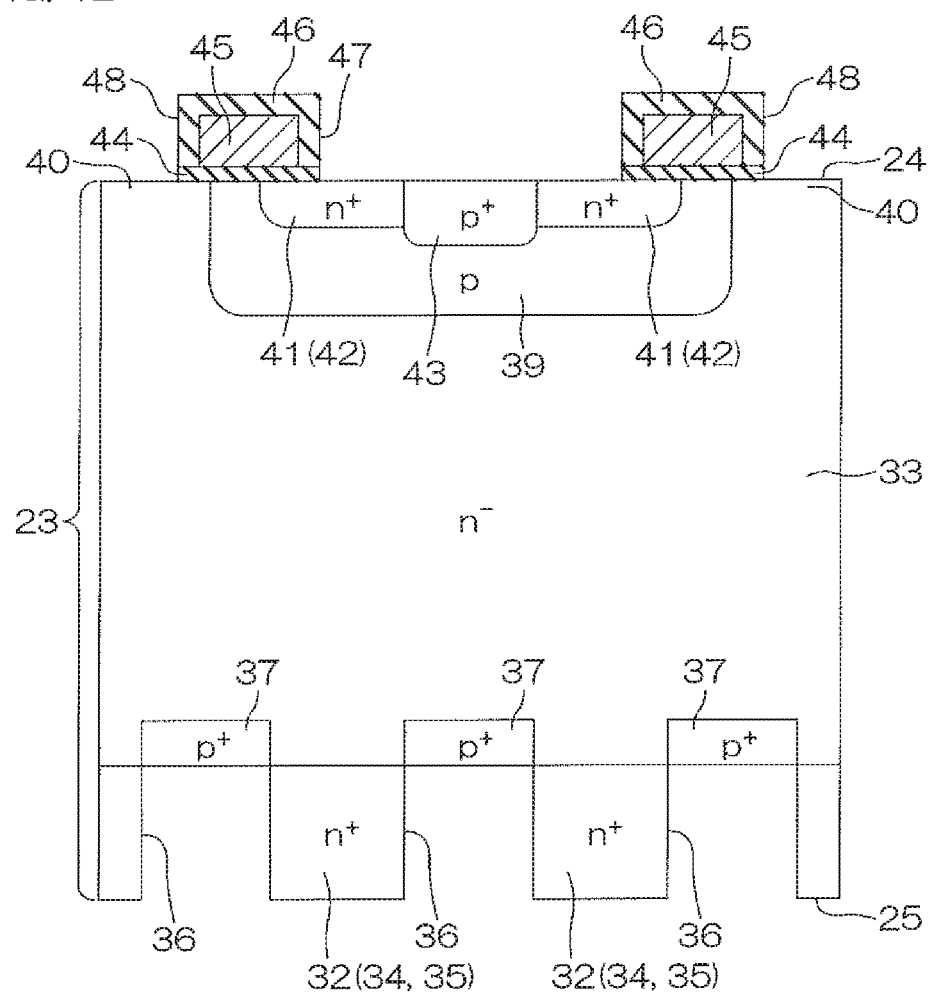

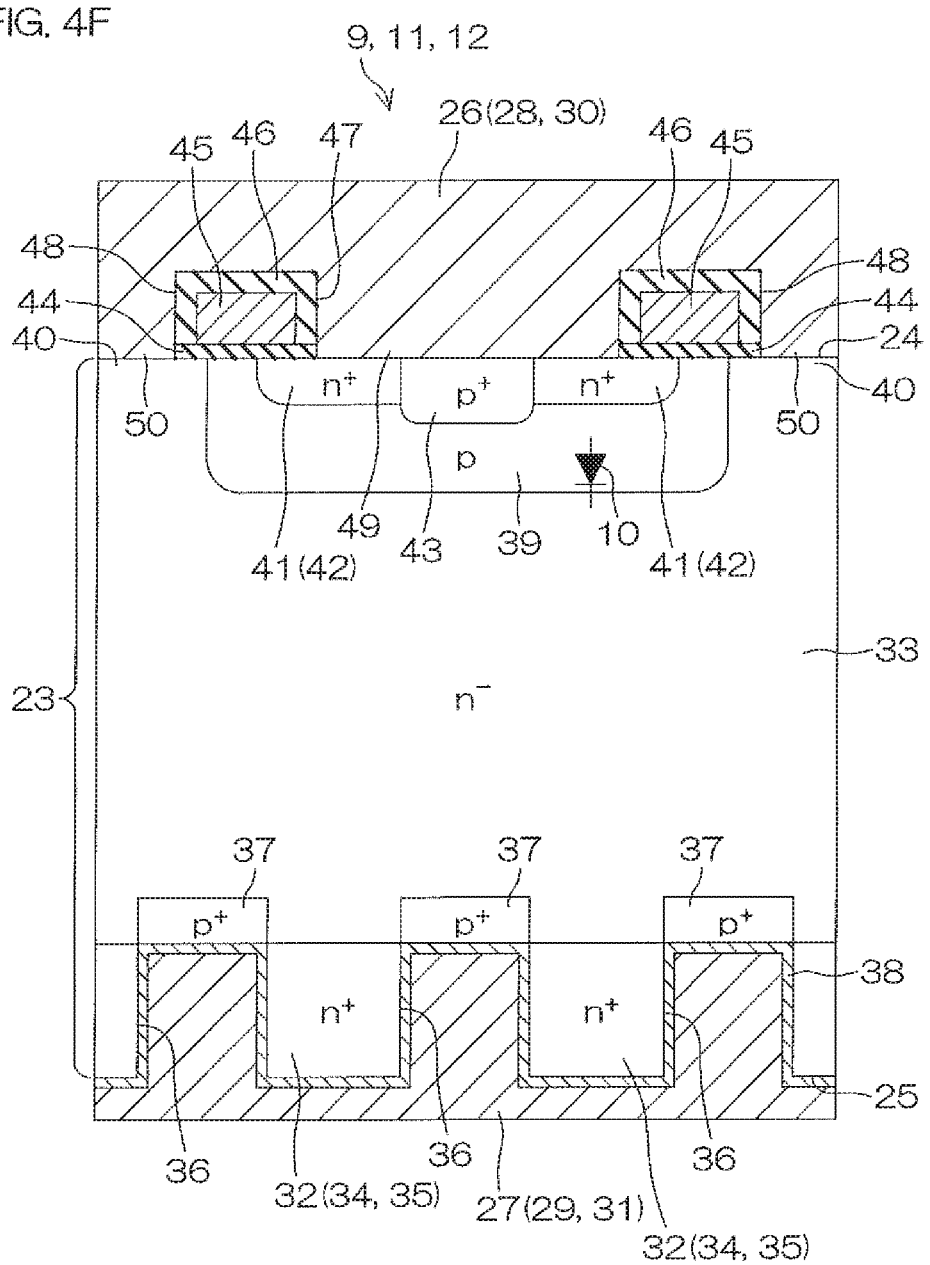

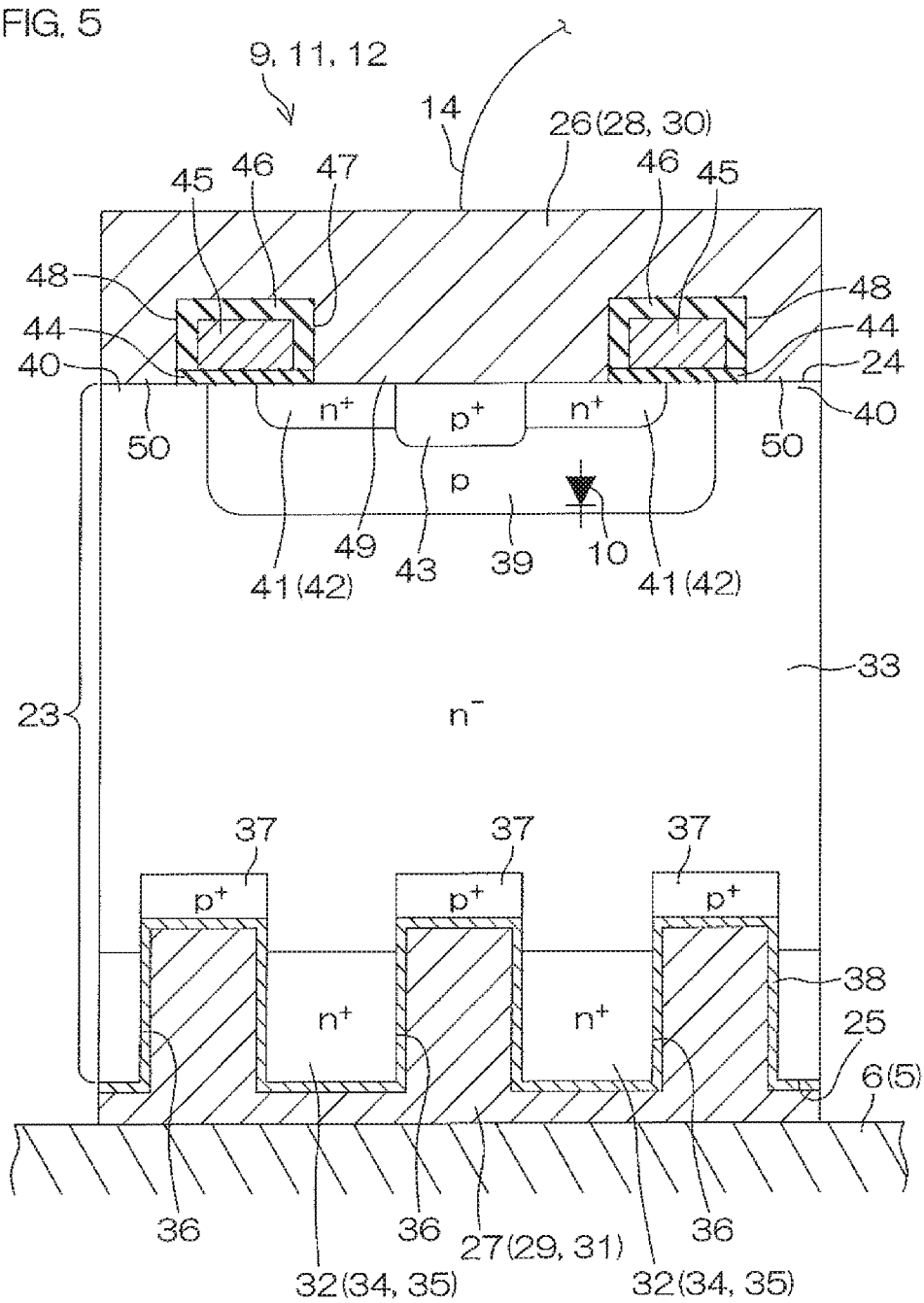

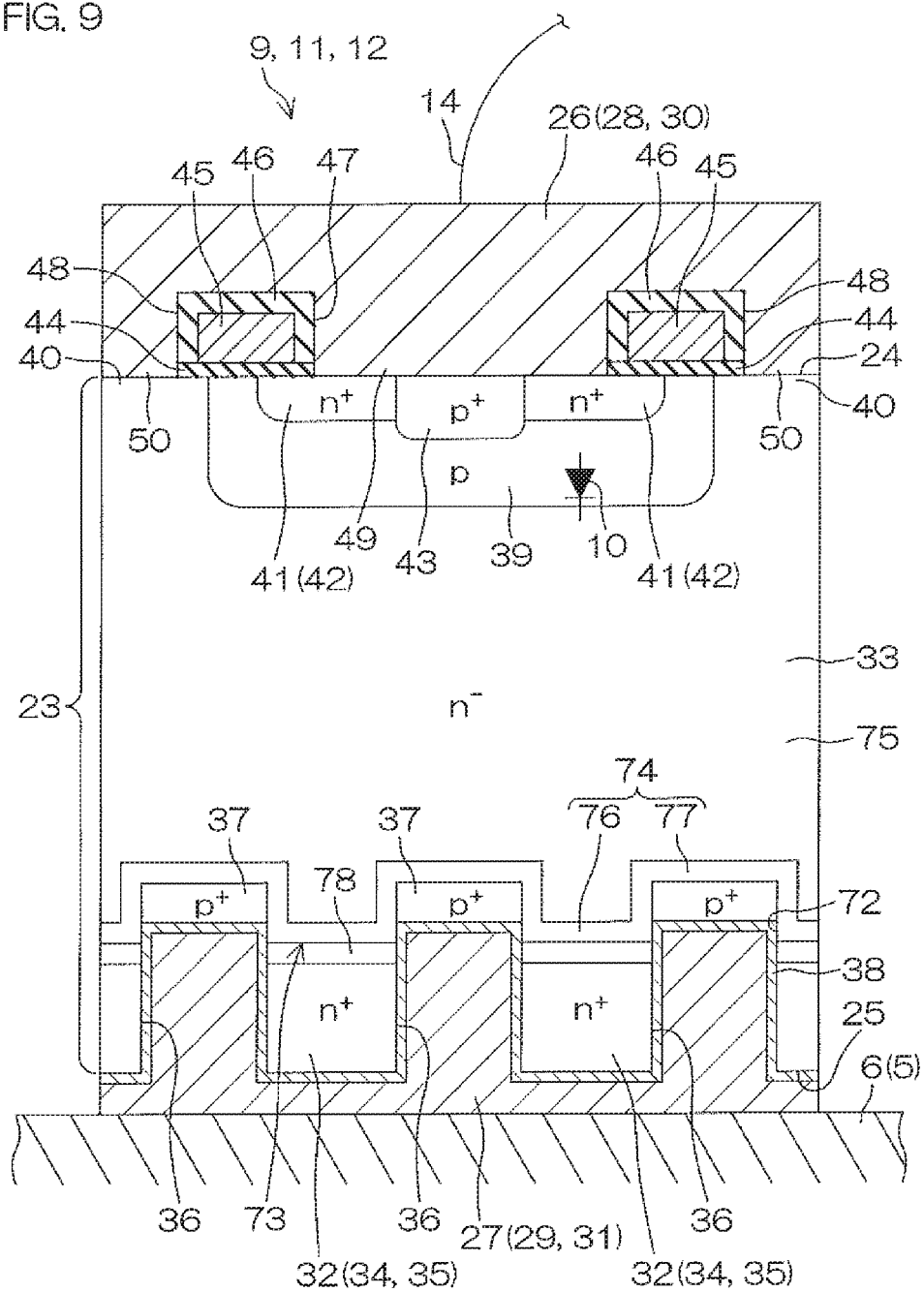

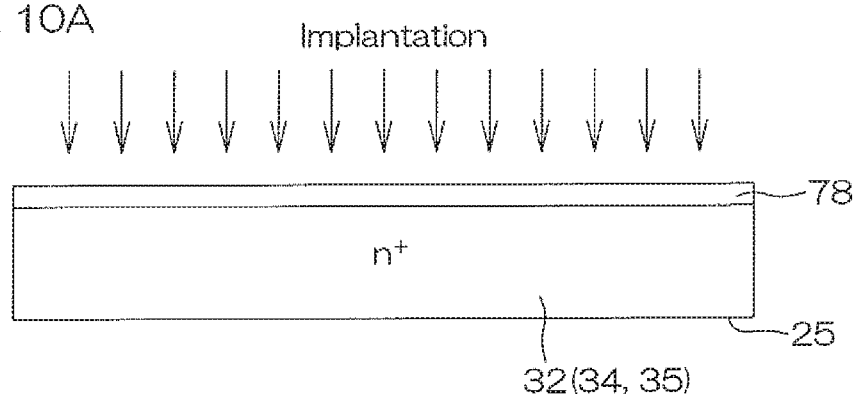
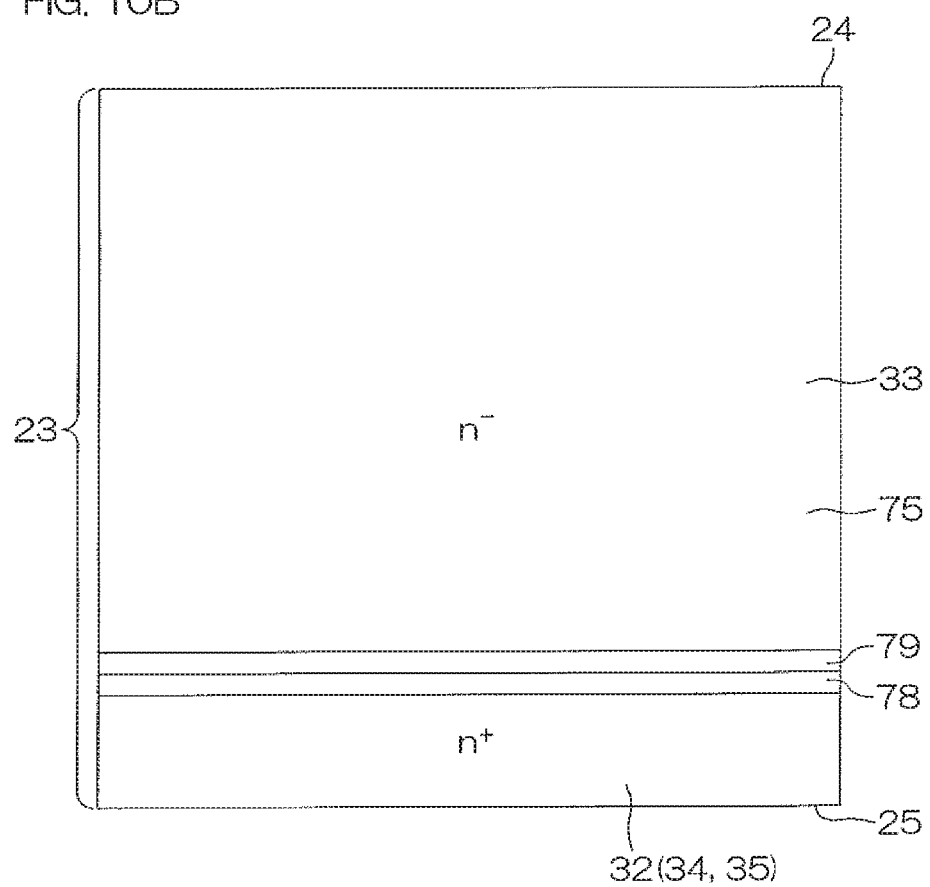

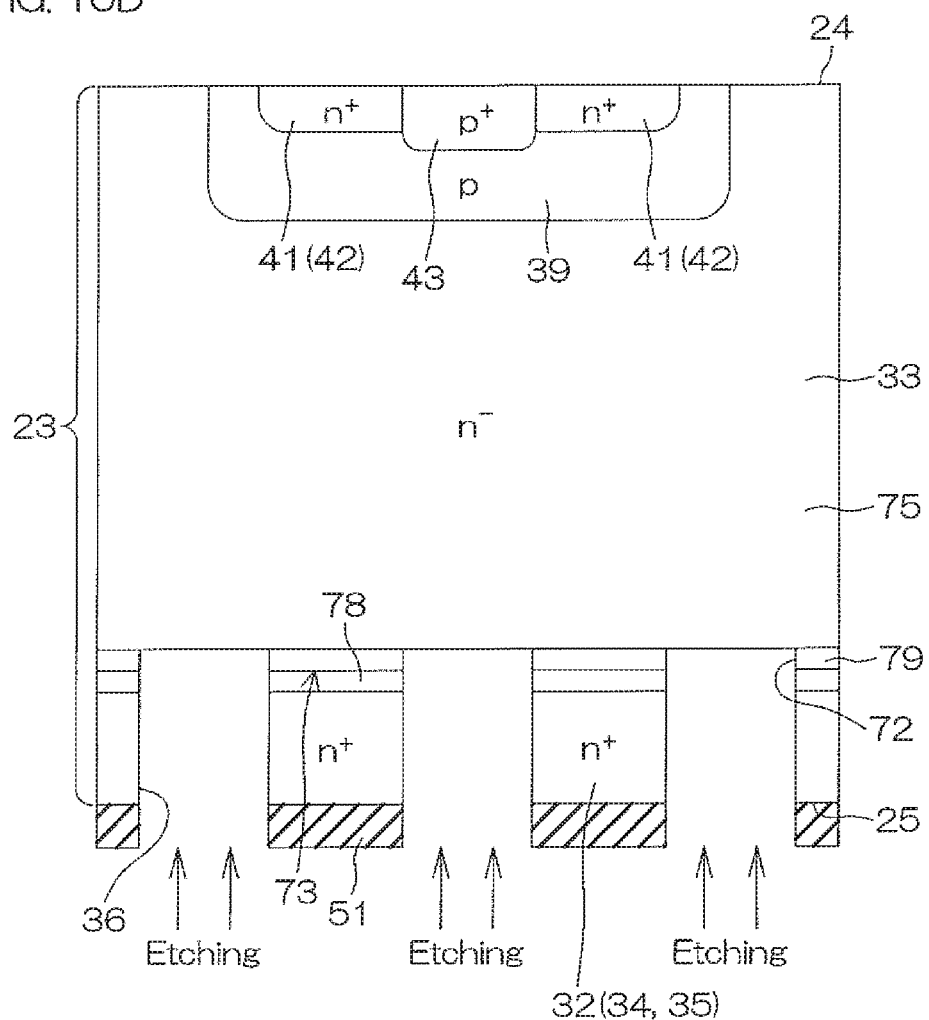

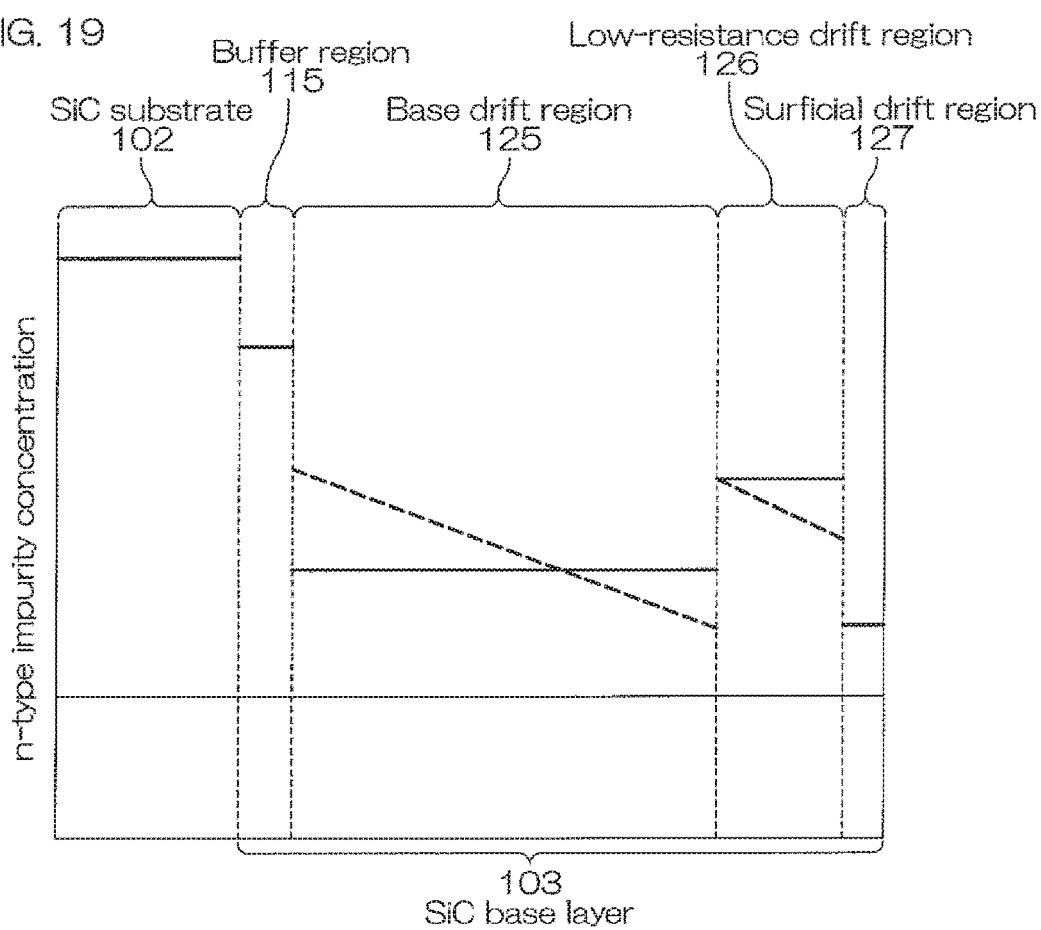

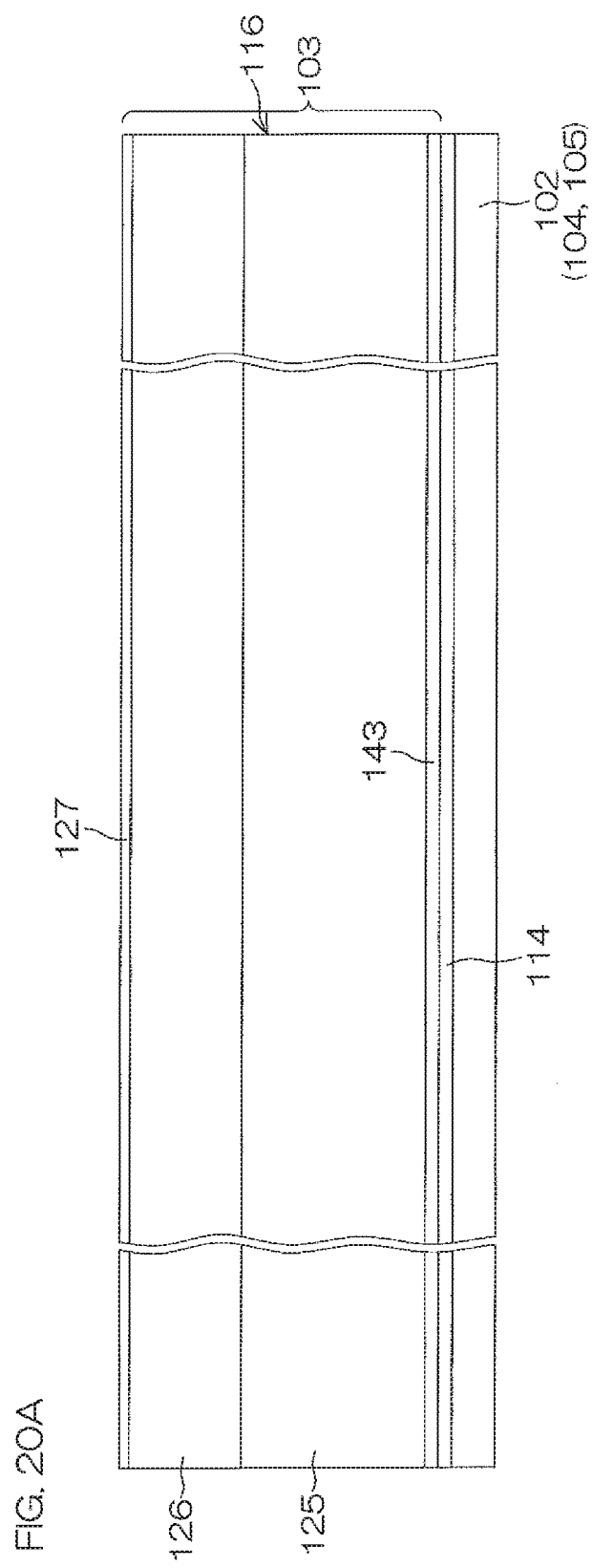

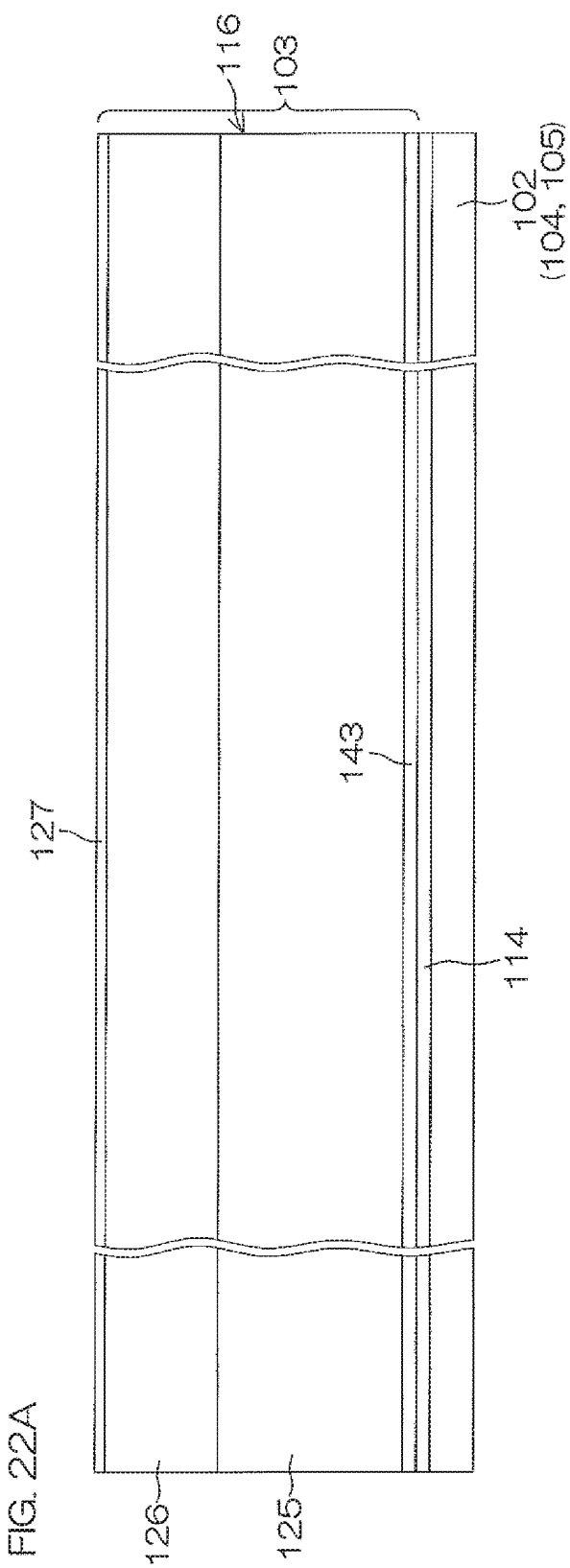

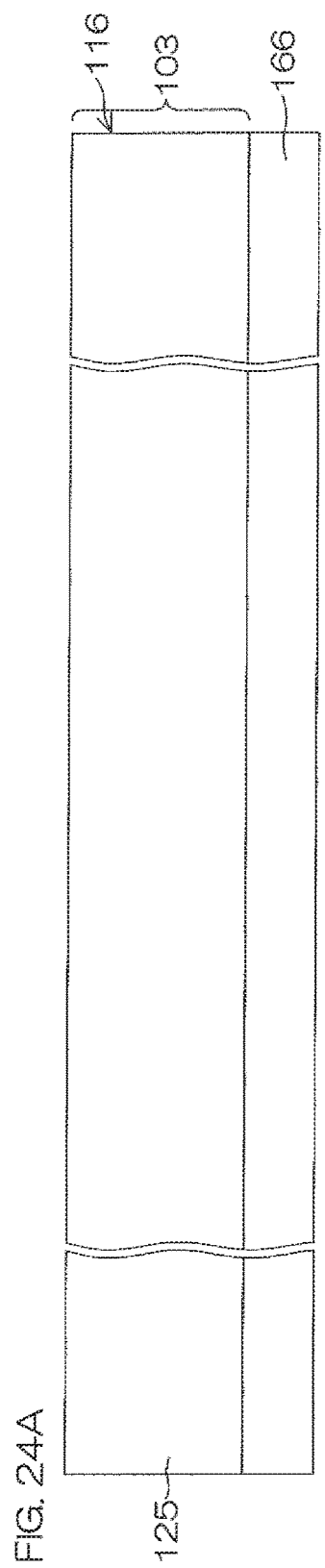

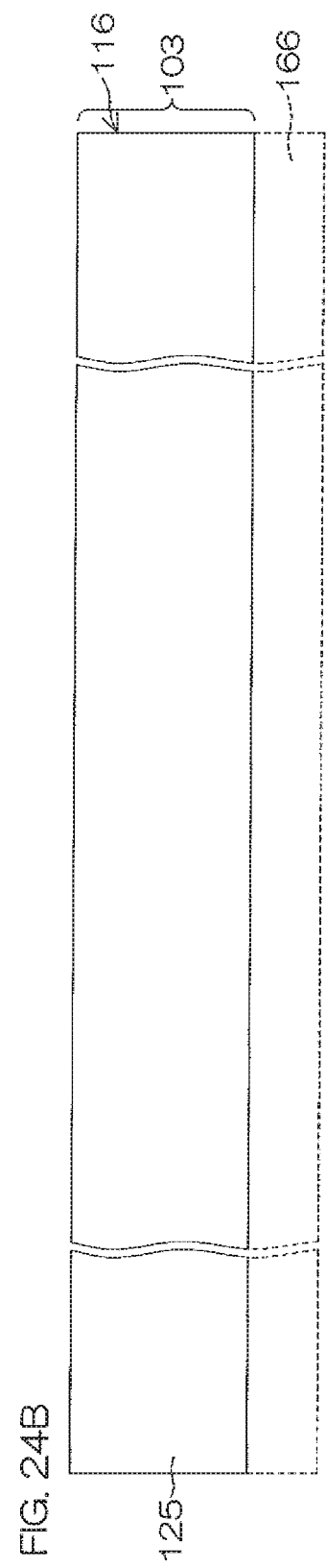

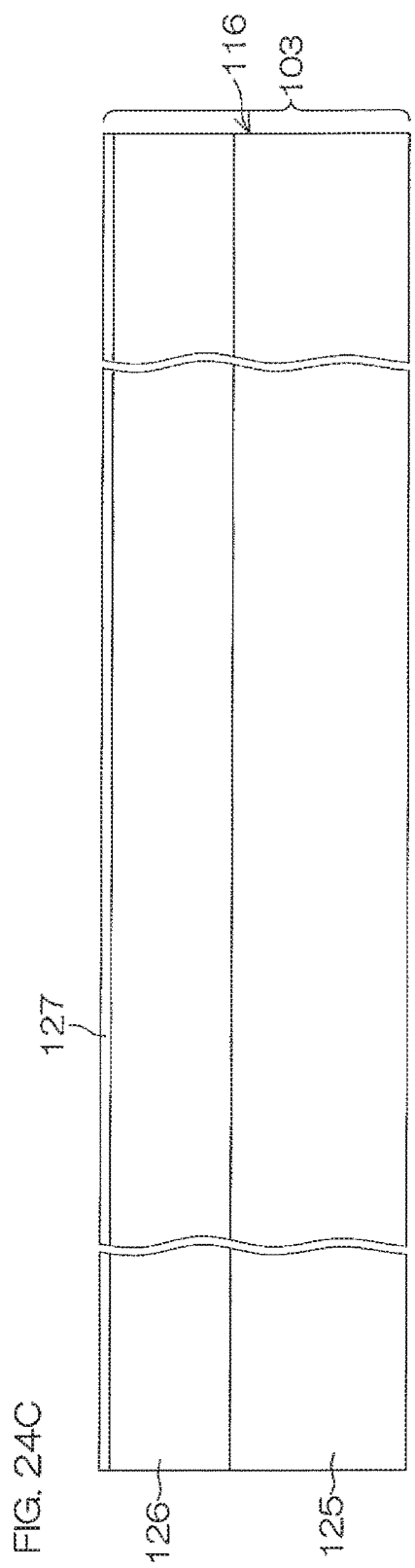

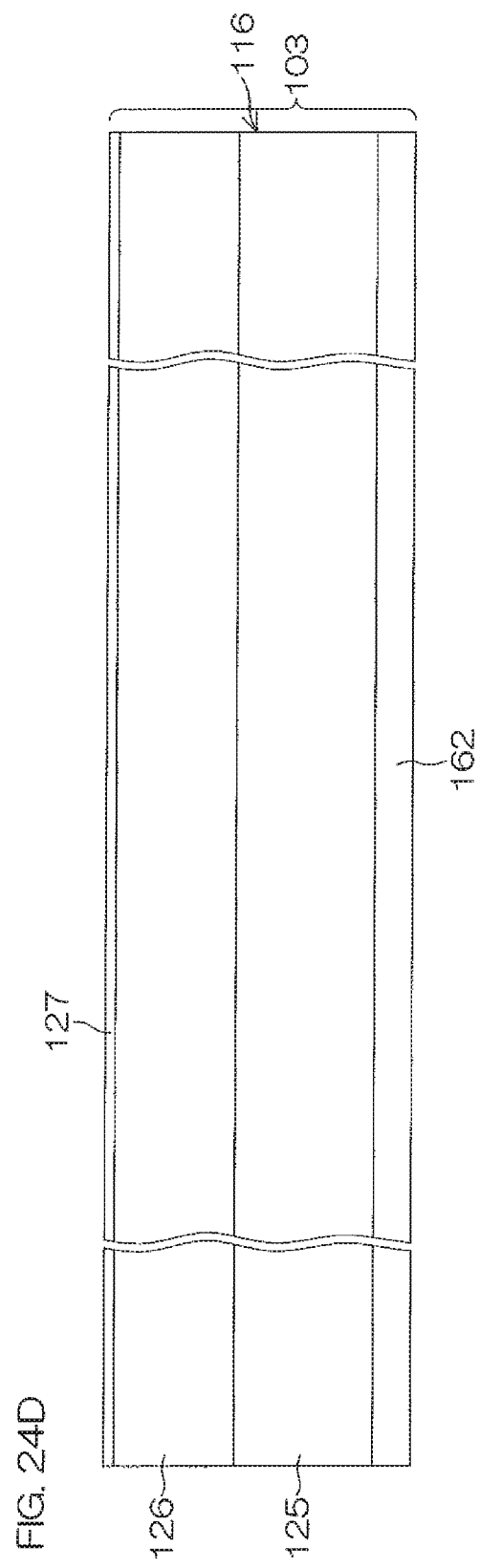

METHOD OF MANUFACTURING A SEMICONDUCTOR DEVICE

CROSS-REFERENCE TO RELATED APPLICATIONS

This application is a continuation of U.S. application Ser. No. 15/226,913, filed on Aug. 2, 2016, which is a continuation of U.S. application Ser. No. 14/236,567, filed on Jan. 31, 2014 (now U.S. Pat. No. 9,419,117, issued on Aug. 16, 2016), which is a National Stage application of PCT/JP2012/069336, filed on Jul. 30, 2012. This application claims the benefit of priority of Japanese application serial numbers 2011-273401, filed on Dec. 14, 2011, 2011-234058, filed on Oct. 25, 2011, and 2011-169349, filed on Aug. 2, 2011. The disclosures of these prior US and Japanese applications are incorporated herein by reference.

TECHNICAL FIELD

The present invention relates to a semiconductor device including an SiC-IGBT (Insulated Gate Bipolar Semiconductor) and a method for manufacturing the semiconductor device.

BACKGROUND ART

SiC semiconductor devices have recently become the focus of attention, which are mainly used for systems in various power electronics fields such as motor control systems and power conversion systems.

Patent Document 1, for example, discloses a vertical IGBT including a p-type SiC substrate (collector layer), an n-type drift layer formed on the SiC substrate, a p-type base region formed in an upper portion of the drift layer, and an n-type emitter region formed in an upper portion of the base region.

Patent Document 2 discloses a trench-gate type MOSFET including an $n^+$-type SiC substrate, an $n^-$-type base layer formed on the SiC substrate, a p-type body region formed in a surficial portion of the base layer, an $n^+$-type source region formed in a surficial portion of the body region, a gate trench penetrating from the surface of the base layer through the source region and the body region, and a gate electrode embedded in the gate trench with a gate insulating film therebetween.

PRIOR ART DOCUMENTS

Patent Documents

Patent Document 1: Japanese Unexamined Patent Publication No. 2011-49267
Patent Document 2: Japanese Unexamined Patent Publication No. 2011-44688
Patent Document 3: Japanese Unexamined Patent Publication No. 2010-251517
Patent Document 4: Japanese Unexamined Patent Publication No. 2010-74051

SUMMARY OF THE INVENTION

Means for Solving the Problems

The present invention is directed to a semiconductor device including a semiconductor chip formed with an SiC-IGBT (Insulated Gate Bipolar Semiconductor) including an SiC semiconductor layer having a first surface and a second surface, a first conductive-type collector region formed such that the collector region is exposed on the second surface of the SiC semiconductor layer, a second conductive-type base region formed closer to the first surface of the SiC semiconductor layer with respect to the collector region such that the base region is in contact with the collector region, a first conductive-type channel region formed closer to the first surface of the SiC semiconductor layer with respect to the base region such that the channel region is in contact with the base region, a second conductive-type emitter region formed closer to the first surface of the SiC semiconductor layer with respect to the channel region such that the emitter region is in contact with the channel region, the emitter region defining a portion of the first surface of the SiC semiconductor layer, a collector electrode formed such that the collector electrode is in contact with the second surface of the SiC semiconductor layer, the collector electrode connected to the collector region, and an emitter electrode formed such that the emitter electrode is in contact with the first surface of the SiC semiconductor layer, the emitter electrode connected to the emitter region, and a MOSFET (Metal Oxide Semiconductor Field Effect Transistor) connected in parallel to the SiC-IGBT, the MOSFET including a second conductive-type source region electrically connected to the emitter electrode, and a second conductive-type drain region electrically connected to the collector electrode.

In an SiC-IGBT, electrons or holes are injected from the collector region to the base region to cause a conductivity modulation in the base region, whereby the on-resistance of the base region can be reduced. For this reason, even if the base region may have a low impurity concentration and therefore a high original resistance due to the impurity concentration to increase the voltage resistance of the IGBT, the on-resistance can be maintained sufficiently low. As a result, the IGBT is more useful as a device for use in a high-voltage range than an SiC-MOSFET.

Meanwhile, since SiC has a pn barrier higher than that of Si, a high on-voltage is required to use the SiC-IGBT in a low-current range (e.g., of 4 A or lower). This is a very high value even in comparison with the SiC-MOSFET. Unlike the IGBT, the SiC-MOSFET, which uses SiC, undergoes a linear increase in the on-current from the initial stage, which is not particularly disadvantageous in the low-current range. For use in a current range of around 1 A, for example, the SiC-MOSFET has an on-voltage of about 0.8 V and the Si-IGBT has an on-voltage of about 1.3 V, while the SiC-IGBT has an on-voltage of 3.5 V, that is, there is a difference of about four times.

Hence, in accordance with the semiconductor device according to the present invention, the MOSFET is connected in parallel to the SiC-IGBT. This allows a current to flow through the semiconductor device by turning on the SiC-IGBT or the MOSFET. Accordingly, for use in a low-current range, the semiconductor device can be operated with the on-voltage of the MOSFET, whereby the on-voltage in the low-current range can be reduced.

In addition, the MOSFET connected to the SiC-IGBT may be an Si-based MOSFET such as SiC-MOSFET or Si-MOSFET or, alternatively, a GaN-based MOSFET or a GaAs-based MOSFET. Among these, SiC-MOSFET is preferable. In the case of SiC-MOSFET, the SiC-IGBT and the SiC-MOSFET can be integrated into a single semiconductor chip.

Specifically, in the semiconductor device according to the present invention, it is preferable that the MOSFET includes an SiC-MOSFET provided in the semiconductor chip, the source region be formed utilizing the emitter region of the SiC-IGBT, the drain region be formed adjacent to the collector region of the SiC-IGBT such that the drain region is selectively exposed on the second surface of the SiC semiconductor layer, and the collector electrode be collectively connected to the drain region and the collector region.

With the arrangement above, the emitter region, the base region, the channel region, the emitter electrode, and the collector electrode can be shared between the SiC-IGBT and the SiC-MOSFET, whereby these devices can be integrated into a single unit cell. As a result, the semiconductor device can be reduced in size and thereby the capacitance between the devices can be reduced.

In addition, the SiC-IGBT and the SiC-MOSFET may be formed as separate unit cells in the SiC semiconductor layer.

Also, in the semiconductor device according to the present invention, it is preferable that the SiC semiconductor layer includes a second conductive-type SiC substrate defining the second surface of the SiC semiconductor layer and selectively formed with a trench from the second surface toward the first surface and a second conductive-type SiC base layer formed on the SiC substrate to serve as the base region defining the first surface of the SiC semiconductor layer, in which the drain region be formed utilizing the SiC substrate and the collector region be formed at the bottom surface of the trench.

The semiconductor device according to the present invention with such a structure can be manufactured by, for example, a method for manufacturing a semiconductor device having an SiC-IGBT and an SiC-MOSFET in a single semiconductor chip, the method including the steps of forming a second conductive-type SiC base layer on a first surface of a second conductive-type SiC substrate having the first surface and a second surface and defining a drain region of the SiC-MOSFET, selectively etching the second surface of the SiC substrate to form a trench in the SiC substrate, implanting first conductive-type impurities into the bottom surface of the trench to form a collector region in the bottom surface, selectively implanting first conductive-type impurities into the surface of the SiC base layer to form a channel region in a surficial portion of the SiC base layer, and selectively implanting second conductive-type impurities into the surface of the SiC base layer to form an emitter region in a surficial portion of the channel region, the emitter region serving also as a source region of the SiC-MOSFET.

In accordance with the method above, the collector region and the drain region, which are selectively exposed on the second surface of the SiC semiconductor layer, can be formed easily utilizing a known semiconductor device manufacturing technique including etching of the SiC substrate and impurity implantation into the SiC substrate and the SiC base layer.

The step of forming the trench may also include the step of etching until the SiC base layer is exposed to the trench.

This allows the deepest portion of the trench to reach the interface between the SiC substrate and the SiC base layer. That is, the deepest portion of the trench may be positioned at the interface between the SiC substrate and the SiC base layer or may be at a position nearer the first surface of the SiC base layer with respect to the interface. In this case, the bottom surface and a portion of the side surface of the trench is to be defined by the SiC base layer, while the rest of the side surface is to be defined by the SiC substrate. Alternatively, the deepest portion of the trench may be at a position nearer the second surface of the SiC substrate with respect to the interface. In this case, the bottom surface and the side surface of the trench are to be defined by the SiC substrate.

Also, in the semiconductor device according to the present invention, the SiC semiconductor layer may include a first conductive-type SiC substrate defining the second surface of the SiC semiconductor layer and selectively formed with a trench from the second surface toward the first surface and a second conductive-type SiC base layer formed on the SiC substrate to serve as the base region defining the first surface of the SiC semiconductor layer, in which it is preferable that the collector region be formed utilizing the SiC substrate and the drain region be formed at the bottom surface of the trench.

It is also preferable that a plurality of the trenches be formed in a striped manner.

In the semiconductor device according to the present invention, the SiC semiconductor layer may include a second conductive-type SiC substrate defining the second surface of the SiC semiconductor layer and selectively formed with a trench from the second surface toward the first surface and a second conductive-type SiC base layer formed on the SiC substrate to serve as the base region defining the first surface of the SiC semiconductor layer, in which the drain region and the collector region may be formed at the bottom surface of the trench in a manner adjacent to each other.

The semiconductor device according to the present invention with such a structure can be manufactured by, for example, a method for manufacturing a semiconductor device having an SiC-IGBT and an SiC-MOSFET in a single semiconductor chip, the method including the steps of forming a second conductive-type SiC base layer on a first surface of a second conductive-type SiC substrate having the first surface and a second surface, selectively etching the second surface of the SiC substrate to form a trench in the SiC substrate, selectively implanting first conductive-type impurities into the bottom surface of the trench to form a collector region in the bottom surface, selectively implanting second conductive-type impurities into the bottom surface of the trench to form a drain region in the bottom surface, selectively implanting first conductive-type impurities into the surface of the SiC base layer to form a channel region in a surficial portion of the SiC base layer, and selectively implanting second conductive-type impurities into the surface of the SiC base layer to form an emitter region in a surficial portion of the channel region, the emitter region serving also as a source region of the SiC-MOSFET.

Also in accordance with the method above, the collector region and the drain region, which are selectively exposed on the second surface of the SiC semiconductor layer, can be formed easily utilizing a known semiconductor device manufacturing technique including etching of the SiC substrate and impurity implantation into the SiC substrate and the SiC base layer.

Further, in the semiconductor device according to the present invention, the SiC semiconductor layer may include an SiC substrate defining the second surface of the SiC semiconductor layer and having a first conductive-type portion and a second conductive-type portion segmented such that the first and second conductive-type portions are exposed separately on the second surface and a second conductive-type SiC base layer formed on the SiC substrate to serve as the base region defining the first surface of the SiC semiconductor layer, in which it is preferable that the collector region be formed utilizing the first conductive-type portion of the SiC substrate and the drain region be formed utilizing the second conductive-type portion of the SiC substrate.

In this case, it is preferable that a plurality of the first conductive-type portions and the second conductive-type portions of the SiC substrate be formed alternately in a striped manner.

In such a case of integrating the SiC-IGBT and the SiC-MOSFET into one chip, the collector electrode, which is collectively connected to the drain region and the collector region, preferably has metal silicide in a portion in contact with the drain region and the collector region.

The metal silicide can bring the collector electrode into ohmic contact with the SiC, whether the conductive type of the SiC is p-type or n-type.

Also, in the semiconductor device according to the present invention, the base region preferably includes a drift region having a first impurity concentration in contact with the channel region and a buffer region formed such that the buffer region surrounds the collector region between the drift region and the collector region and having a second impurity concentration higher than the first impurity concentration.

With the arrangement above, when the SiC-IGBT is in an off-state, the buffer region can inhibit the extension of the depletion layer generated at the interface between the channel region and the drift region and thus prevent punch-through. It is therefore possible to design the semiconductor device as a punch-through type device to thereby achieve a low on-resistance.

It is then preferable that the SiC semiconductor layer includes a second conductive-type SiC substrate defining the second surface of the SiC semiconductor layer and a second conductive-type SiC base layer formed on the SiC substrate to serve as the base region defining the first surface of the SiC semiconductor layer, and a trench penetrating from the second surface of the SiC substrate through the SiC substrate to reach the SiC base layer be selectively formed, in which the drain region be formed utilizing the SiC substrate, the collector region be formed at the bottom surface of the trench, and the SiC base layer includes a second conductive-type buffer layer formed such that the buffer layer surrounds the collector region to serve as the buffer region and a second conductive-type drift layer formed on the buffer layer to serve as the drift region.

The SiC semiconductor layer may also include an SiC substrate defining the second surface of the SiC semiconductor layer and having a first conductive-type portion and a second conductive-type portion segmented such that the first and second conductive-type portions are exposed separately on the second surface and a second conductive-type SiC base layer formed on the SiC substrate to serve as the base region defining the first surface of the SiC semiconductor layer, in which it is preferable that the collector region be formed utilizing the first conductive-type portion of the SiC substrate, the drain region be formed utilizing the second conductive-type portion of the SiC substrate, and the SiC base layer includes a second conductive-type buffer layer formed on the SiC substrate such that the buffer layer covers the drain region and the collector region to serve as the buffer region and a second conductive-type drift layer formed on the buffer layer to serve as the drift region.

The semiconductor device according to the present invention preferably further includes a pn diode connected in parallel to the SiC-IGBT including a first conductive-type region electrically connected to the emitter electrode, a second conductive-type region electrically connected to the collector electrode.

IGBTs, in which anodes or cathodes of pn diodes are connected, cannot incorporate a body diode like MOSFETs. It is therefore difficult to consume a back electromotive force if occurring to the load.

Hence, in accordance with the semiconductor device according to the present invention, the pn diode is connected in parallel to the SiC-IGBT. Accordingly, even if a back electromotive force may occur to the load, the rectification behavior of the pn diode causes a current due to the back electromotive force to flow through the load as a reflux current, which can prevent such a high back electromotive force from being applied to the SiC-IGBT.

In such a case of integrating the SiC-IGBT and the SiC-MOSFET into one chip, it is also preferable that the pn diode includes a body diode incorporated in the MOSFET. The body diode may be formed utilizing a pn junction between the channel region and the base region of the MOSFET provided in the semiconductor chip.

This also allows the pn diode to be integrated into the same unit cell as the SiC-IGBT and the SiC-MOSFET, whereby the semiconductor device can be further reduced in size.

The semiconductor device according to the present invention preferably further includes a Schottky barrier diode connected in parallel to the SiC-IGBT including a second conductive-type drift region, an anode electrode forming a Schottky junction with the drift region and electrically connected to the emitter electrode and a cathode electrode in ohmic contact with the drift region electrically connected to the collector electrode.

With the arrangement above, since the Schottky barrier diode is connected in parallel to the SiC-IGBT, the recovery time can be shortened, whereby the semiconductor device can achieve fast recovery.

Also, in the semiconductor device according to the present invention, the semiconductor chip may be arranged such that the base region includes a base surficial portion exposed on the first surface of the SiC semiconductor layer to define a portion of the first surface and the emitter electrode includes a Schottky joint portion forming a Schottky junction with the base surficial portion, in which it is preferable that the Schottky barrier diode includes an SiC-Schottky barrier diode provided in the semiconductor chip, the drift region be formed utilizing the base region of the SiC-IGBT, and the anode electrode be formed utilizing the emitter electrode of the SiC-IGBT.

With the arrangement above, the base region, the emitter electrode, and the collector electrode can be shared between the SiC-IGBT and the SiC-Schottky barrier diode, whereby these devices can be integrated into a single unit cell. As a result, the semiconductor device can be reduced in size and thereby the capacitance between the devices can be reduced.

The semiconductor device may further include an interlayer insulating film formed on the first surface of the SiC semiconductor layer and formed with a contact hole through which the base surficial portion is exposed, and further a resin package in which the SiC-IGBT, the MOSFET, and the Schottky barrier diode are collectively encapsulated.

Also, in the semiconductor device according to the present invention, it is preferable that the base region be partially exposed on the first surface of the SiC semiconductor layer, in which the semiconductor chip includes a Schottky electrode formed such that the Schottky electrode is in contact with the exposed portion of the base region and a trench dug from the first surface of the SiC semiconductor layer at a position adjacent to a joint portion between the base region and the Schottky electrode, the trench having a bottom surface and a side surface.

With the arrangement above, the base region can be shared between the SiC-IGBT and the SiC-Schottky barrier diode, whereby these devices can be integrated into a single unit cell. As a result, the semiconductor device can be reduced in size and thereby the capacitance between the devices can be reduced.

Further, since the trench is formed adjacent to the Schottky joint portion, the electric field intensity at the Schottky interface between the base region and the Schottky electrode can be reduced. As a result, the barrier of the Schottky interface can be set low, whereby the Schottky barrier diode can have a low rise voltage.

In this case, the SiC semiconductor layer preferably includes a first conductive-type electric field relaxing portion selectively formed on the bottom surface and on an edge portion of the bottom surface of the trench.

This can reduce the reverse leakage current in the entire semiconductor device. That is, since the reverse leakage current can be reduced even if a reverse voltage close to the breakdown voltage may be applied, the voltage resistance characteristic of the SiC semiconductor can be efficiently utilized.

In this case, the electric field relaxing portion is preferably formed straddling between the edge portion of the bottom surface of the trench and the side surface of the trench and, in particular, preferably formed along the side surface of the trench to the opening end of the trench.

Further, the trench preferably includes a tapered trench with the bottom surface in a planar profile and the side surface inclined at an angle greater than 90 degrees with respect to the planar bottom surface.

The tapered trench can further increase the voltage resistance of the semiconductor device compared to the case where the side wall stands perpendicularly, at 90 degrees, to the bottom wall.

Moreover, the tapered trench leads to an arrangement in which not only the bottom surface but also the whole or part of the side surface is opposed to the opening end of the trench. Accordingly, when first conductive-type impurities are implanted into the SiC semiconductor layer via the trench, for example, the impurities incident through the opening end into the trench can reliably hit the side surface of the trench. As a result, the above-described electric field relaxing portion can be formed easily.

In addition, the tapered trench is a concept including both a trench the side surface of which is entirely inclined at an angle greater than 90 degrees with respect to the bottom surface and a trench the side surface of which is partially (e.g., the portion defining the edge portion of the trench) inclined at an angle greater than 90 degrees with respect to the bottom surface.

Also, in the semiconductor device according to the present invention, it is preferable that the Schottky electrode be formed such that the Schottky electrode is embedded in the trench and the electric field relaxing portion have a contact portion forming an ohmic junction with the Schottky electrode at the bottom surface of the trench.

With the arrangement above, the Schottky electrode can form an ohmic junction with the pn diode having a pn junction between the contact portion (first conductive-type) and the base region (second conductive-type). The pn diode is provided in parallel to the Schottky barrier diode (heterojunction diode) having a Schottky junction between the Schottky electrode and the base region. Accordingly, a surge current can partially flow through the incorporated pn diode even if the surge current may flow through the semiconductor device. As a result, the surge current flowing through the Schottky barrier diode can be reduced whereby thermal destruction of the Schottky barrier diode due to surge current can be prevented.

Further, in the semiconductor device according to the present invention, it is preferable that the base region includes a base drift region having a first impurity concentration and a low-resistance drift region formed on the base drift region and having a second impurity concentration relatively higher than the first impurity concentration, and the trench be formed such that the deepest portion thereof reaches the low-resistance drift region.

Since the trench-segmented unit cells segmented by the trench have a limited current flow region (current path), if the portions defining the unit cells in the SiC semiconductor layer have a low impurity concentration, the unit cells may have a high resistance. Hence, thus forming the trench such that the deepest portion thereof reaches the low-resistance drift region allows all or part of the unit cells to be formed in the low-resistance drift region. Accordingly, in the portions where the low-resistance drift region is formed, even if the current path may be narrowed, the low-resistance drift region, which has the relatively high second impurity concentration, can suppress an increase in resistance. As a result, the unit cells can have a low resistance.

The first impurity concentration of the base drift region may decrease from the second surface to the first surface of the SiC semiconductor layer. Further, the second impurity concentration of the low-resistance drift region may be constant from the second surface to the first surface of the SiC semiconductor layer or may decrease from the second surface to the first surface of the SiC semiconductor layer.

Also, in the semiconductor device according to the present invention, the base region preferably further includes a surficial drift region formed on the low-resistance drift region and having a third impurity concentration relatively lower than the second impurity concentration.

With this arrangement, since the impurity concentration in the vicinity of the surface of the SiC semiconductor layer (base region) can be made low, the electric field intensity at the surface of the SiC semiconductor layer upon reverse voltage application can be reduced. As a result, the reverse leakage current can be further reduced.

The SiC-IGBT may include a planar-gate type IGBT including a gate insulating film formed on the first surface of the SiC semiconductor layer and a gate electrode formed on the gate insulating film such that the gate electrode is opposed to the channel region with the gate insulating film therebetween or may include a trench-gate type IGBT including a gate trench penetrating from the first surface of the SiC semiconductor layer through the emitter region and the channel region to reach the base region, a gate insulating film formed on the inner surface of the gate trench, and a gate electrode formed on the inside of the gate insulating film in the gate trench.

The semiconductor device manufacturing method according to the present invention preferably further includes, a step of implanting second conductive-type impurities into the vicinity of the first surface of the SiC substrate before the step of forming the SiC base layer.

With this method, during etching from the second surface to the first surface of the SiC substrate to form a trench, when the etching face reaches the end (near the first surface) of the SiC substrate, another type of plasma can be detected different from that during etching of the other portions of the SiC substrate. As a result, the depth of the etching can be controlled precisely.

Also, in the semiconductor device manufacturing method according to the present invention, it is preferable that the step of forming the SiC base layer includes the steps of forming a first high-concentration impurity layer on the first surface of the SiC substrate and forming a drift layer on the first high-concentration impurity layer so as to have an impurity concentration relatively lower than that of the first high-concentration impurity layer and the step of forming the trench includes the step of selectively forming a trench penetrating through the SiC substrate and the high-concentration impurity layer to reach the drift layer, the method further including, before the step of forming the collector region, the step of implanting second conductive-type impurities into the bottom surface of the trench to form a second high-concentration impurity layer in the bottom surface to thereby form a buffer layer in which the second high-concentration impurity layer and the first high-concentration impurity layer are integrated.

With the method above, the semiconductor device can be manufactured having an arrangement in which the collector region is surrounded by the buffer layer.

Furthermore, the semiconductor device according to the present invention can be manufactured by a method for manufacturing a semiconductor device having an SiC-IGBT and an SiC-MOSFET in a single semiconductor chip. The method may include the steps of forming a second conductive-type SiC base layer on a first surface of a substrate having the first surface and a second surface, removing the substrate to expose a second surface of the SiC base layer, selectively implanting first conductive-type impurities into the second surface of the SiC base layer to form a collector region in the second surface, selectively implanting second conductive-type impurities into the second surface of the SiC base layer to form a drain region in the second surface, selectively implanting first conductive-type impurities into a first surface of the SiC base layer to form a channel region in a surficial portion of the SiC base layer, and selectively implanting second conductive-type impurities into the first surface of the SiC base layer to form an emitter region in a surficial portion of the channel region, the emitter region serving also as a source region of the SiC-MOSFET.

BRIEF DESCRIPTION OF THE DRAWINGS

FIG. 4B shows a step following that shown in FIG. 4A.
FIG. 4C shows a step following that shown in FIG. 4B.
FIG. 4E shows a step following that shown in FIG. 4D.
FIG. 4F shows a step following that shown in FIG. 4E.

FIG. 5 shows a first exemplary variation of the trench shown in FIG. 3.

FIG. 9 is a schematic cross-sectional view of a semiconductor chip according to a second preferred embodiment of the present invention.

FIG. 10A shows a step of a process for manufacturing the semiconductor chip shown in FIG. 9.

FIG. 10B shows a step following that shown in FIG. 10A.
FIG. 10D shows a step following that shown in FIG. 10C.

FIG. 19 illustrates the impurity concentration of the SiC substrate and the SiC base layer.

FIG. 20A shows a step of a process for manufacturing the semiconductor chip shown in FIG. 18.

FIG. 22A shows a step of a process for manufacturing the semiconductor chip shown in FIG. 21.

FIG. 24A shows a step of a process for manufacturing the semiconductor chip shown in FIG. 23.

FIG. 24B shows a step following that shown in FIG. 24A.
FIG. 24C shows a step following that shown in FIG. 24B.
FIG. 24D shows a step following that shown in FIG. 24C.

MODES FOR CARRYING OUT THE INVENTION

Preferred embodiments of the present invention will hereinafter be described in detail with reference to the accompanying drawings.

Figure 1:
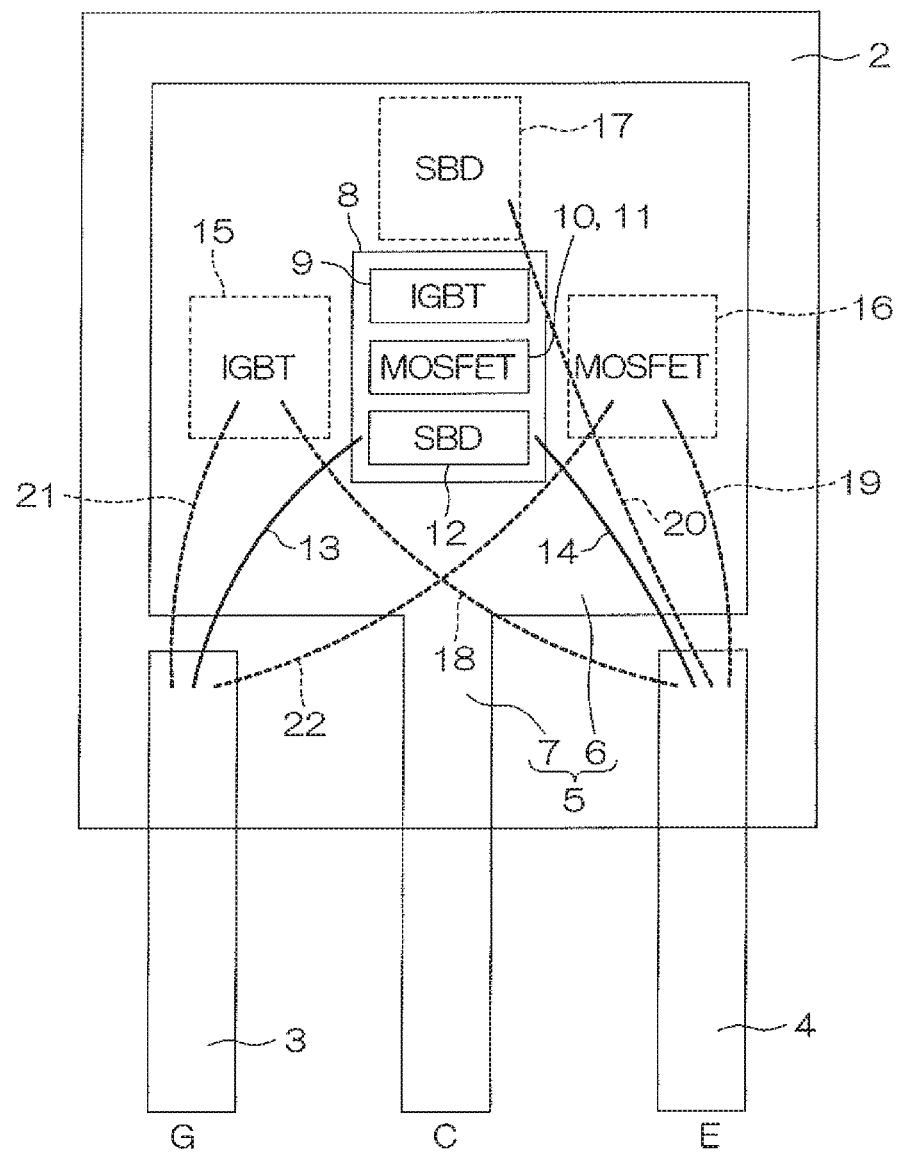
FIG. 1 is an external perspective view of a semiconductor package according to a first preferred embodiment of the present invention.
Figure 2:
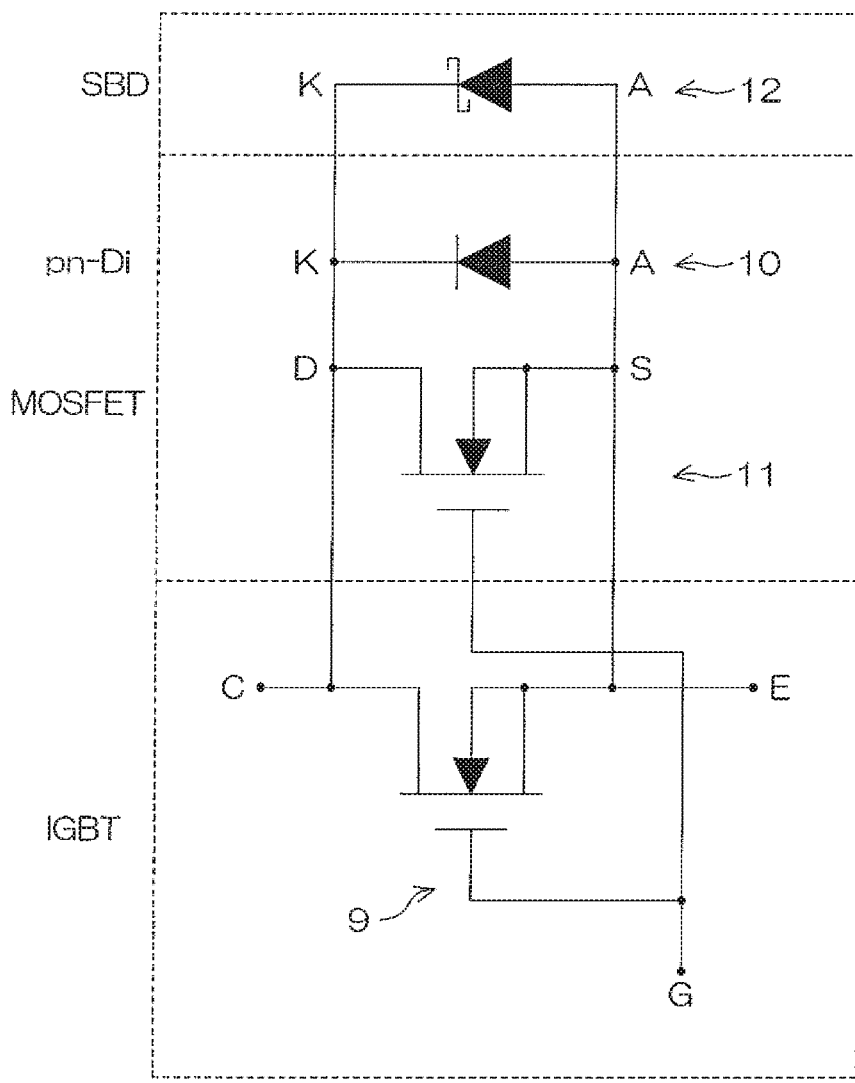
FIG. 2 is a circuit diagram inside the semiconductor chip shown in FIG. 1.

FIG. 1 is an external perspective view of a semiconductor package 1 according to a first preferred embodiment of the present invention. FIG. 2 is a circuit diagram inside the semiconductor chip 8 shown in FIG. 1.

The semiconductor package 1, which serves as a semiconductor device, includes a flattened rectangular parallelepiped resin package 2, a gate terminal 3 (G), an emitter terminal 4 (E), and a collector terminal 5 (C) encapsulated in the resin package 2.

The three terminals 3 to 5 are each formed of a metal plate in a predetermined shape. In this preferred embodiment, the collector terminal 5 is formed in a shape including a square island 6 and an elongated rectangular terminal portion 7 extending linearly from a side of the island 6. The gate terminal 3 and the emitter terminal 4 are formed in approximately the same shape as the terminal portion 7 of the collector terminal 5 and disposed parallel with each other on one and the other sides of the terminal portion 7 of the collector terminal 5 in a manner sandwiching the terminal portion 7 of the collector terminal 5.

The semiconductor chip 8 is placed on the collector terminal 5 (in a central portion of the island 6). An IGBT 9 (Insulated Gate Bipolar Semiconductor), a MOSFET 11 incorporating a body diode 10 (pn-Di), and a Schottky barrier diode 12 (SBD) are mounted on the semiconductor chip 8. That is, the three devices, IGBT 9, MOSFET 11, and Schottky barrier diode 12, which serve a switching function, are mounted on the single semiconductor chip 8, and the semiconductor chip 8 is supported on the island 6 of the collector terminal 5.

As shown in FIG. 2, the MOSFET 11, the body diode 10, and the Schottky barrier diode 12 are connected in parallel to the IGBT 9 in the semiconductor chip 8.

Specifically, the source (S) of the MOSFET 11, the anode (A) of the body diode 10, and the anode (A) of the Schottky barrier diode 12 are respectively connected to the emitter (E) of the IGBT 9. The drain (D) of the MOSFET 11, the cathode (K) of the body diode 10, and the cathode (K) of the Schottky barrier diode 12 are respectively connected to the collector (C) of the IGBT 9. The gate (G) of the MOSFET 11 is connected to the gate (G) of the IGBT 9.

The gate (G) of the IGBT 9 is connected to the gate terminal 3 using a bonding wire 13, and the emitter (E) of the IGBT 9 is connected to the emitter terminal 4 using a bonding wire 14. The collector (C) of the IGBT 9 is connected to the island 6 of the collector terminal 5.

The resin package 2 then encapsulates the semiconductor chip 8, the bonding wires 13 and 14, the whole of the island 6 and a portion of the terminal portion 7 of the collector terminal 5, a portion of the gate terminal 3, and a portion of the emitter terminal 4. The rest of the terminal portion 7 of the collector terminal 5, the gate terminal 3, and the emitter terminal 4 are exposed through a side surface of the resin package 2.

In addition, the IGBT 9, the MOSFET 11 incorporating the body diode 10, and the Schottky barrier diode 12 may be integrated into the semiconductor chip 8 (single chip) indicated by the solid line in FIG. 1 (i.e., exist on the same chip) or may be provided separately as an IGBT chip 15, a MOSFET chip 16 (incorporating the body diode 10), and a Schottky barrier diode chip 17 indicated by the broken line in FIG. 1 as long as it is capable of configuring the circuit shown in FIG. 2.

In the latter case, the MOSFET 11, the body diode 10, and the Schottky barrier diode 12 can be connected in parallel to the IGBT 9, as shown in FIG. 2, by connecting the collector (C) of the IGBT chip 15, the drain (D) of the MOSFET chip 16, and the cathode (K) of the Schottky barrier diode chip 17 to the island 6 of the collector terminal 5, connecting the emitter (E) of the IGBT chip 15, the source (S) of the MOSFET chip 16, and the anode (A) of the Schottky barrier diode chip 17 to the emitter terminal 4 using bonding wires 18 to 20 respectively, and connecting the gate (G) of the IGBT chip 15 and the gate (G) of the MOSFET chip 16 to the gate terminal 3 using bonding wires 21 and 22 respectively.

<Specific Configuration of the Semiconductor Chip 8 (Device Integrated Type)>

Figure 3:
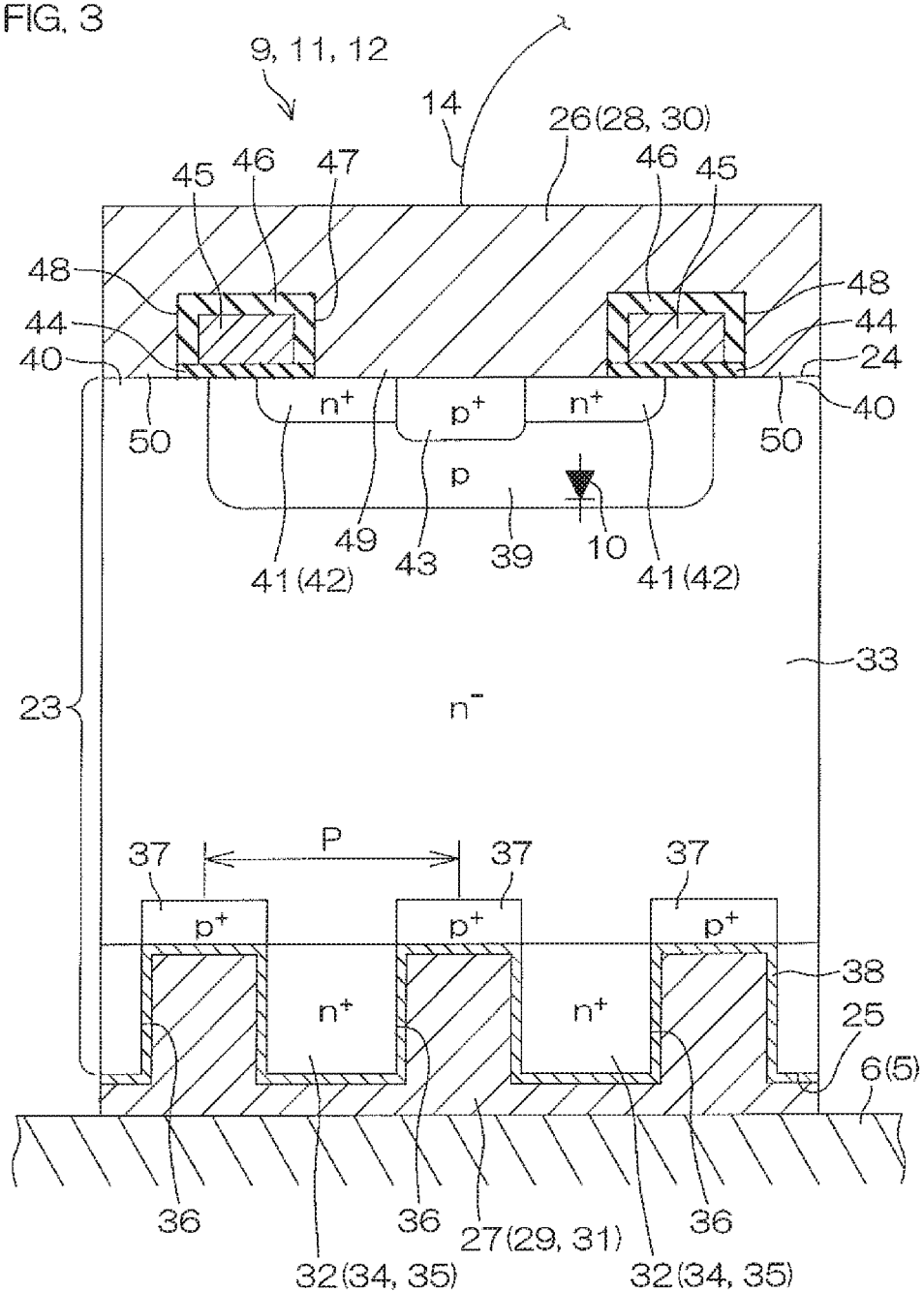
FIG. 3 is a schematic cross-sectional view of the semiconductor chip shown in FIG. 1.

FIG. 3 is a schematic cross-sectional view of the semiconductor chip 8 shown in FIG. 1.

The semiconductor chip 8 includes an SiC (silicon carbide) semiconductor layer having a first surface 24 and a second surface 25, an emitter electrode 26 connected to the first surface 24 of the SiC semiconductor layer 23, and a collector electrode 27 connected to the second surface 25 of the SiC semiconductor layer 23, and is supported on the collector terminal 5 by bonding the collector electrode 27 and the collector terminal 5 (island 6) with the emitter electrode 26 being directed upward. The bonding wire 14 shown in FIG. 1 is connected to the emitter electrode 26.

In the SiC semiconductor layer 23, multiple impurity regions constituting the IGBT 9, the MOSFET 11, and the Schottky barrier diode 12 are formed and sandwiched vertically between the emitter electrode 26 and the collector electrode 27. The emitter electrode 26 and the collector electrode 27 are shared among the IGBT 9, the MOSFET 11, and the Schottky barrier diode 12. That is, the emitter electrode 26 and the collector electrode 27 are external electrodes common to the IGBT 9, the MOSFET 11, and the Schottky barrier diode 12. In the MOSFET 11, the emitter electrode 26 serves as a source electrode 28 and the collector electrode 27 serves as a drain electrode 29. On the other hand, in the Schottky barrier diode 12, the emitter electrode 26 serves as an anode electrode 30 and the collector electrode 27 serves as a cathode electrode 31. Accordingly, the SiC-IGBT 9, the SiC-MOSFET 11, and the SiC-Schottky barrier diode 12, which are constituted by multiple SiC impurity regions, are connected in parallel between the emitter electrode 26 and the collector electrode 27.

The SiC semiconductor layer 23 includes an n$^+$-type SiC substrate 32 (with a concentration of, for example, $1.0 \times 10^{19}$ to $1.0 \times 10^{21}$ atoms·cm$^{-3}$; the same applies hereinafter) defining the second surface 25 of the SiC semiconductor layer 23 and an n$^-$-type SiC base layer 33 (SiC epitaxial layer) (with a concentration of, for example, $5.0 \times 10^{16}$ to $1.0 \times 10^{14}$ atoms·cm$^{-3}$; the same applies hereinafter) formed on the SiC substrate 32 and defining the first surface 24 of the SiC semiconductor layer 23.

In this preferred embodiment, the n$^+$-type SiC substrate 32 defines a drain region 34 of the MOSFET 11 and a cathode region 35 of the Schottky barrier diode 12. Also, the SiC base layer 33 serves as a drift region in the MOSFET 11 and the Schottky barrier diode 12. In addition, the n-type impurity may be, for example, N (nitrogen), P (phosphorous), or As (arsenic).

In the SiC semiconductor layer 23, multiple trenches 36 are formed that reach from the second surface 25 to the SiC base layer 33. The multiple trenches 36 are formed in, for example, a striped manner at regular intervals. In addition, the trenches 36 may be formed in, for example, a grid manner without limiting to the striped manner.

The side surface of each trench 36 is defined by the SiC substrate 32, while the bottom surface is defined by the SiC base layer 33. P$^+$-type collector regions 37 (collector regions 37 of the IGBT 9) (with a concentration of, for example, $1.0 \times 10^{18}$ to $1.0 \times 10^{20}$ atoms·cm$^{-3}$; the same applies hereinafter) are formed on the bottom surface (second surface portion of the SiC base layer 33). In addition, the p-type impurity may be, for example, B (boron) or Al (aluminum).

The pitch between adjacent trenches 36 (trench pitch P) is preferably 1 µm to 500 µm. With this range of the trench pitch P, the portions between adjacent collector regions 37 (i.e., the portions where the current paths of the MOSFET 11 are formed) can be prevented from being closed by the depletion layer extending from the interface between the collector regions 37 and the SiC base layer 33.

The collector electrode 27 penetrates collectively into all the trenches 36 so as to cover the second surface 25 of the SiC substrate 32, and is connected to the SiC substrate 32 via the side surface of each trench 36, while connected to the collector regions 37 via the bottom surfaces of the respective trenches 36. The collector electrode 27 is an AlCu (alloy of aluminum and copper) electrode with a metal silicide 38 (e.g., nickel (Ni) silicide or titanium (Ti) silicide) formed in a manner contacting the inner surface (side surface and bottom surface) of each trench 36. This can bring the collector electrode 27 into ohmic contact with any target of whichever conductive type including the n$^+$-type SiC substrate 32 and the p$^+$-type collector regions 37.

Multiple well-like p-type channel regions 39 (with a concentration of, for example, $1 \times 10^{16}$ to $1 \times 10^{19}$ atoms·cm$^-$3; the same applies hereinafter) are selectively formed in surficial portions of the SiC base layer 33. The multiple channel regions 39 are exposed on the first surface 24 of the SiC base layer 33 to define portions of the first surface 24. On the other hand, between the multiple channel regions 39, the SiC base layer 33 is partially exposed on the first surface 24 as a base surficial portion 40.

An n$^+$-type emitter region 41 (emitter region 41 of the IGBT 9) is formed in a portion of the first surface 24 of each channel region 39. The emitter region 41 is exposed on the first surface 24 of the SiC base layer 33 to define a portion of the first surface 24. The emitter region 41 serves also as a source region 42 of the MOSFET 11.

In a central portion of each channel region 39, a p$^+$-type channel contact region 43 is formed that penetrates from the first surface 24 of the SiC base layer 33 through the emitter region 41 to reach the channel region 39.

A gate insulating film 44 composed of silicon oxide (SiO$_2$) is formed on the first surface 24 of the SiC base layer 33, and a gate electrode 45 composed of polysilicon is formed on the gate insulating film 44. The gate electrode 45 is opposed to the channel region 39, which is exposed on the first surface 24 of the SiC base layer 33, with the gate insulating film 44 straddling between the emitter region 41 and the base surficial portion 40.

An interlayer insulating film 46 composed of SiO$_2$ is layered on the SiC base layer 33 in a manner covering the gate electrode 45.

The interlayer insulating film 46 is formed with contact holes 47 and 48 penetrating through the interlayer insulating film 46 in the thickness direction directly above the emitter region 41 and the base surficial portion 40 respectively.

The emitter electrode 26 penetrates collectively into the contact holes 47 and 48 in a manner covering the interlayer insulating film 46 and is connected to the emitter region 41, the channel contact region 43, and the base surficial portion 40 through the contact holes 47 and 48. The emitter electrode 26 is an AlCu electrode. Accordingly, the emitter electrode 26 includes an ohmic contact portion 49 in ohmic contact with the n$^+$-type emitter region 41 and the p$^+$-type channel contact region 43, which have a high impurity concentration, and a Schottky joint portion 50 forming a Schottky junction with the n$^-$-type SiC base layer 33, which has a low impurity concentration.

As described heretofore, the semiconductor chip 8 is formed with the vertical IGBT 9 including the emitter electrode 26, the emitter region 41 connected to the emitter electrode 26, the channel region 39 formed in a manner contacting the side of the emitter region 41 nearer the second surface 25 of the SiC semiconductor layer 23, the SiC base layer 33 formed in a manner contacting the side of the channel region 39 nearer the second surface 25 of the SiC semiconductor layer 23, the collector regions 37 formed in a manner contacting the side of the SiC base layer 33 nearer the second surface 25 of the SiC semiconductor layer 23, and the collector electrode 27 connected to the collector regions 37.

The emitter electrode 26 and the collector electrode 27 of the IGBT 9 are then shared between the MOSFET 11 and the Schottky barrier diode 12, and the MOSFET 11 also includes the emitter region 41 (source region 42), the channel region 39, the SiC base layer 33, and the SiC substrate 32 as impurity regions connected to these electrodes. The Schottky barrier diode 12 also includes the SiC base layer 33 and the SiC substrate 32 as impurity regions connected to the electrodes 26 and 27.

That is, in the semiconductor chip 8, the IGBT 9, the MOSFET 11, and the Schottky barrier diode 12 are integrated into a single unit cell.

The MOSFET 11 incorporates a pn diode (body diode 10) defined by a pn junction between the p-type channel region 39 and the n$^-$-type SiC base layer 33, where the p-side (anode side) of the body diode 10 is connected with the anode electrode 30 and the emitter electrode 26, while the n-side (cathode side) is connected with the cathode electrode 31 and the collector electrode 27.

Thus, the three devices, IGBT 9, MOSFET 11 incorporating the body diode 10, and Schottky barrier diode 12, are collectively mounted on the semiconductor chip 8 and connected in parallel to each other.

<Method for Manufacturing the Semiconductor Chip 8 (Device Integrated Type)>

FIGS. 4A to 4F show sequential steps of a process for manufacturing the semiconductor chip 8 shown in FIG. 3.

Figure 4A:
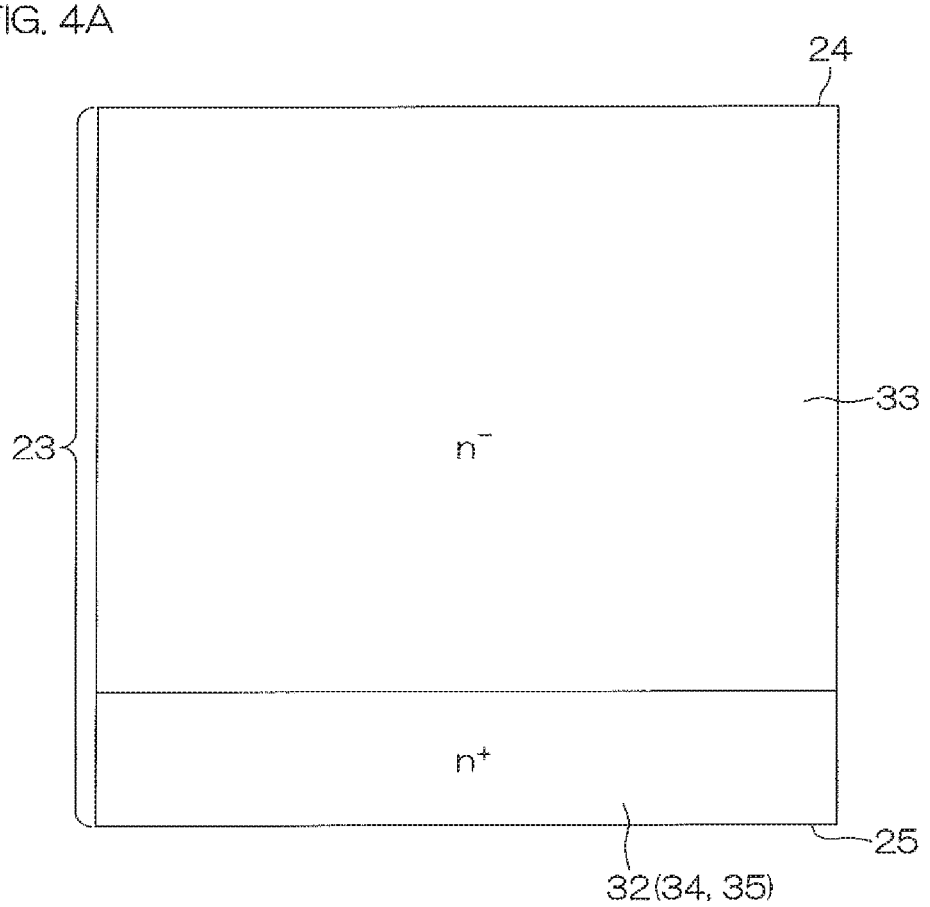
FIG. 4A shows a step of a process for manufacturing the semiconductor chip shown in FIG. 3.

In order to manufacture the semiconductor chip 8, an epitaxial growth method such as CVD (Chemical Vapor Deposition), LPE (Liquid Phase Epitaxy), or MBE (Molecular Beam Epitaxy) is used to grow an SiC crystal while doping n-type impurities into a surface of the wafer SiC substrate 32 as shown in FIG. 4A. This causes the n$^-$-type SiC base layer 33 to be formed on the SiC substrate 32.

Next, as shown in FIG. 4B, a hard mask 51 is formed and patterned on the second surface 25 of the SiC substrate 32 and then dry-etched at least until the SiC base layer 33 is exposed on the second surface 25 of the SiC substrate 32. This causes the SiC substrate 32 to be selectively dug from the second surface 25 and thereby the trenches 36 to be formed.

Next, as shown in FIG. 4C, with the hard mask 51 used to form the trenches 36 being left, p-type impurities are accelerated toward the trenches 36 exposed through the hard mask 51 to be implanted into the bottom surfaces of the trenches 36 (ion implantation). Next, the SiC base layer 33 is annealed. This causes the p-type impurities implanted into the bottom surfaces of the trenches 36 to be activated and thereby the collector regions 37 to be formed in the SiC base layer 33. Thereafter, the hard mask 51 is peeled off.

Figure 4D:
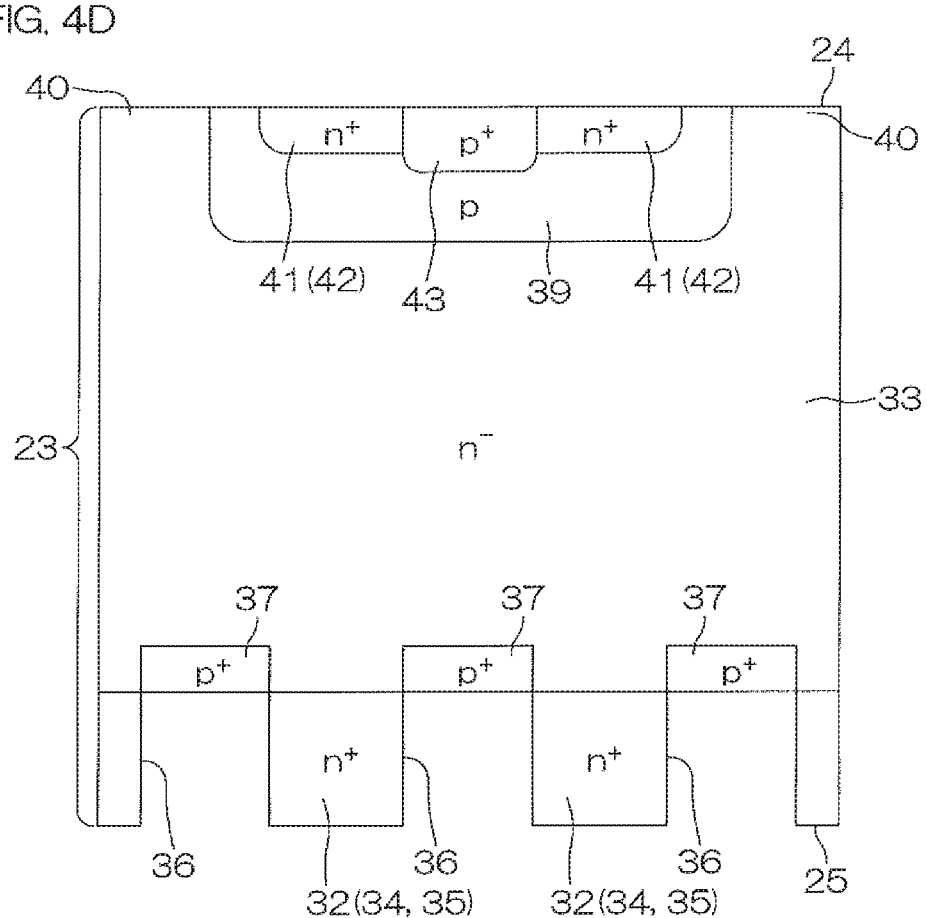
FIG. 4D shows a step following that shown in FIG. 4C.

Next, as shown in FIG. 4D, hard mask formation and ion implantation are conducted according to the shapes of the channel region 39, the emitter region 41, and the channel contact region 43 as well as the types of impurities, and then the SiC base layer 33 is annealed in a similar manner as in the step shown in FIG. 4C. This causes the n-type impurities and the p-type impurities implanted into the SiC base layer 33 to be activated and thereby the channel region 39, the emitter region 41, and the channel contact region 43 to be simultaneously formed in the SiC base layer 33.

Next, as shown in FIG. 4E, a thermal oxidation method, for example, is used to form the gate insulating film 44 on the first surface 24 of the SiC base layer 33. Subsequently, a CVD technique, for example, is used to deposit polysilicon over the SiC base layer 33. The deposited polysilicon is then patterned to form the gate electrode 45.

Next, a CVD method, for example, is used to layer the interlayer insulating film 46 on the SiC base layer 33. Subsequently, the interlayer insulating film 46 and the gate insulating film 44 are selectively dry-etched to form the contact holes 47 and 48 simultaneously.

Next, as shown in FIG. 4F, a sputtering method, for example, is used to deposit AlCu on the interlayer insulating film 46 in a manner filling the contact holes 47 and 48. This causes the emitter electrode 26 to be formed. Thereafter, the metal silicide 38 is formed on the inner surfaces of the trenches 36, and then a sputtering method, for example, is used to deposit AlCu on the second surface 25 of the SiC substrate 32 in a manner filling the inside of the metal silicide 38. This causes the collector electrode 27 to be formed.

The semiconductor chip 8 shown in FIG. 3 is thus formed through the foregoing steps.

In the IGBT 9 mounted on the semiconductor package 1, holes are injected from the p$^+$-type collector regions 37 to the n$^-$-type SiC base layer 33 to cause a conductivity modulation in the SiC base layer 33, whereby the on-resistance of the SiC base layer 33 (drift layer) can be reduced. For this reason, even if the SiC base layer 33 may have a low impurity concentration and/or an increased thickness and therefore a high original resistance to increase the voltage resistance of the IGBT 9, the on-resistance can be maintained sufficiently low. As a result, the IGBT 9 is more useful as a device for use in a high-voltage range than an SiC-MOSFET.

Meanwhile, since SiC has a pn barrier higher than that of Si, a high on-voltage is required to use the IGBT in a low-current range (e.g., of 4 A or lower). This is a very high value even in comparison with the SiC-MOSFET. Unlike the IGBT, the SiC-MOSFET, which uses SiC, undergoes a linear increase in the on-current from the initial stage, which is not particularly disadvantageous in the low-current range. For use in a current range of around 1 A, for example, the SiC-MOSFET has an on-voltage of about 0.8 V and the Si-IGBT has an on-voltage of about 1.3 V, while the SiC-IGBT has an on-voltage of 3.5 V, that is, there is a difference of about four times.

Hence, in accordance with the semiconductor package 1, the MOSFET 11 is connected in parallel to the IGBT 9. This allows a current to flow through the semiconductor package 1 by turning on the IGBT 9 or the MOSFET 11. Accordingly, for use in a low-current range, the semiconductor package 1 can be operated with the on-voltage of the MOSFET 11, whereby the on-voltage in the low-current range can be reduced.

Also, in this preferred embodiment, the IGBT 9, the MOSFET 11 incorporating the body diode 10, and the Schottky barrier diode 12 are integrated into a single unit cell in the semiconductor chip 8. As a result, the semiconductor package 1 can be reduced in size and thereby the capacitance between the devices can be reduced.

On the other hand, the IGBT 9, in which the cathode of the pn diode defined by the pn junction between the p-type channel region 39 and the n$^-$-type SiC base layer 33 is connected to the cathode of the pn diode defined by the pn junction between the p$^+$-type collector regions 37 and the n$^-$-type SiC base layer 33, cannot incorporate a body diode 10 like the MOSFET 11. It is therefore difficult to consume a back electromotive force if occurring to the load.

Hence, in accordance with the semiconductor package 1, the MOSFET 11 incorporates the body diode 10 and the body diode 10 is connected in parallel to the IGBT 9. Accordingly, even if a back electromotive force may occur to the load, the rectification behavior of the body diode 10 causes a current due to the back electromotive force to flow through the load as a reflux current, which can prevent such a high back electromotive force from being applied to the IGBT 9.

Further, since the Schottky barrier diode 12 is connected in parallel to the IGBT 9, the recovery time can be shortened, whereby the semiconductor package 1 can achieve fast recovery.

In addition, since the IGBT 9 and the MOSFET 11 are integrated into the same semiconductor chip 8, the collector regions 37 and the drain region 34, which are selectively exposed on the second surface 25 of the SiC semiconductor layer 23, can be formed utilizing a known semiconductor device manufacturing technique including etching of the SiC substrate 32 and impurity implantation into the SiC base layer 33 as shown in FIG. 4A to 4C. The collector regions 37 and the drain region 34 can thus be formed easily at the second surface 25 of the SiC semiconductor layer 23.

Figure 6:
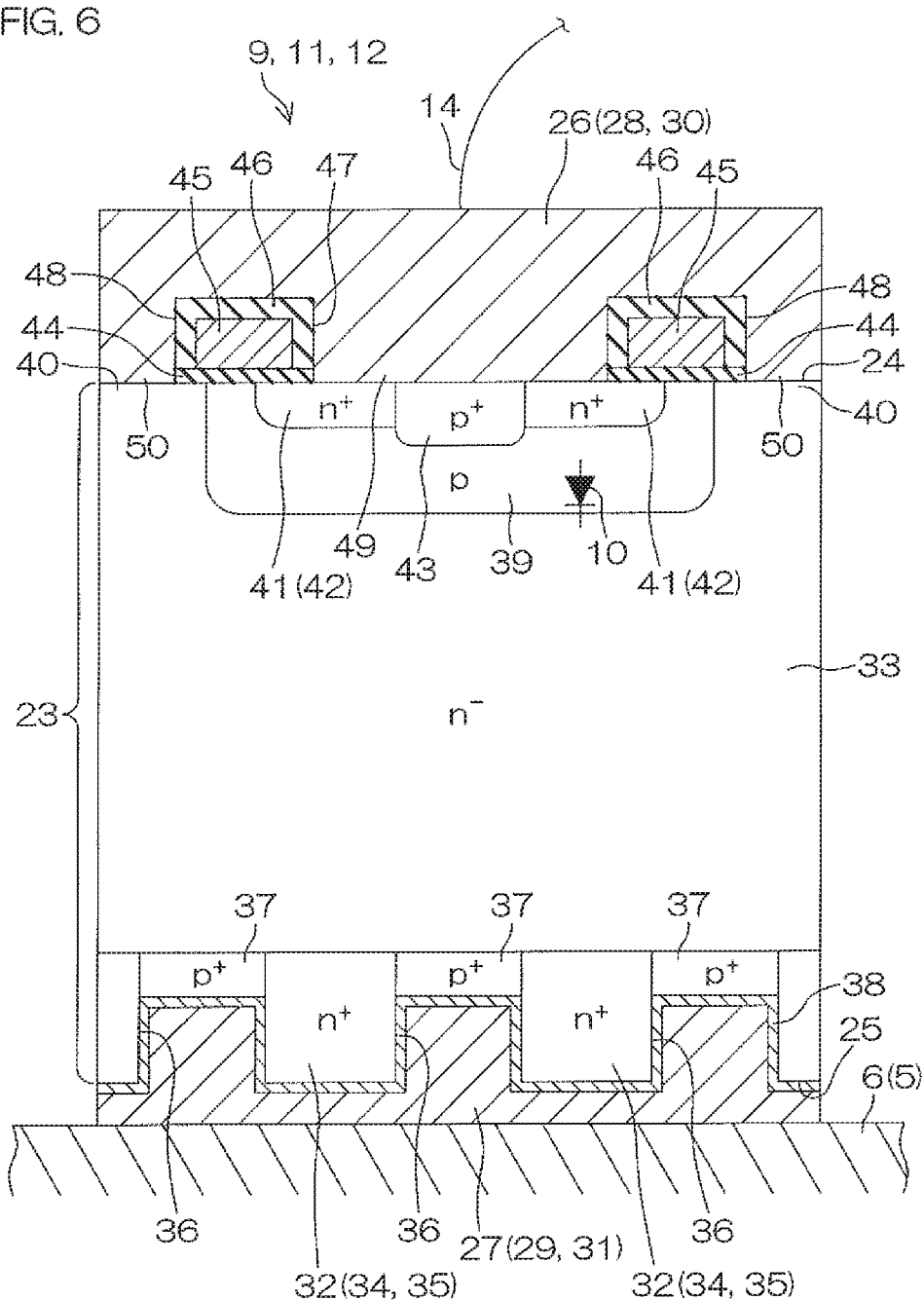
FIG. 6 shows a second exemplary variation of the trench shown in FIG. 3.

In addition, the deepest portions of the trenches 36 are not required to be positioned at the interface between the SiC substrate 32 and the SiC base layer 33 as shown in FIG. 3, but may be, for example, at a position nearer the first surface 24 of the SiC base layer 33 with respect to the interface as shown in FIG. 5. In this case, the bottom surface and a portion of the side surface of each trench 36 is to be defined by the SiC base layer 33, while the rest of the side surface is to be defined by the SiC substrate 32. Alternatively, the deepest portions may be at a position nearer the second surface 25 of the SiC substrate 32 with respect to the interface as shown in FIG. 6. In this case, the bottom surface and the side surface of each trench 36 are to be defined by the SiC substrate 32.

Figure 7:
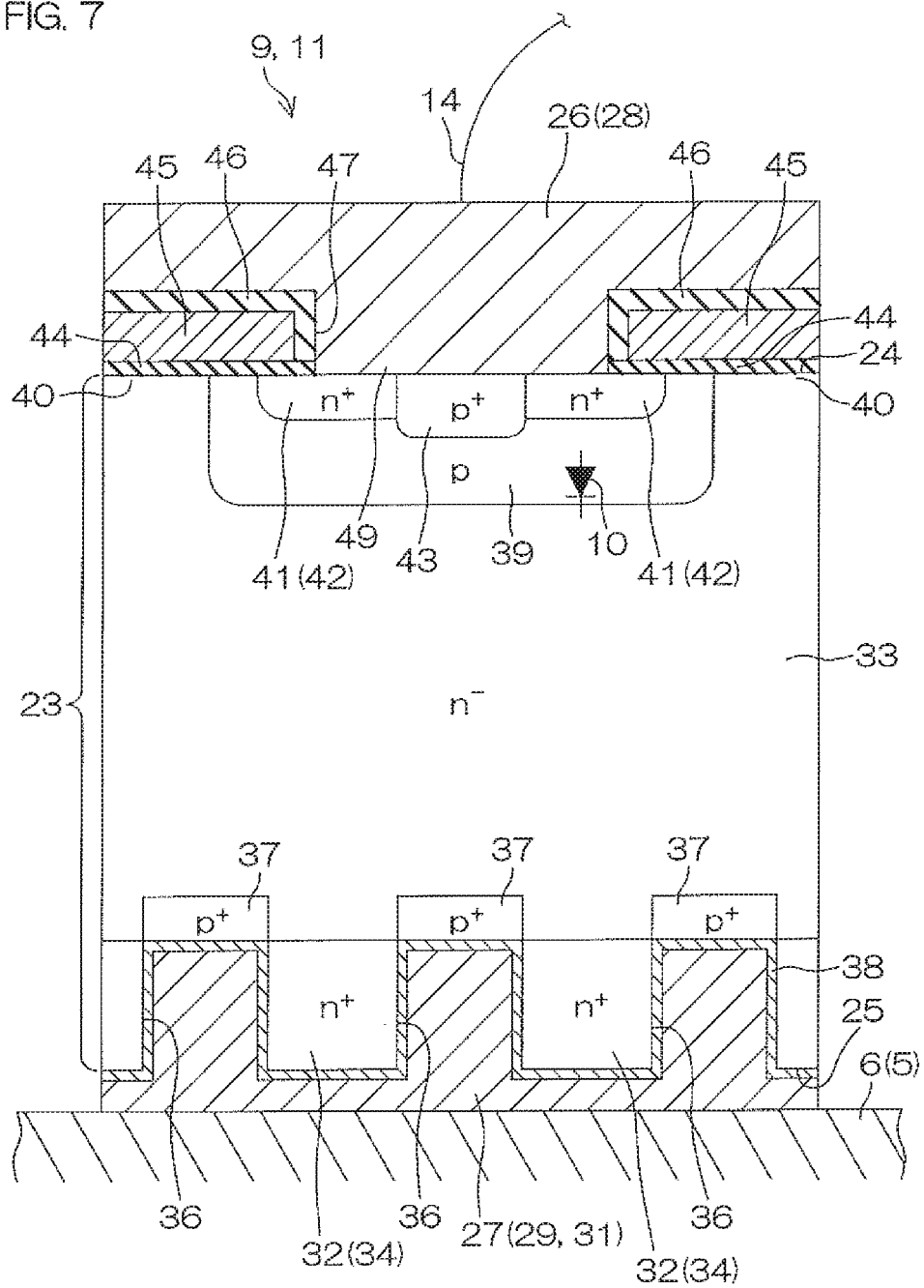
FIG. 7 shows an exemplary variation of the gate electrode shown in FIG. 3.

Further, the gate electrode 45 may be formed straddling between adjacent channel regions 39 in a manner covering the base surficial portion 40 as shown in FIG. 7, for example. In this case, since the base surficial portion 40 is not exposed and cannot be connected with the emitter electrode 26 (Schottky joint portion 50), the Schottky barrier diode 12 is not to be provided.

Furthermore, the IGBT 9, the MOSFET 11, and the Schottky barrier diode 12 may be formed as separate unit cells in the SiC semiconductor layer 23.

Figure 8:
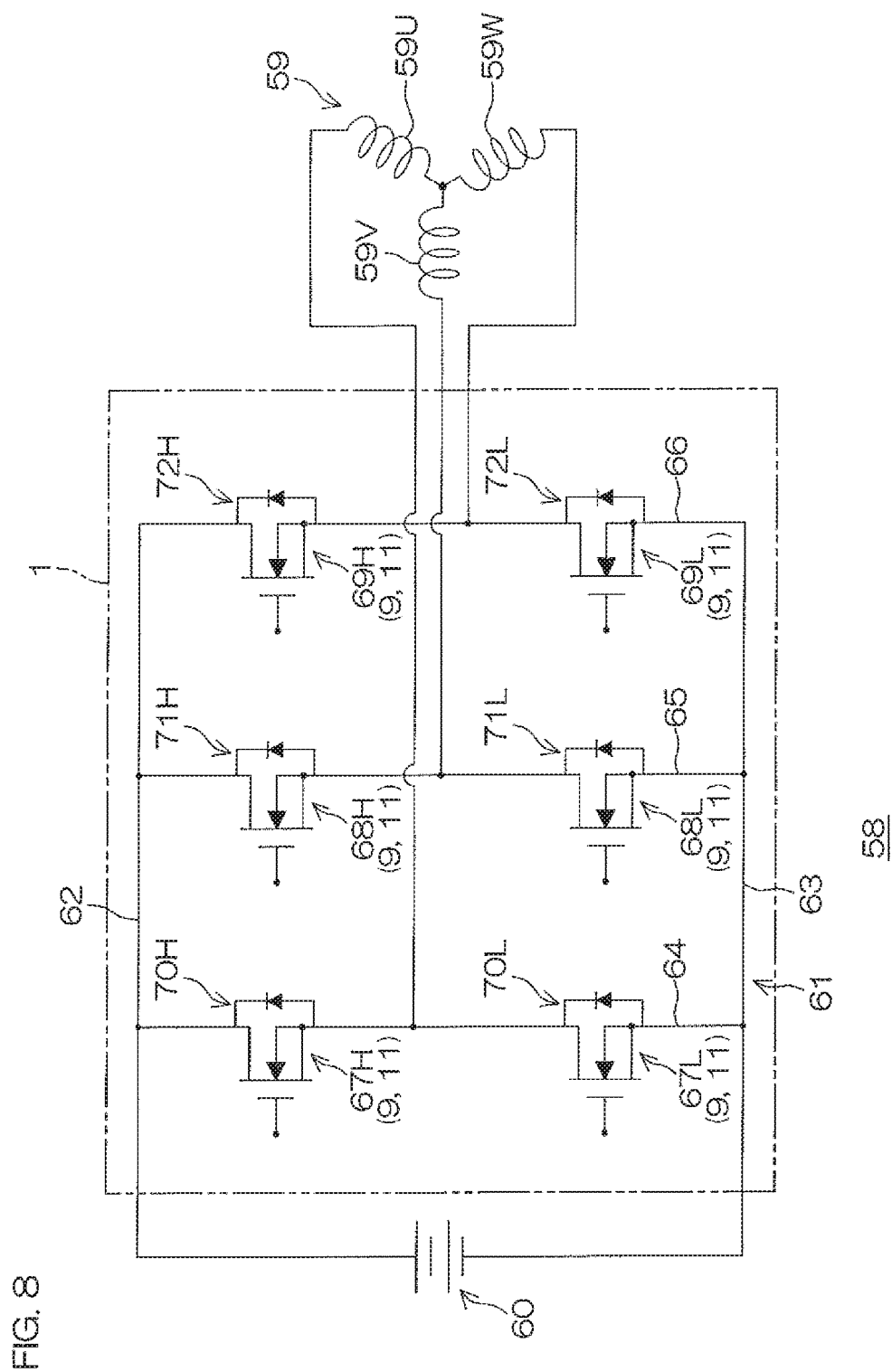
FIG. 8 is a circuit diagram of an inverter circuit with the semiconductor chip shown in FIG. 3 incorporated therein.

The semiconductor package 1 may be built and used in an inverter circuit as shown in FIG. 8, for example. In addition, in FIG. 8, the IGBT 9 and the MOSFET 11 are integrated into a single transistor for the purpose of easy illustration.

The inverter circuit 58 is a three-phase inverter circuit connected to a three-phase motor 59, including a DC power supply 60 and a switching portion 61.

A high-voltage wire 62 and a low-voltage wire 63 are connected, respectively, to the high-voltage and low-voltage sides of the DC power supply 60.

The switching portion 61 includes three series circuits 64 to 66 corresponding, respectively, to the U-phase 59U, V-phase 59V, and W-phase 59W of the three-phase motor 59.

The series circuits 64 to 66 are connected in parallel between the high-voltage wire 62 and the low-voltage wire 63. The series circuits 64 to 66 include high-side transistors (IGBT 9+MOSFET 11) 67H to 69H on the high-voltage side and low-side transistors (IGBT 9+MOSFET 11) 67L to 69L on the low-voltage side respectively. Regenerative diodes 70H to 72H and 70L to 72L are connected in parallel to the respective transistors 67H to 69H and 67L to 69L such that the forward current flows from the low-voltage side to the high-voltage side.

A switching signal is input from a control circuit not shown to the gates of the transistors 67H to 69H and 67L to 69L. In response to the switching signal, the transistors 67H to 69H and 67L to 69L perform switching operations. This causes a three-phase AC current to flow through the three-phase motor 59 and drive the three-phase motor 59.

<Semiconductor Package 1 According to a Second Preferred Embodiment>

FIG. 9 is a schematic cross-sectional view of a semiconductor chip according to a second preferred embodiment of the present invention. In FIG. 9, portions corresponding to those shown in FIG. 3 are designated by the same reference signs to omit the description thereof.

In the semiconductor chip 71 shown in FIG. 9, the multiple trenches 36 are formed in a manner penetrating through the SiC substrate 32 into the SiC base layer 33. This causes a step 72 to be provided between the bottom surface of each trench 36 and the second surface of the SiC base layer 33. The second surface of the SiC base layer 33 selectively protrudes correspondingly to the steps 72 to form convex portions 73.

The SiC base layer 33 includes an $n^+$-type buffer layer 74 formed in a manner surrounding the collector regions 37 and an $n^-$-type drift layer 75 formed on the buffer layer 74 to define the first surface 24 of the SiC semiconductor layer 23. The impurity concentration of the buffer layer 74 is higher than that of the drift layer 75. For example, the buffer layer 74 has an impurity concentration of $1.0\times10^{18}$ to $1.0\times10^{15}$ atoms·cm$^{-3}$, while the drift layer 75 has an impurity concentration of $5.0\times10^{16}$ to $1.0\times10^{14}$ atoms·cm$^{-3}$.

The buffer layer 74 includes first portions 76 protruding toward the second surface 25 of the SiC semiconductor layer 23 along the surfaces of the convex portions 73 and second portions 77 protruding in the opposite direction of the first portions 76 to surround the collector regions 37, the first and second portions formed in a switchback manner alternately according to the pitch P of the trenches 36.

The drift layer 75 constitutes a major portion of the SiC base layer 33 and is in contact with the channel region 39 at the first surface 24 of the SiC semiconductor layer 23.

A high-concentration impurity region 78 having an impurity concentration higher than that of the other portions of the SiC substrate 32 is formed in the vicinity of the first surface of the SiC substrate 32 (in the vicinity of the bottom of each trench 36). The high-concentration impurity region 78 is in contact with each convex portion 73 of the SiC base layer 33.

FIGS. 10A to 10H show sequential steps of a process for manufacturing the semiconductor chip shown in FIG. 9.

In order to manufacture the semiconductor chip 71, n-type impurities (e.g., P or As) are implanted into a surface of the wafer SiC substrate 32 to form the high-concentration impurity region 78 as shown in FIG. 10A.

Next, as shown in FIG. 10B, an epitaxial growth method such as CVD, LPE, or MBE is used to grow an SiC crystal while doping n-type impurities into the surface of the SiC substrate 32. This causes a first high-concentration impurity layer 79 as a base of the buffer layer 74 and the drift layer 75 to be formed in this order and thereby the $n^-$-type SiC base layer 33 to be formed on the SiC substrate 32.

Figure 10C:
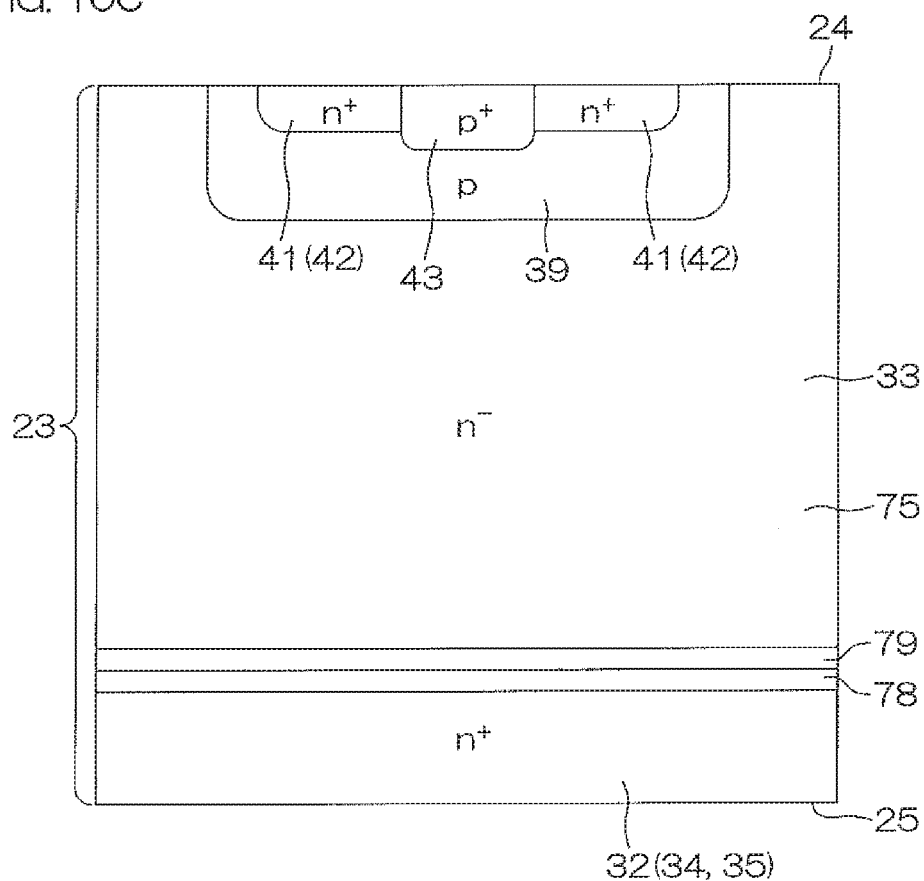
FIG. 10C shows a step following that shown in FIG. 10B.

Next, as shown in FIG. 10C, hard mask formation and ion implantation are conducted according to the shapes of the channel region 39, the emitter region 41, and the channel contact region 43 as well as the types of impurities. This causes the channel region 39, the emitter region 41, and the channel contact region 43 to be simultaneously formed in the SiC base layer 33.

Next, as shown in FIG. 10D, a hard mask 51 is formed and patterned on the second surface 25 of the SiC substrate 32 and then dry-etched at least until the drift layer 75 is exposed through the first high-concentration impurity layer 79 on the second surface 25 of the SiC substrate 32. This causes the SiC substrate 32 to be selectively dug from the second surface 25 and thereby the trenches 36 to be formed.

During this time, since the high-concentration impurity region 78 is formed in the vicinity of the first surface of the SiC substrate 32, when the etching face reaches the end (near the first surface) of the SiC substrate 32, another type of plasma can be detected different from that during etching of the other portions of the SiC substrate 32. As a result, the depth of the etching can be controlled precisely so as to penetrate through the first high-concentration impurity layer 79 to the extent possible.

Figure 10E:
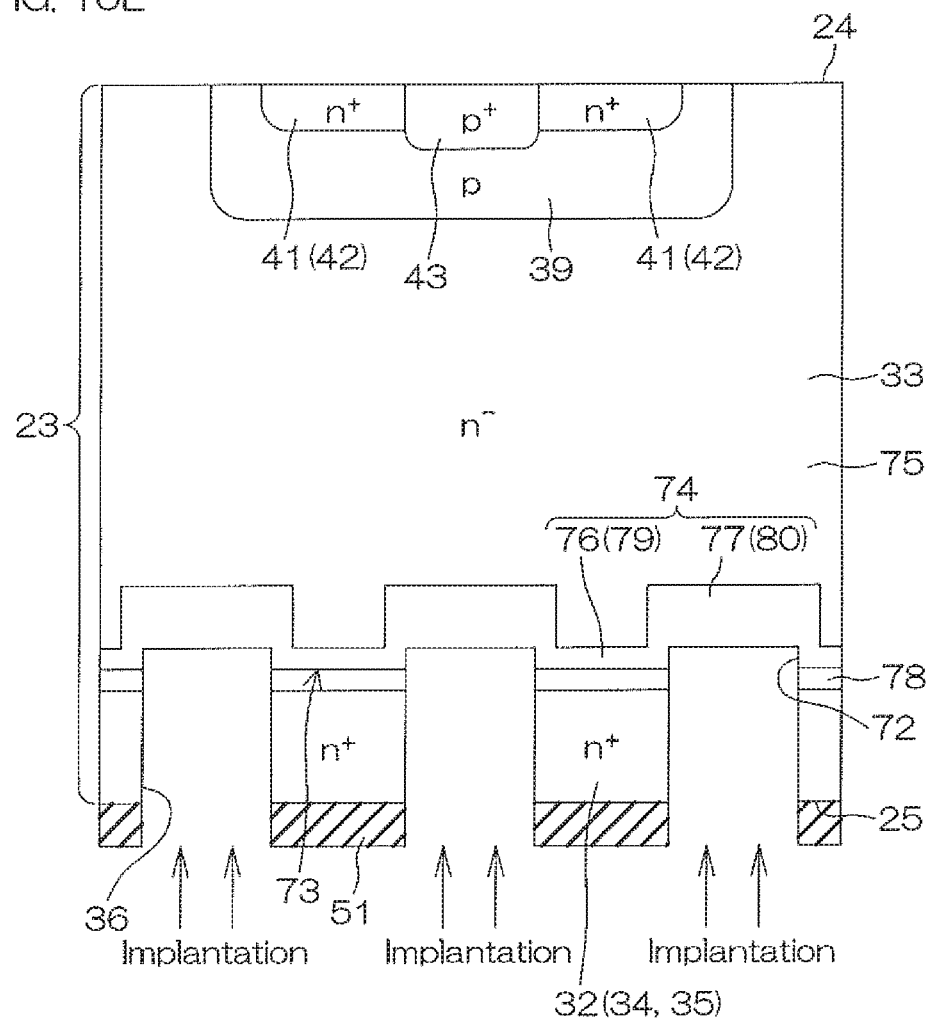
FIG. 10E shows a step following that shown in FIG. 10D.

Next, as shown in FIG. 10E, with the hard mask 51 used to form the trenches 36 being left, n-type impurities are accelerated toward the trenches 36 exposed through the hard mask 51 to be implanted into the bottom surfaces of the trenches 36. This causes a second high-concentration impurity layer 80 and the first high-concentration impurity layer 79 to be integrated and thereby the buffer layer 74 to be formed.

Figure 10F:
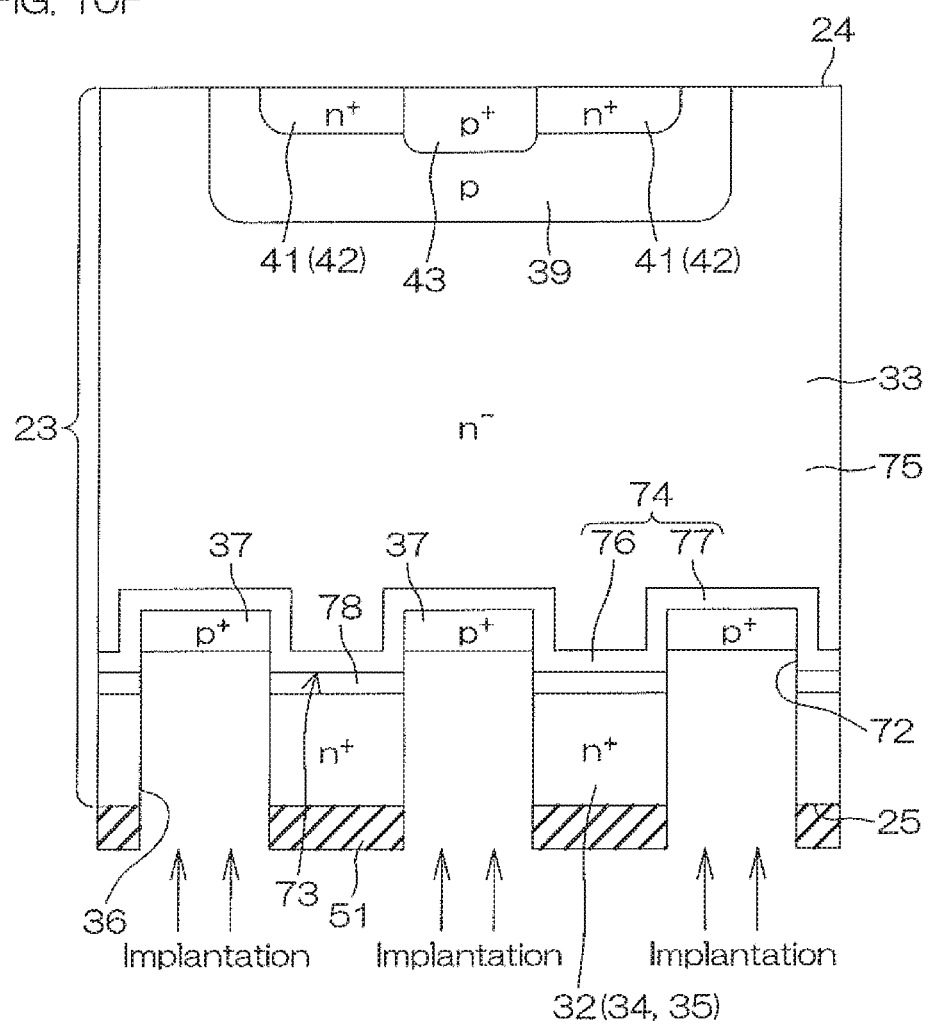
FIG. 10F shows a step following that shown in FIG. 10E.

Next, as shown in FIG. 10F, p-type impurities are accelerated toward the trenches 36 exposed through the hard mask 51 to be implanted into the bottom surfaces of the trenches 36 (second portions 77 of the buffer layer 74). This causes the collector regions 37 to be formed in the SiC base layer 33. Thereafter, the hard mask 51 is peeled off and then the SiC base layer 33 is annealed. This causes the channel region 39, the emitter region 41, the channel contact region 43, the buffer layer 74, the n-type impurities and the p-type impurities implanted into the collector regions 37 to be activated.

Figure 10G:
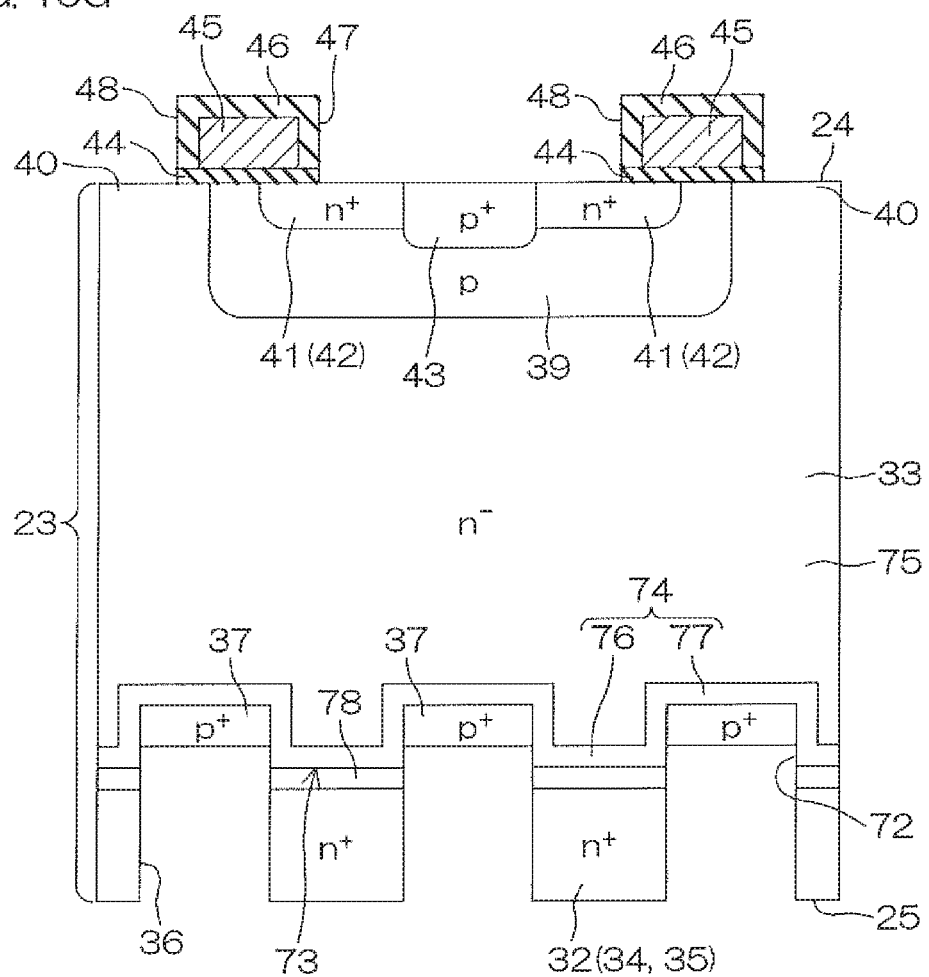
FIG. 10G shows a step following that shown in FIG. 10F.

Next, as shown in FIG. 10G, a thermal oxidation method, for example, is used to form the gate insulating film 44 on the first surface 24 of the SiC base layer 33. Subsequently, a CVD method, for example, is used to deposit polysilicon over the SiC base layer 33. The deposited polysilicon is then patterned to form the gate electrode 45.

Next, a CVD method, for example, is used to layer the interlayer insulating film 46 on the SiC base layer 33. Subsequently, the interlayer insulating film 46 and the gate insulating film 44 are selectively dry-etched to form the contact holes 47 and 48 simultaneously.

Figure 10H:
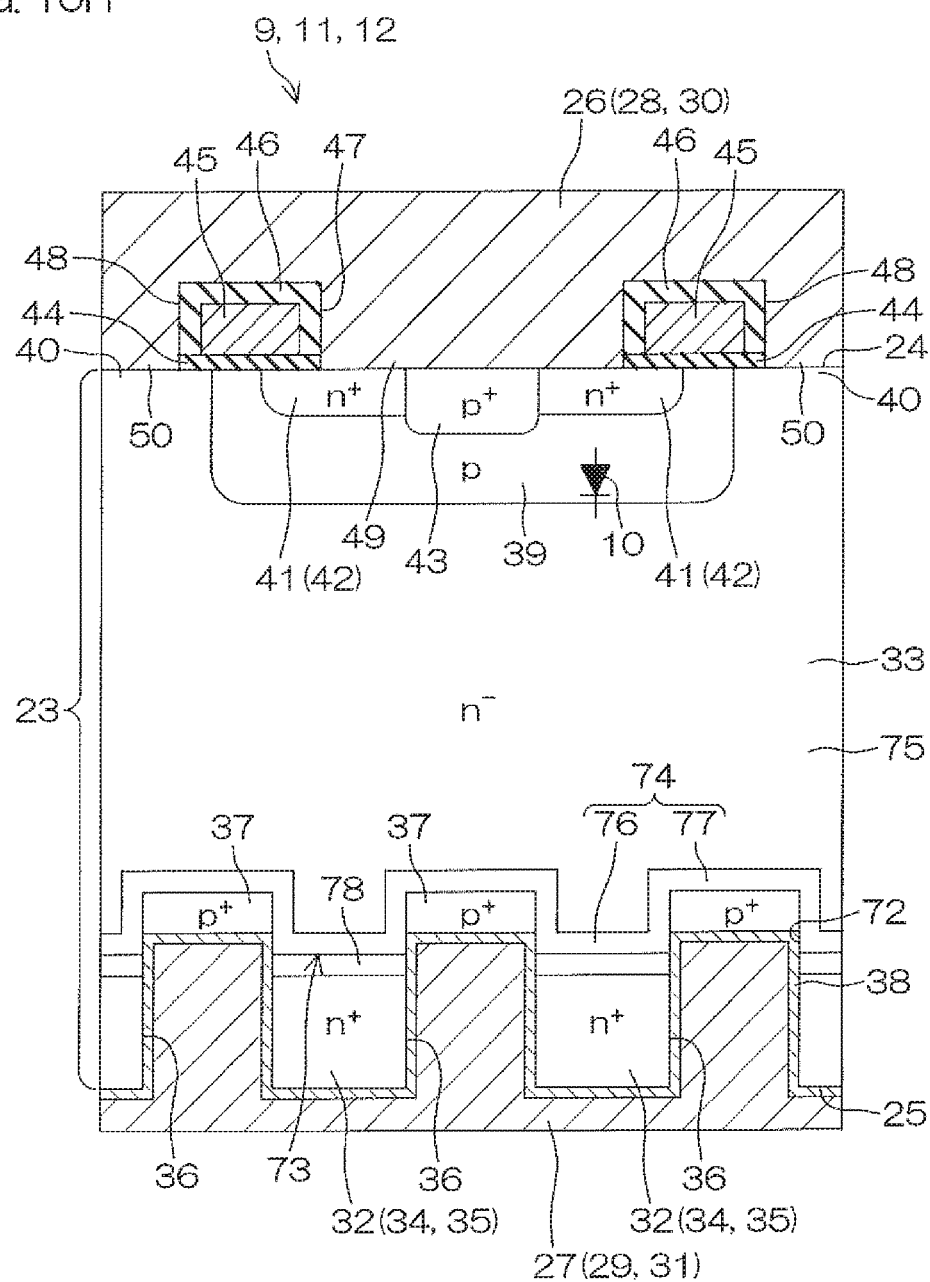
FIG. 10H shows a step following that shown in FIG. 10G.

Next, as shown in FIG. 10H, a sputtering method, for example, is used to deposit AlCu on the interlayer insulating film 46 in a manner filling the contact holes 47 and 48. This causes the emitter electrode 26 to be formed. Thereafter, the metal silicide 38 is formed on the inner surfaces of the trenches 36, and then a sputtering method, for example, is used to deposit AlCu on the second surface 25 of the SiC substrate 32 in a manner filling the inside of the metal silicide 38. This causes the collector electrode 27 to be formed.

The semiconductor chip 71 shown in FIG. 9 is thus formed through the foregoing steps.

As described heretofore, the semiconductor chip 71 can also achieve the same operational advantages as the above-described semiconductor chip 8.

Further, in the semiconductor chip 71 with the buffer layer 74 formed therein, when the IGBT 9 is in an off-state, the buffer layer 74 can inhibit the extension of the depletion layer generated at the interface between the channel region 39 and the drift layer 75 and thus prevent punch-through. It is therefore possible to design the semiconductor chip 71 as a punch-through type device to thereby achieve a low on-resistance.

The semiconductor package 1 according to the present invention may also be embodied as shown in FIGS. 11 to 14. In addition, in FIGS. 11 to 14, portions corresponding to those shown in FIGS. 1 to 3 are designated by the same reference signs. The detailed description of the portions designated by the same reference signs will be omitted below.

Figure 11:
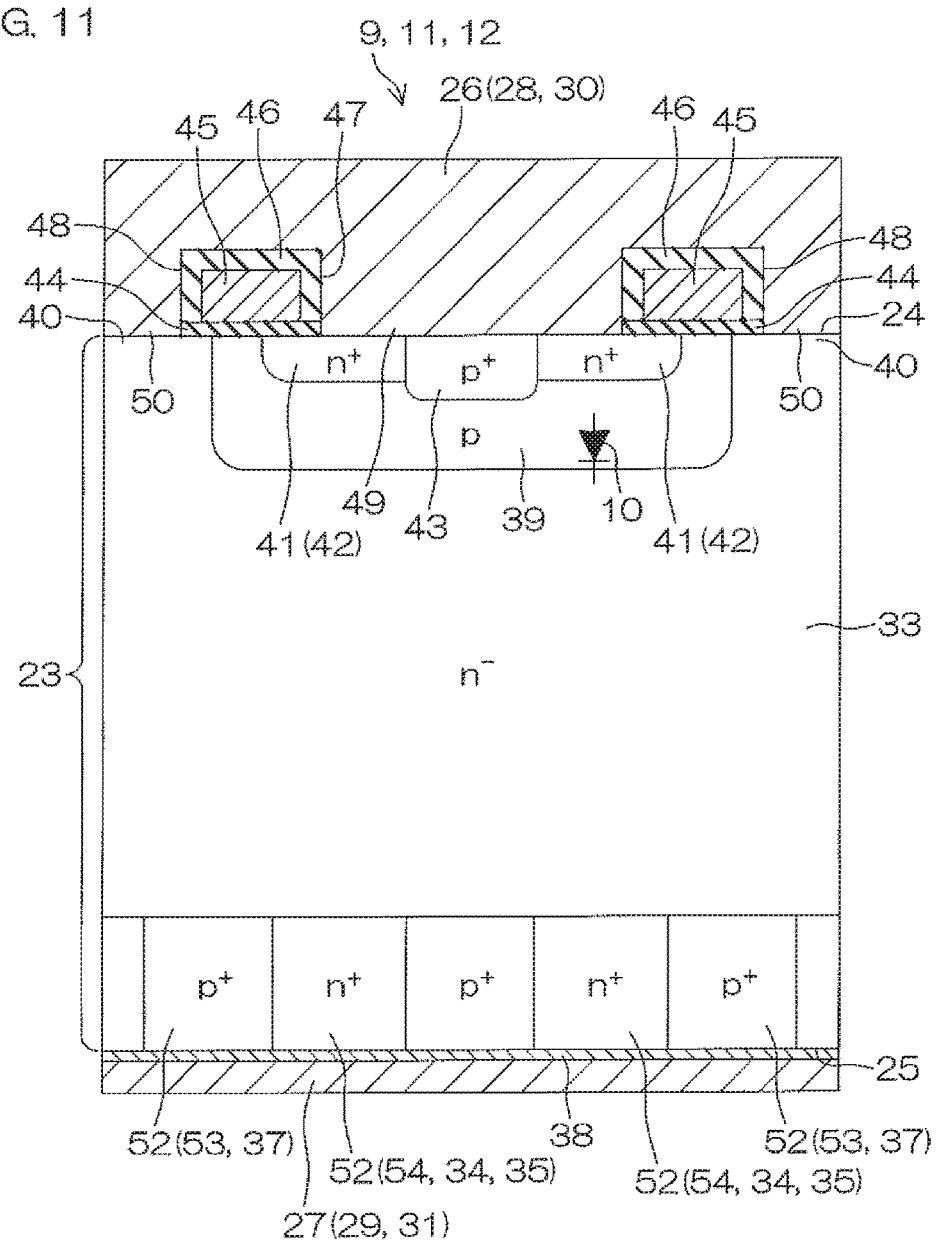
FIG. 11 is a schematic cross-sectional view of a semiconductor chip (of an SiC substrate segmented type) according to a third preferred embodiment of the present invention.
Figure 12:
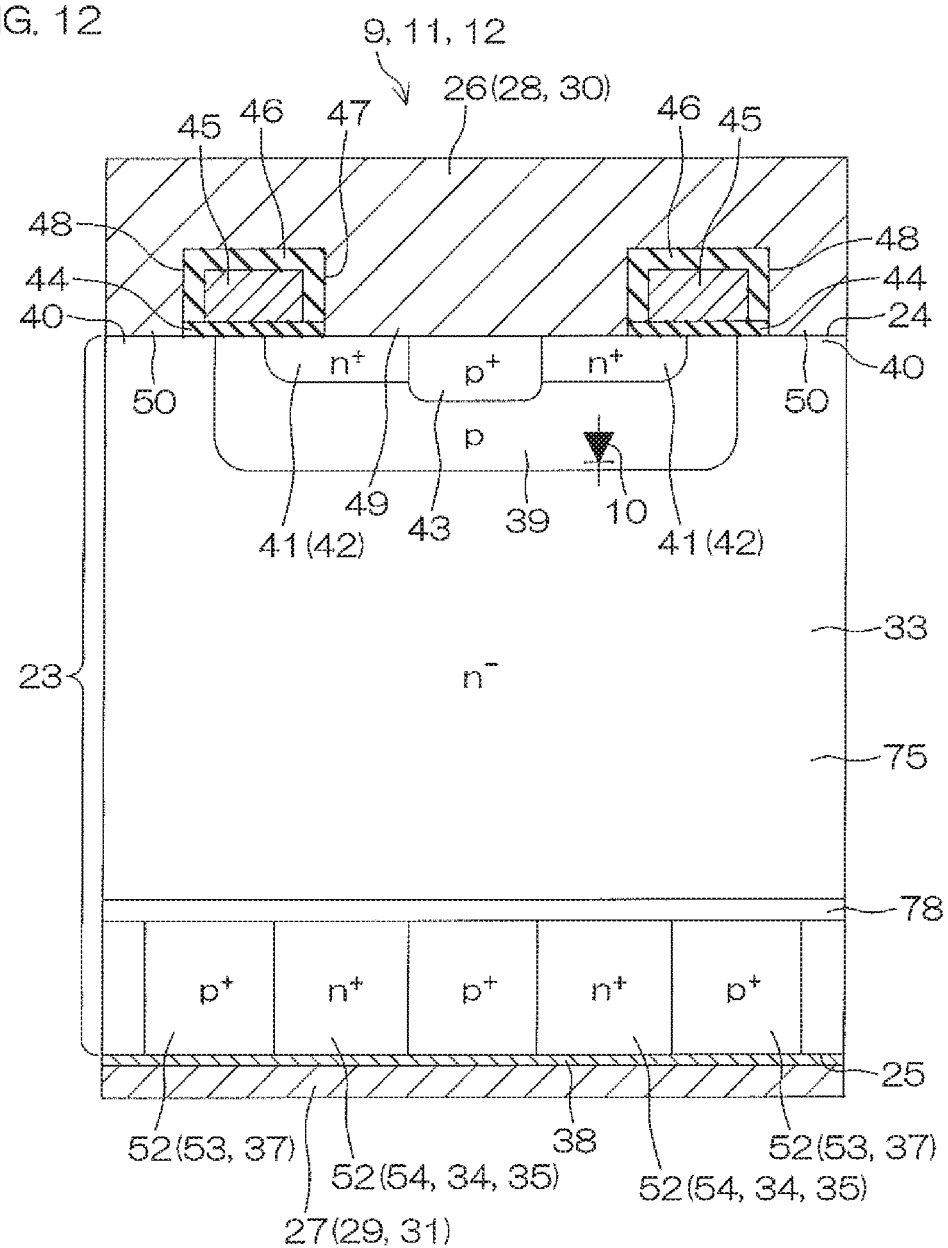
FIG. 12 is a schematic cross-sectional view of a semiconductor chip (of an SiC substrate segmented type) according to a fourth preferred embodiment of the present invention.

(1) SiC Substrate Segmented Type (FIGS. 11 and 12)

For example, the SiC substrate 52 may be segmented into multiple portions such that $p^+$-type portions 53 and $n^+$-type portions 54 are arranged alternately in a striped manner and exposed on the second surface 25 of the SiC substrate 52 so that the $p^+$-type portions 53 can be utilized as the collector regions 37 of the IGBT 9, while the $n^+$-type portions 54 can be utilized as the drain region 34 of MOSFET 11.

Also in this SiC substrate segmented type, the SiC base layer 33 may have a bilayer structure including the buffer layer 74 and the drift layer 75 as shown in FIG. 12. In this case, the buffer layer 74 is formed in a manner covering the $p^+$-type portions 53 and the $n^+$-type portions 54 collectively along the first surface of the SiC substrate 32.

Figure 13:
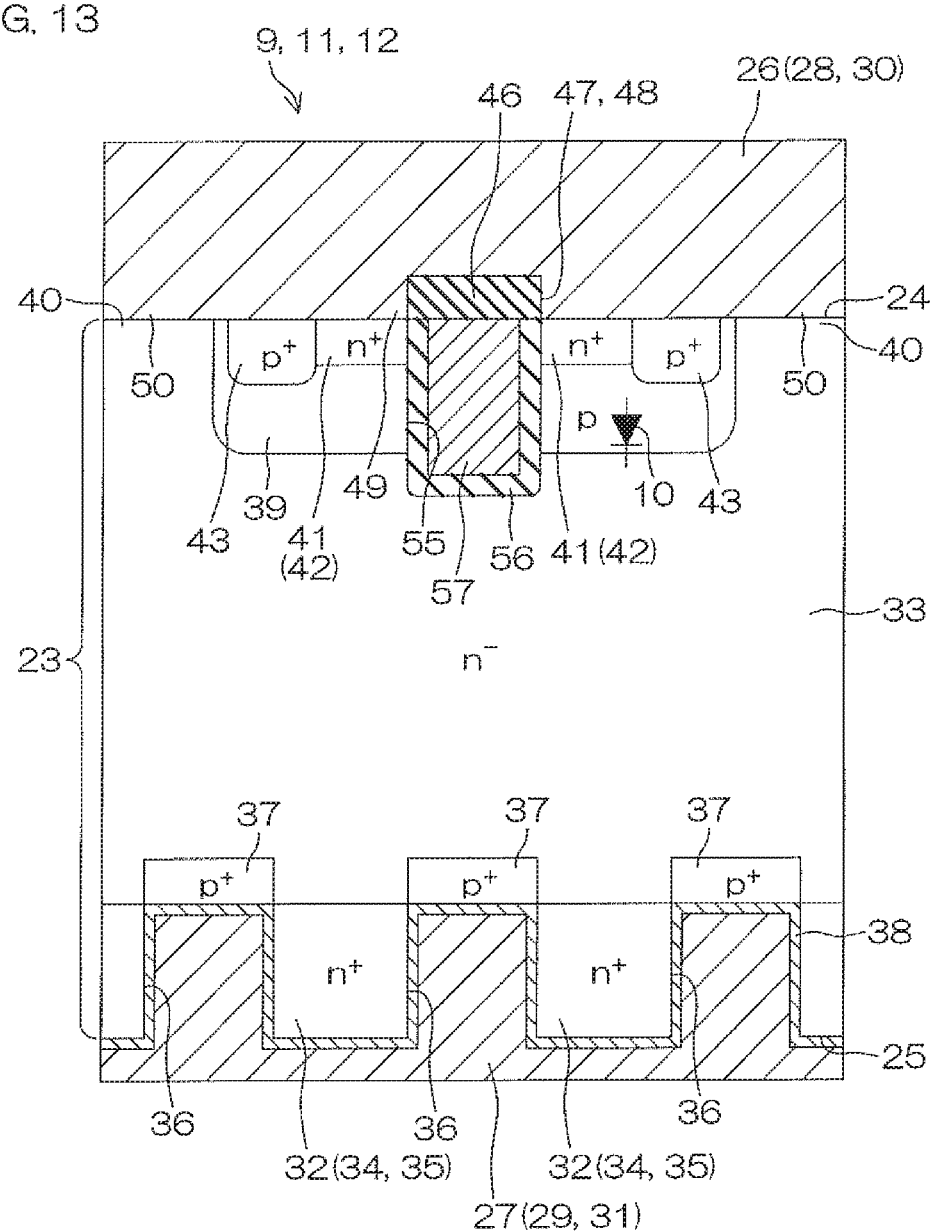
FIG. 13 is a schematic cross-sectional view of a semiconductor chip (of a trench-gate type) according to a fifth preferred embodiment of the present invention.

(2) Trench-Gate Type (FIG. 13)

The IGBT 9 may be, for example, a trench-gate type, although it is a planar-gate type in the above-described preferred embodiments.

In the trench-gate type IGBT 9, a gate trench 55 is formed in a central portion of the channel region 39, the gate trench 55 penetrating from the first surface 24 of the SiC base layer 33 through the emitter region 41 and the channel region 39 to reach the SiC base layer 33 at the deepest portion.

A gate insulating film 56 composed of $SiO_2$ is formed in a manner covering the entire inner surface of the gate trench 55. The inside of the gate insulating film 56 is then filled with polysilicon, so that a gate electrode 57 is embedded in the gate trench 55.

The channel contact region 43 is formed in a peripheral portion surrounding the central portion of the channel region 39 in a manner penetrating from the first surface 24 of the SiC base layer 33 through a peripheral portion of the emitter region 41 to reach the channel region 39.

Figure 14:
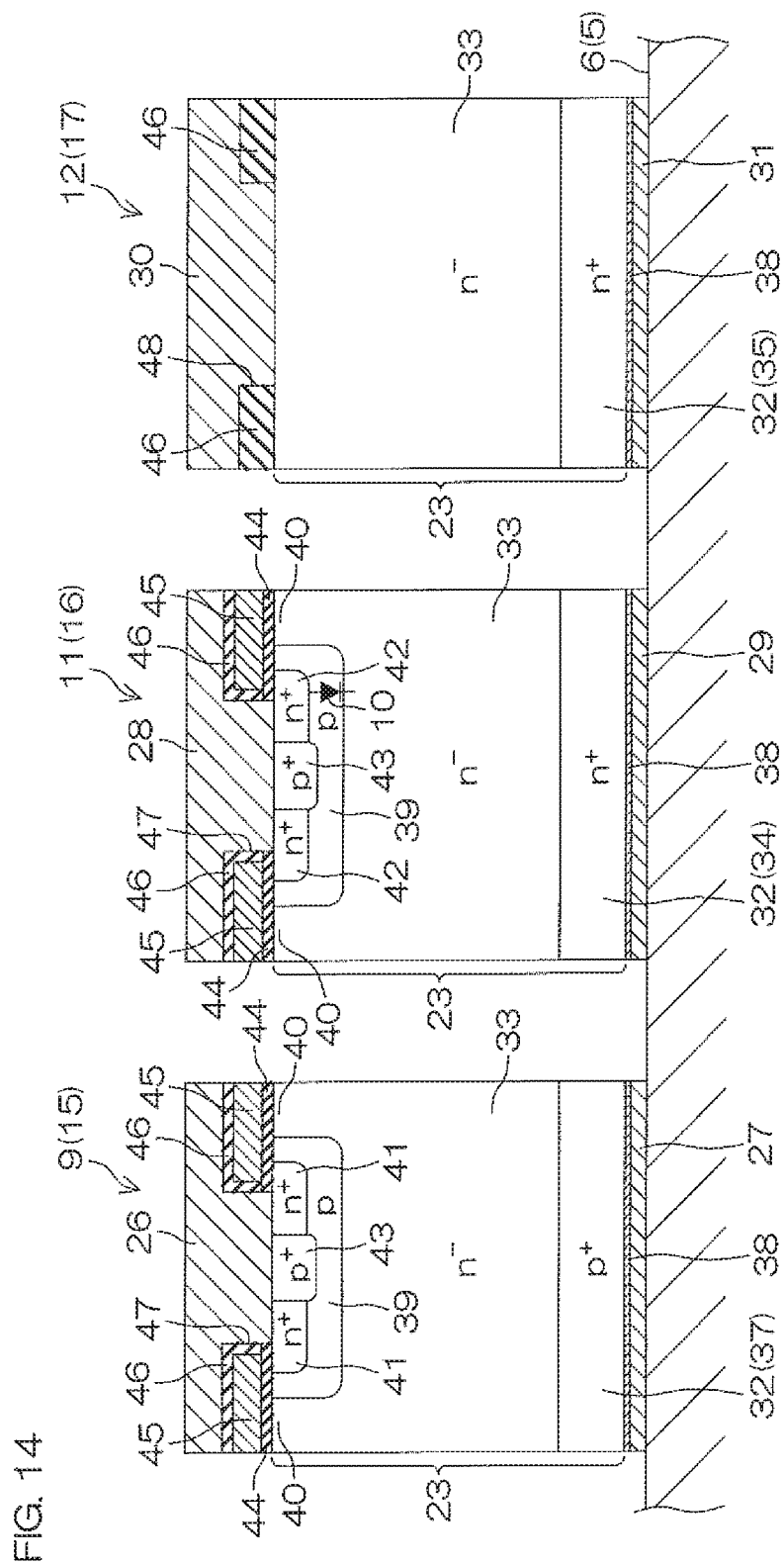
FIG. 14 is a schematic cross-sectional view of a semiconductor chip (of a device separated type) according to a sixth preferred embodiment of the present invention.

(3) Device Separated Type (FIG. 14)

The IGBT 9, the MOSFET 11, and the Schottky barrier diode 12 may be formed separately and respectively as an IGBT chip 15, a MOSFET chip 16, and a Schottky barrier diode chip 17, although they are integrated into the same semiconductor chip 8 in the above-described preferred embodiments.

In this case, the MOSFET chip 16 and the Schottky barrier diode chip 17 may be formed using not SiC but another semiconductor material such as Si, GaN, or GaAs.

The semiconductor chip according to the present invention may also be implemented in the following seventh to ninth preferred embodiments.

Figure 15:
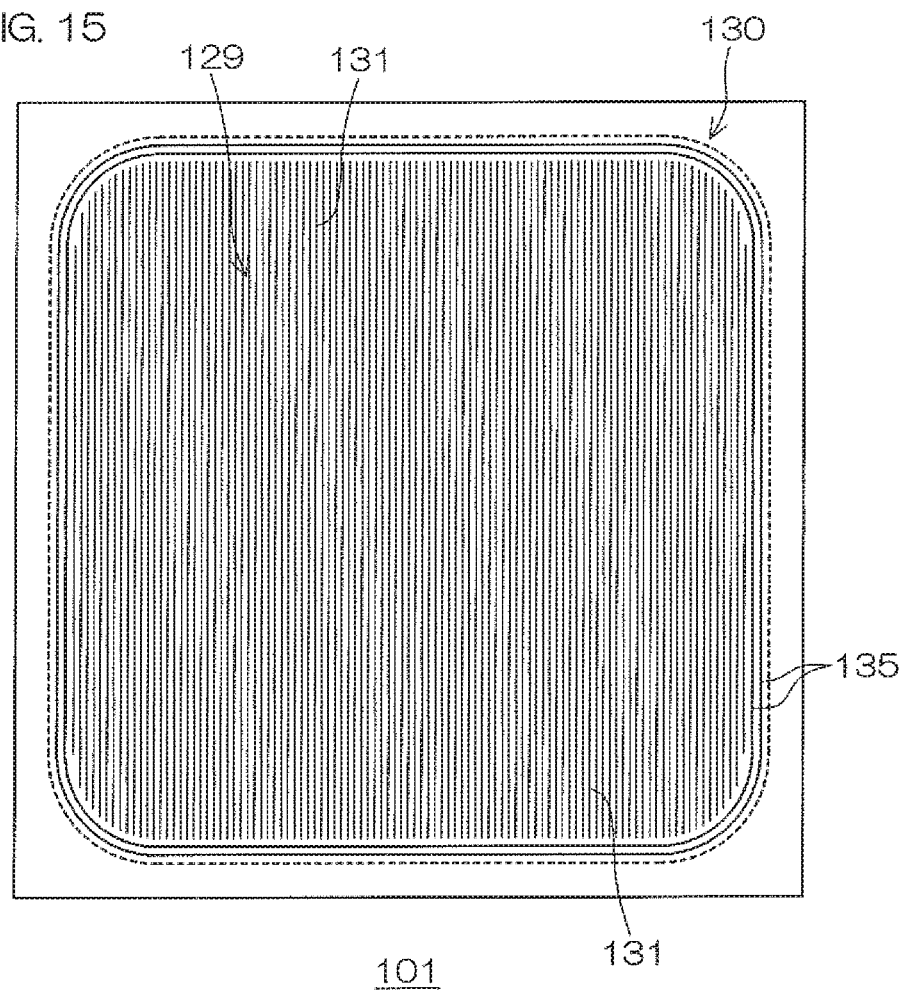
FIG. 15 is a schematic plan view of a semiconductor chip according to a seventh preferred embodiment of the present invention.
Figure 16:
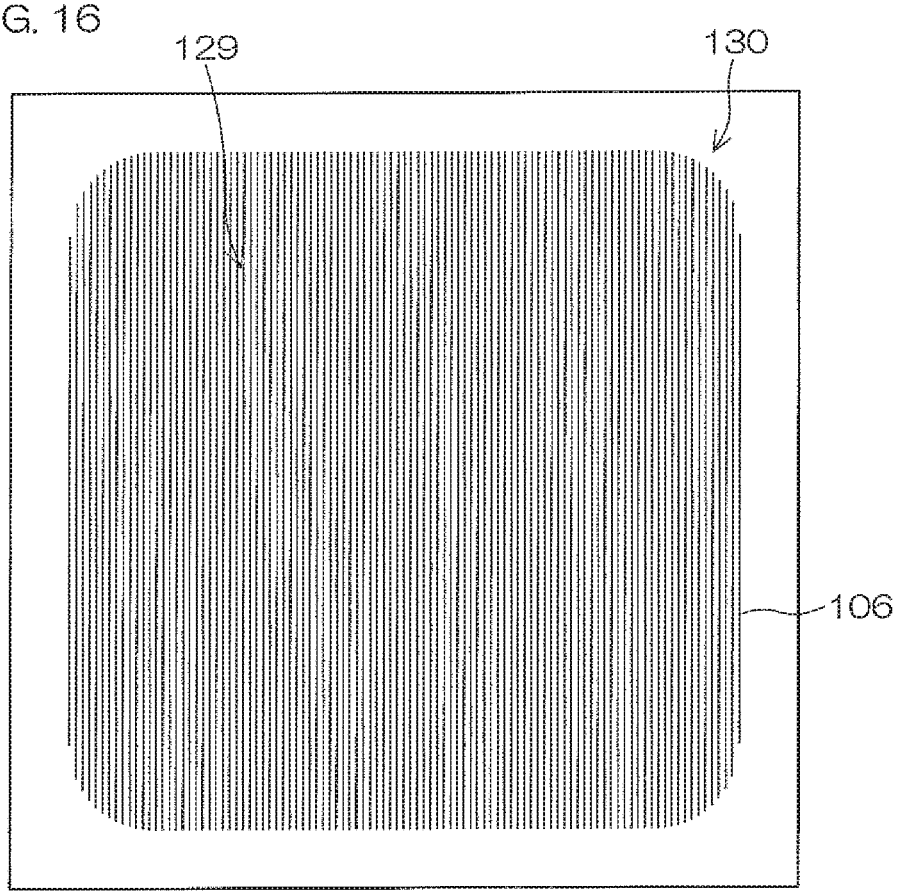
FIG. 16 is a schematic bottom view of the semiconductor chip shown in FIG. 15.
Figure 17:
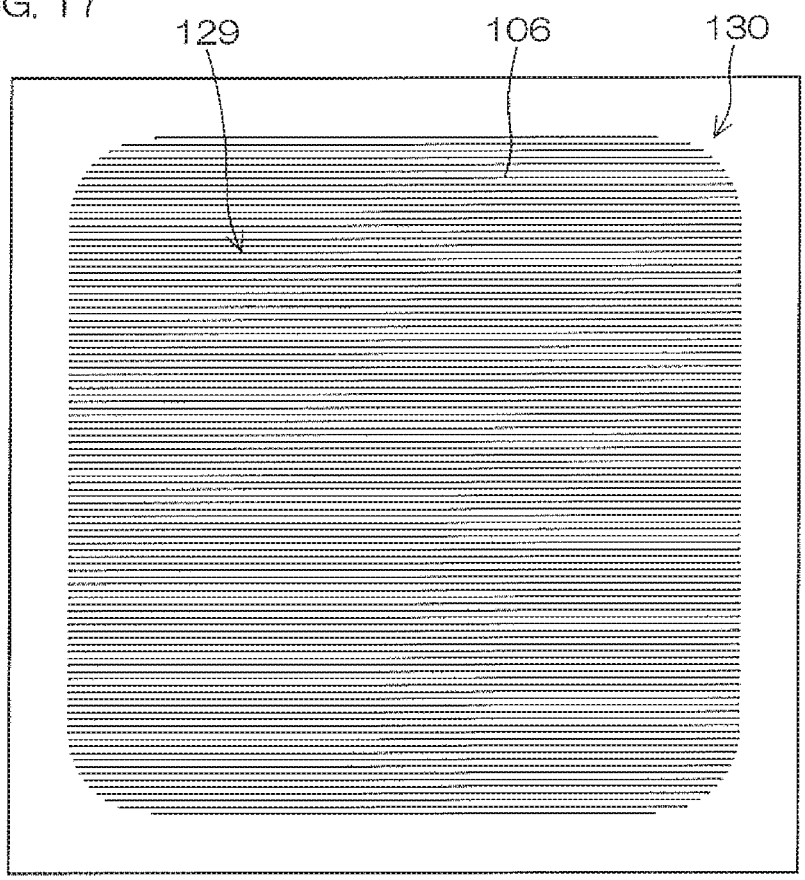
FIG. 17 shows an exemplary variation about the stripe direction of the collector region shown in FIG. 16.
Figure 18:
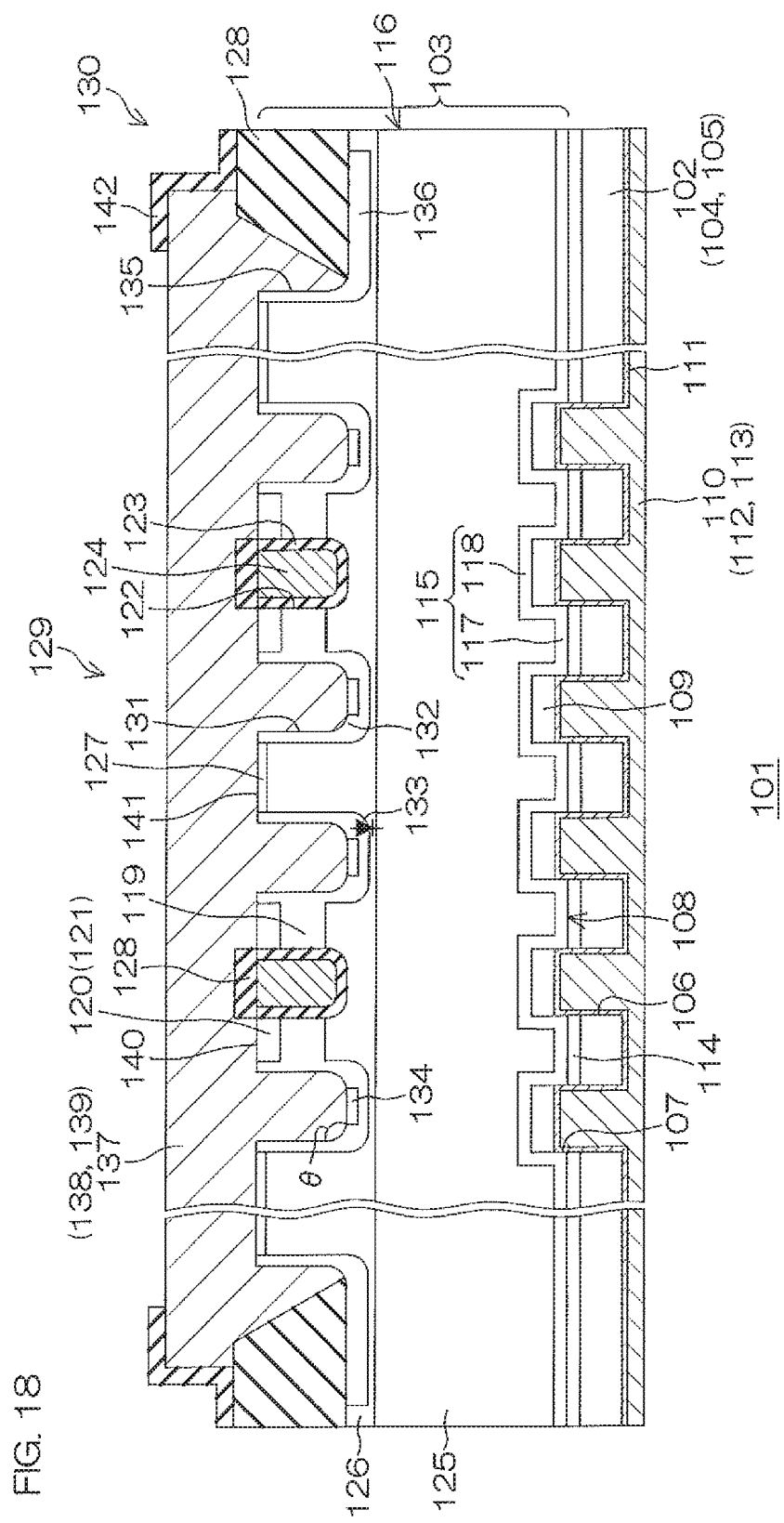
FIG. 18 is a schematic cross-sectional view of the semiconductor chip according to the seventh preferred embodiment of the present invention.

FIG. 15 is a schematic plan view of a semiconductor chip 101 according to a seventh preferred embodiment of the present invention. FIG. 16 is a schematic bottom view of the semiconductor chip 101 shown in FIG. 15. FIG. 17 shows an exemplary variation about the stripe direction of the collector region 109 shown in FIG. 16. FIG. 18 is a schematic cross-sectional view of the semiconductor chip 101 according to the seventh preferred embodiment of the present invention.

The semiconductor chip 101 has, for example, a square chip shape in a plan view. The chip-shaped semiconductor chip 101 has vertical and horizontal lengths of several millimeters on the paper surfaces of FIGS. 15 and 16.

The semiconductor chip 101 includes an $n^+$-type SiC substrate 102 and an $n^-$-type SiC base layer 103 formed on the SiC substrate 102. The $n^+$-type SiC substrate 102 defines a drain region 104 of the MOSFET 11 and a cathode region 105 of the Schottky barrier diode 12. The SiC base layer 103 serves as a drift region 116 in the MOSFET 11 and the Schottky barrier diode 12.

Multiple second surface trenches 106 are formed in a manner penetrating from the second surface of the SiC substrate 102 through the SiC substrate 102 into the SiC base layer 103. This causes a step 107 to be provided between the bottom surface of each second surface trench 106 and the second surface of the SiC base layer 103. The second surface of the SiC base layer 103 selectively protrudes correspondingly to the steps 107 to form convex portions 108.

The multiple second surface trenches 106 are formed in, for example, a striped manner at regular intervals. In addition, the trenches may be formed in, for example, a grid manner without limiting to the striped manner. In the case of a striped manner, the stripe direction may be parallel with the direction of first surface trenches 131 (to be described hereinafter) as shown in FIG. 16 or may intersect with the direction of the first surface trenches 131 (to be described hereinafter) as shown in FIG. 17.

The side surface of each second surface trench 106 is defined by the SiC substrate 102, while the bottom surface is defined by the SiC base layer 103. $P^+$-type collector regions 109 (collector regions 109 of the IGBT 9) are formed on the bottom surface (second surface portion of the SiC base layer 103).

A collector electrode 110 is then formed in a manner covering the entire second surface of the SiC substrate 102. The collector electrode 110 penetrates collectively into all the second surface trenches 106 and is connected to the SiC substrate 102 via the side surface of each second surface trench 106, while connected to the collector regions 109 via the bottom surfaces of the respective second surface trenches 106. The collector electrode 110 is an AlCu electrode with a metal silicide 111 formed in a manner contacting the inner surface (side surface and bottom surface) of each second surface trench 106. This can bring the collector electrode 110 into ohmic contact with any target of whichever conductive type including the $n^+$-type SiC substrate 102 and the $p^+$-type collector regions 109.

The collector electrode 110 is an external electrode common to the IGBT 9, the MOSFET 11, and the Schottky barrier diode 12. In the MOSFET 11, the collector electrode 110 serves as a drain electrode 112. On the other hand, in the Schottky barrier diode 12, the collector electrode 110 serves as a cathode electrode 113.

A high-concentration impurity region 114 having an impurity concentration higher than that of the other portions of the SiC substrate 102 is formed in the vicinity of the first surface of the SiC substrate 102 (in the vicinity of the bottom of each second surface trench 106). The high-concentration impurity region 114 is in contact with each convex portion 108 of the SiC base layer 103.

The SiC base layer 103 includes a buffer region 115 and a drift region 116.

The buffer region 115 includes first portions 117 protruding toward the second surface of the SiC base layer 103 along the surfaces of the convex portions 108 and second portions 118 protruding in the opposite direction of the first portions 117 to surround the collector regions 109, the first and second portions formed in a switchback manner alternately according to the pitch of the second surface trenches 106.

The drift region 116 has a trilayer structure including a base drift region 125, a low-resistance drift region 126, and a surficial drift region 127, where the base drift region 125 is in contact with the buffer region 115 and the surficial drift region 127 is exposed on the first surface of the SiC base layer 103.

A P-type channel region 119 is selectively formed in a surficial portion of the drift region 116, and an $n^+$-type emitter region 120 is formed in a surficial portion of the channel region 119. The emitter region 120 is exposed on the first surface of the SiC base layer 103 to define a portion of the first surface. The emitter region 120 serves also as a source region 121 of the MOSFET 11.

The emitter region 120 and the channel region 119 constitute a unit cell of the IGBT 9 (MOSFET 11). Between adjacent unit cells of the IGBT 9 (MOSFET 11), the drift region 116 is partially exposed on the first surface of the SiC base layer 103.

A gate trench 122 is formed in the SiC base layer 103, the gate trench penetrating from the first surface of the SiC base layer 103 through the emitter region 120 and the channel region 119 to reach an intermediate portion of the low-resistance drift region 126 at the deepest portion. This causes the emitter region 120 (source region 121) to define a portion of the side surface of the gate trench 122. The channel region 119 similarly defines a portion of the side surface of the gate trench 122. The drift region 116 defines a portion of the side surface and the bottom surface of the gate trench 122.

A gate insulating film 123 composed of an insulator such as $SiO_2$ is formed in a manner covering the entire inner surface (side surface and bottom surface) of the gate trench 122. A gate electrode 124 composed of a conductor such as polysilicon is then embedded in the gate trench 122. The gate electrode 124 is opposed to the emitter region 120 (source region 121), the channel region 119, and the drift region 116 via the gate insulating film 123.

A field insulating film 128 composed of an insulator such as $SiO_2$ is formed on the first surface of the SiC base layer 103. The field insulating film 128 has a contact hole through which the SiC base layer 103 is partially exposed as an active region 129 and covers a field region 130 that surrounds the active region 129.

Between adjacent unit cells of the IGBT 9 (MOSFET 11) in the active region 129, a first surface trench 131 is formed penetrating from the first surface of the SiC base layer 103 through the surficial drift region 127 to reach an intermediate portion of the low-resistance drift region 126 at the deepest portion. The first surface trench 131 is formed to have the same depth and shape as the gate trench 122.

The gate trench 122 and the first surface trench 131 may be formed in a striped manner parallel with (see FIG. 16) or intersecting with (e.g., perpendicular to) (see FIG. 17) the direction of the second surface trenches 106.

The gate trench 122 and the first surface trench 131 are defined by a bottom surface parallel with the first surface of the SiC base layer 103 and a side surface inclined with respect to the bottom surface. The inclination angle θ of the side surface is, for example, 90 degrees to 135 degrees. The depth of the first surface trench 131 (distance from the first surface of the SiC base layer 103 to the bottom surface of the first surface trench 131) is, for example, 3000 Å to 15000 Å. The width of the first surface trench 131 perpendicular to the longitudinal direction (at the deepest portion) is 0.3 μm to 10 μm.

The specific shape of the gate trench 122 and the first surface trench 131 may be a U-shaped trench having an inclination angle θ of about 90 degrees and a U-shaped bottom portion in a cross-sectional view, in which the edge portion of the bottom surface is curved outward so that the side surface and the bottom surface are connected via the curved surface as exemplified in FIG. 18, however, it is not limited thereto, the side surface and the bottom surface may be connected via an angular surface, for example.

The gate trench 122 and the first surface trench 131 may also be formed in, for example, an inverted trapezoidal trench having an inclination angle θ of greater than 90 degrees in a cross-sectional view taken along the width direction perpendicular to the longitudinal direction. In the inverted trapezoidal trench, the side surface may be entirely inclined at an inclination angle θ of greater than 90 degrees or a portion (lower portion) of the side surface may be selectively inclined at an inclination angle θ of greater than 90 degrees, while the other portions (upper portion) of the side surface may be formed at 90 degrees with respect to the bottom surface.

On the bottom surface and the side surface of the first surface trench 131, a p-type layer 132 serving as an electric field relaxing portion is formed along the inner surface of the first surface trench 131. The p-type layer 132 is formed from the bottom surface of the first surface trench 131 through the edge portion to the opening end of the first surface trench 131 in a manner covering both the channel region 119 and the emitter region 120 (source region 121).

The p-type layer 132 also forms a pn junction with the n-type SiC base layer 103. This causes the Schottky barrier diode 12 to be connected in parallel to the pn diode 133 constituted by the p-type layer 132 and the n-type SiC base layer 103 (low-resistance drift region 126).

In the p-type layer 132, a $p^+$-type contact layer 134 is formed on a portion of the bottom surface of the first surface trench 131. The contact layer 134 is formed linearly in the longitudinal direction of the first surface trench 131 and has a depth (e.g., 0.05 μm to 0.2 μm) from the bottom surface of the first surface trench 131 to an intermediate portion of the p-type layer 132 in the depth direction.

On the other hand, an annular trench 135 penetrating from the first surface of the field region 130 through the surficial drift region 127 to reach an intermediate portion of the low-resistance drift region 126 at the deepest portion is formed in the field region 130. The annular trench 135 is formed in a manner surrounding the active region 129.

On the bottom surface and the side surface of the annular trench 135, a guard ring 136 is formed along the inner surface of the annular trench 135 in a manner exposed on the inner surface. The guard ring 136 is formed in the same step as the p-type layer 132 and has the same impurity concentration and thickness as the p-type layer 132.

An emitter electrode 137 composed of AlCu is formed on the field insulating film 128. The emitter electrode 137 is connected to the emitter region 120 (source region 121), the surficial drift region 127, and the contact layer 134 within the contact hole of the field insulating film 128.

That is, the emitter electrode 137 is an external electrode common to the IGBT 9, the MOSFET 11, and the Schottky barrier diode 12. In the MOSFET 11, the emitter electrode 137 serves as a source electrode 138. On the other hand, in the Schottky barrier diode 12, the emitter electrode 137 serves as an anode electrode 139.

Accordingly, the emitter electrode 137 includes an ohmic contact portion 140 in ohmic contact with the $n^+$-type emitter region 120 and the $p^+$-type contact layer 134, which have a high impurity concentration, and a Schottky joint portion 141 forming a Schottky junction with the $n^-$-type surficial drift region 127, which has a low impurity concentration.

A surface protection film 142 composed of an insulator such as SiN is formed on the uppermost surface of the semiconductor chip 101. In a central portion of the surface protection film 142, an opening is formed through which the emitter electrode 137 is exposed. The bonding wire 14 shown in FIG. 1 is bonded to the emitter electrode 137 through the opening.

As described heretofore, the semiconductor chip 101 is formed with the vertical IGBT 9 including the emitter electrode 137, the emitter region 120 connected to the emitter electrode 137, the channel region 119 formed in a manner contacting the side of the emitter region 120 nearer the second surface of the SiC base layer 103, the drift region 116 formed in a manner contacting the side of the channel region 119 nearer the second surface of the SiC base layer 103, the collector region 109 formed in a manner contacting the side of the drift region 116 nearer the second surface of the SiC base layer 103, and the collector electrode 110 connected to the collector region 109.

The emitter electrode 137 and the collector electrode 110 of the IGBT 9 are then shared between the MOSFET 11 and the Schottky barrier diode 12, and the MOSFET 11 also includes the emitter region 120 (source region 121), the channel region 119, the drift region 116, and the drain region 104 as impurity regions connected to these electrodes. The Schottky barrier diode 12 also includes the drift region 116 and the cathode region 105 as impurity regions connected to these electrodes.

That is, in the semiconductor chip 101, the IGBT 9, the MOSFET 11, and the Schottky barrier diode 12 are integrated into a single unit cell.

Thus, the three devices, IGBT 9, MOSFET 11, and Schottky barrier diode 12, are collectively mounted on the semiconductor chip 101 and connected in parallel to each other.

<Impurity Concentration of the SiC Base Layer 103>

Next, the impurity concentration of the SiC substrate 102 and the SiC base layer 103 will be described with reference to FIG. 19.

FIG. 19 illustrates the impurity concentration of the SiC substrate 102 and the SiC base layer 103.

As shown in FIG. 19, the SiC substrate 102 and the SiC base layer 103 are each composed of n-type SiC containing n-type impurities. These satisfy the magnitude relationship of the impurity concentration: SiC substrate 102> buffer region 115> drift region 116.

The SiC substrate 102 has an approximately constant concentration of, for example, $5 \times 10^{18}$ to $5 \times 10^{19}$ cm$^{-3}$ in the thickness direction. The buffer region 115 has a constant concentration or a concentration reduced along the surface of, for example, $1 \times 10^{17}$ to $5 \times 10^{18}$ cm$^{-3}$ in the thickness direction.

The concentration of the drift region 116 shows stepwise changes at the interfaces of the base drift region 125, the low-resistance drift region 126, and the surficial drift region 127. That is, with respect to each interface, there is a concentration difference between the layer nearer the first surface and the layer nearer the second surface.

The base drift region 125 has a constant concentration of, for example, $5 \times 10^{14}$ to $5 \times 10^{16}$ cm$^{-3}$ in the thickness direction. In addition, the concentration of the base drift region 125 may decrease from about $3 \times 10^{16}$ cm$^{-3}$ to about $5 \times 10^{15}$ cm$^{-3}$ continuously from the second surface toward the first surface of the SiC base layer 103 as indicated by the broken line in FIG. 19.

The low-resistance drift region 126 has a constant concentration higher than that of the base drift region 125, for example, $5 \times 10^{15}$ to $5 \times 10^{17}$ cm$^{-3}$ in the thickness direction. In addition, the concentration of the low-resistance drift region 126 may decrease from about $3 \times 10^{17}$ cm$^{-3}$ to about $1 \times 10^{16}$ cm$^{-3}$ continuously from the second surface toward the first surface of the SiC base layer 103 as indicated by the broken line in FIG. 19.

The surficial drift region 127 has a constant concentration lower than that of the base drift region 125 and the low-resistance drift region 126, for example, $5 \times 10^{14}$ to $1 \times 10^{16}$ cm$^{-3}$ in the thickness direction.

As shown in FIG. 18, since the Schottky barrier diode 12, which has a stripe-like unit cell (line cell) sandwiched between adjacent first surface trenches 131, has a current flow region (current path) limited by the distance between the adjacent first surface trenches 131, if the portions defining the unit cell in the SiC base layer 103 have a low impurity concentration, the unit cell may have a high resistance.

Hence, as shown in FIG. 19, the concentration of the low-resistance drift region 126 defining the base portion of the unit cell is set higher than that of the base drift region 125. Accordingly, even if the current path may be limited by the distance between the first surface trenches 131, the low-resistance drift region 126, which has the relatively high concentration, can suppress an increase in resistance of the unit cell. As a result, the unit cell can have a low resistance.

On the other hand, since the surficial drift region 127, which has the relatively low concentration, is provided in a surficial portion of the unit cell in contact with the emitter electrode 137 (anode electrode 139), the electric field intensity at the surface of the SiC base layer 103 upon reverse voltage application can be reduced. As a result, the reverse leakage current can be further reduced.

Next, a process for manufacturing the semiconductor chip 101 shown in FIG. 18 will be described.

FIGS. 20A to 20D show sequential steps of the process for manufacturing the semiconductor chip 101 shown in FIG. 18.

First, as shown in FIG. 20A, in accordance with the steps shown in FIGS. 10A and 10B, the high-concentration impurity region 114 is formed on a surface of the wafer SiC substrate 102, and then a first high-concentration impurity region 143 as a base of the buffer region 115 and the drift region 116 are epitaxially grown sequentially to form the $n^-$-type SiC base layer 103.

Figure 20B:
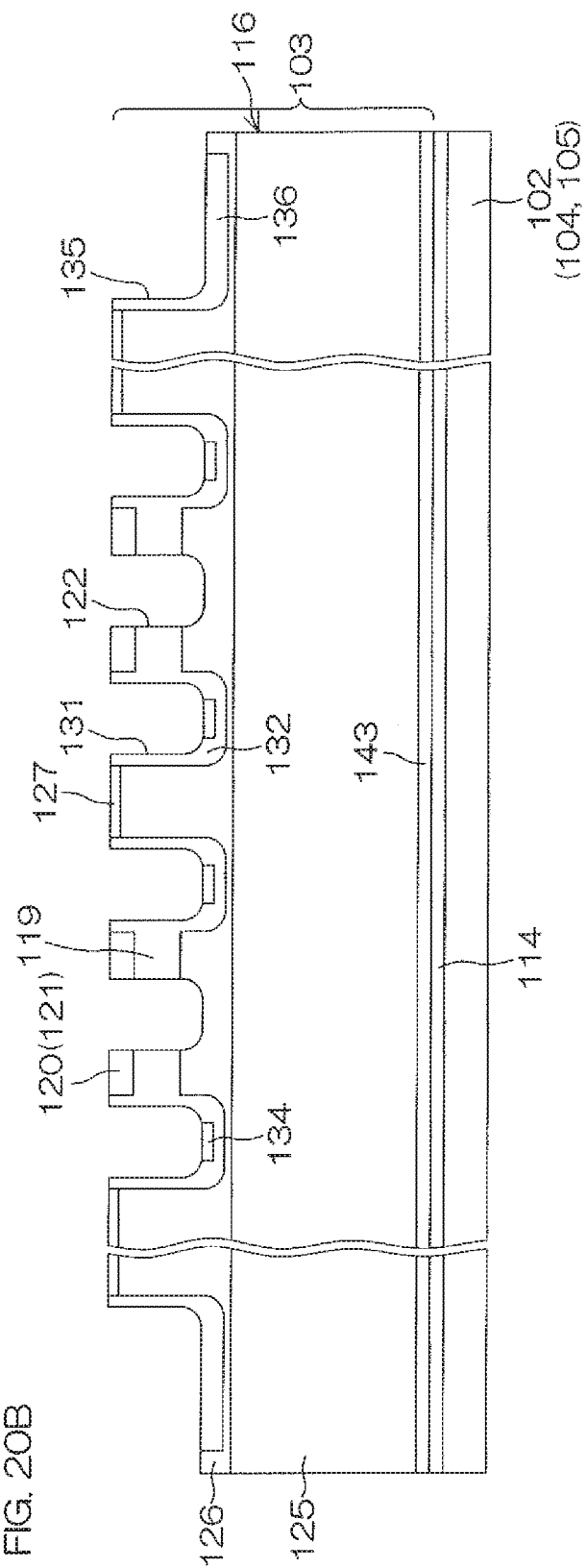
FIG. 20B shows a step following that shown in FIG. 20A.

Next, as shown in FIG. 20B, in accordance with the step shown in FIG. 10C, hard mask formation and ion implantation are conducted according to the shapes of the channel region 119 and the emitter region 120 (source region 121) as well as the types of impurities. This causes the channel region 119 and the emitter region 120 (source region 121) to be formed in the SiC base layer 103.

Next, a hard mask is formed according to the patterns of the gate trench 122, the first surface trench 131, and the annular trench 135 and then, through etching using the hard mask, the gate trench 122, the first surface trench 131, and the annular trench 135 are simultaneously formed to have the same depth.

Next, impurities are selectively implanted into the inner surfaces of the first surface trench 131 and the annular trench 135 to form the p-type layer 132 and the guard ring 136 simultaneously. Further, impurities are selectively formed on the bottom surface of the first surface trench 131 to form the contact layer 134.

Figure 20C:
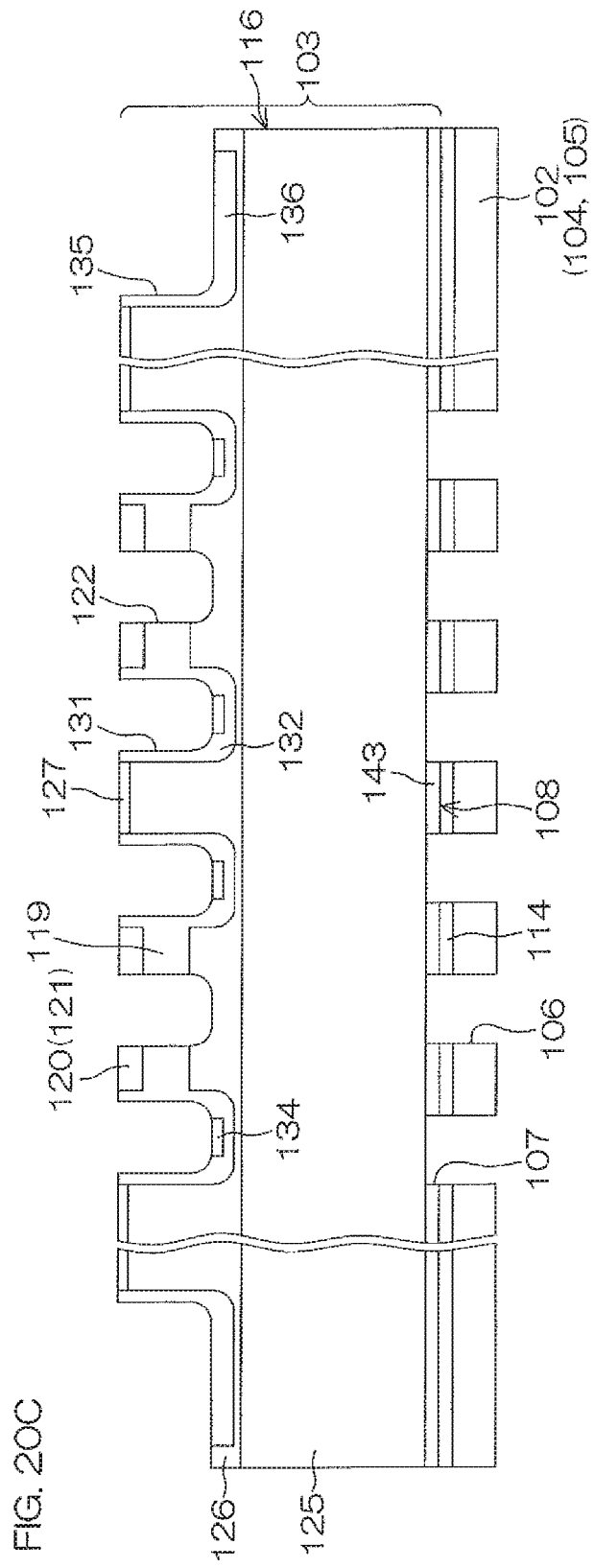
FIG. 20C shows a step following that shown in FIG. 20B.

Next, as shown in FIG. 20C, in accordance with the step shown in FIG. 10D, a hard mask is formed and patterned on the second surface of the SiC substrate 102 and then dry-etched at least until the drift region 116 (base drift region 125) is exposed through the first high-concentration impurity region 143 on the second surface of the SiC substrate 102. This causes the SiC substrate 102 to be selectively dug from the second surface and thereby the second surface trenches 106 to be formed.

Figure 20D:
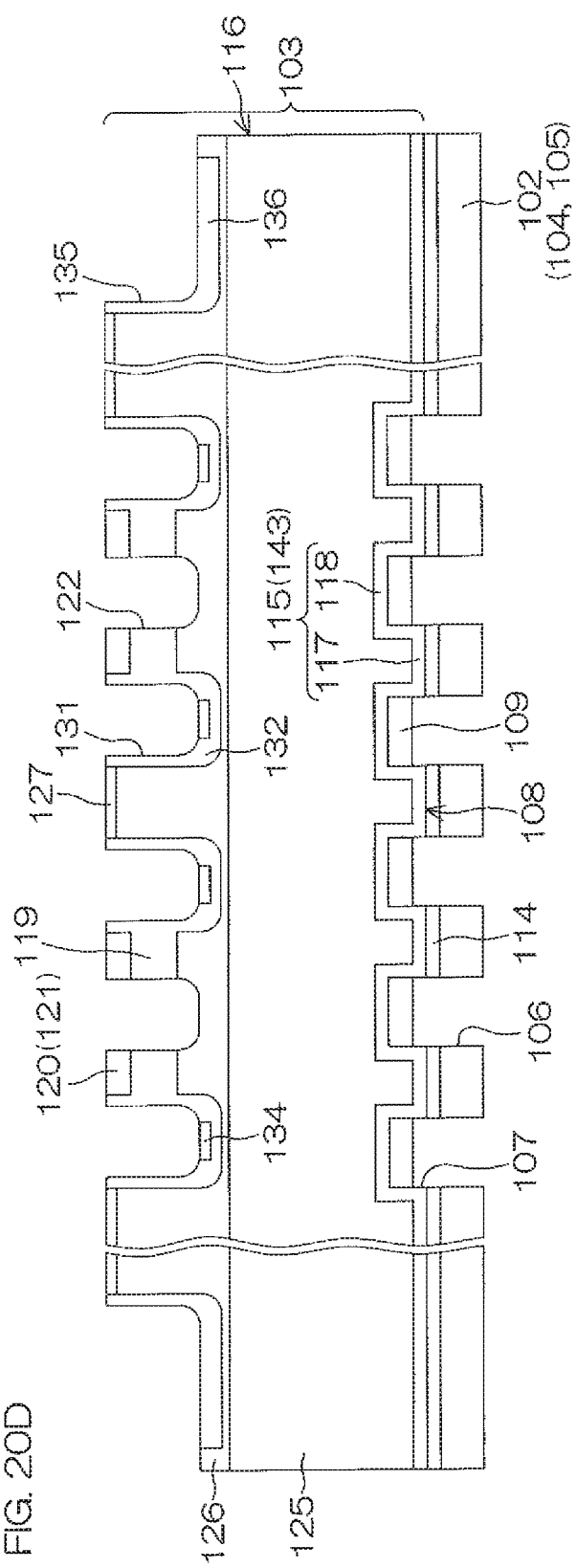
FIG. 20D shows a step following that shown in FIG. 20C.

Next, as shown in FIG. 20D, in accordance with the step shown in FIG. 10E, n-type impurities are implanted into the bottom surfaces of the second surface trenches 106 to form the buffer region 115. Next, in accordance with the step shown in FIG. 10F, p-type impurities are implanted into the bottom surfaces of the second surface trenches 106 (second portions 118 of the buffer region 115) to form the collector regions 109 in the SiC base layer 103.

Thereafter, the SiC base layer 103 is annealed. This causes the n-type impurities and the p-type impurities implanted into the drift region 116, the channel region 119, the emitter region 120 (source region 121), the contact layer 134, the buffer region 115, and the collector regions 109 to be activated.

Subsequently, in accordance with the above-described method or a known semiconductor manufacturing technique, the gate insulating film 123, the gate electrode 124, the field insulating film 128, the emitter electrode 137, the collector electrode 110, etc., are formed to obtain the semiconductor chip 101 shown in FIG. 18.

As described heretofore, the semiconductor chip 101 can also achieve the same operational advantages as the above-described semiconductor chips 8 and 71.

Further, in accordance with the semiconductor chip 101, since the first surface trench 131 is formed adjacent to the Schottky joint portion 141, the electric field intensity at the Schottky interface between the SiC base layer 103 and the anode electrode 139 can be reduced. As a result, the barrier of the Schottky interface can be set low, whereby the Schottky barrier diode can have a low rise voltage.

Furthermore, since the p-type layer 132 is formed on the inner surface of the first surface trench 131, the reverse leakage current can be reduced in the entire semiconductor chip 101. That is, since the reverse leakage current can be reduced even if a reverse voltage close to the breakdown voltage may be applied, the voltage resistance characteristic of the SiC semiconductor can be efficiently utilized.

In addition, since the pn diode 133 is connected in parallel to the Schottky barrier diode 12, a surge current, if it may flow through the semiconductor chip 101, can partially flow through the incorporated pn diode 133. As a result, the surge current flowing through the Schottky barrier diode 12 can be reduced whereby thermal destruction of the Schottky barrier diode 12 due to surge current can be prevented.

Next, a semiconductor chip 151 according to an eighth preferred embodiment will be described.

Figure 21:
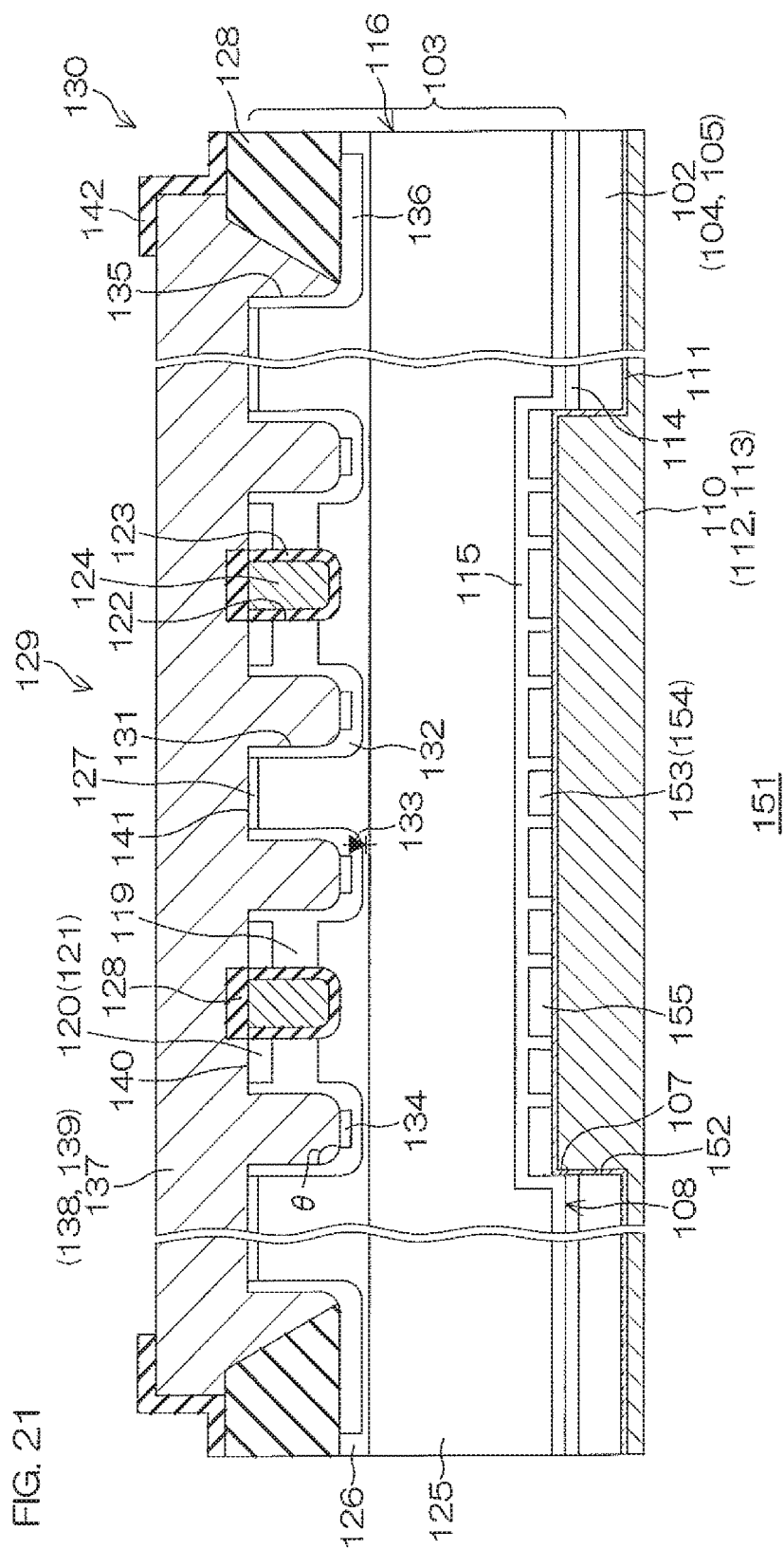
FIG. 21 is a schematic cross-sectional view of a semiconductor chip according to an eighth preferred embodiment of the present invention.

FIG. 21 is a schematic cross-sectional view of the semiconductor chip 151 according to the eighth preferred embodiment of the present invention. In FIG. 21, portions corresponding to those shown in FIG. 18 are designated by the same reference signs to omit the description thereof.

In the semiconductor chip 101 according to the above-described seventh preferred embodiment, the multiple second surface trenches 106 are formed and disposed in a striped manner in the active region 129. On the other hand, in the semiconductor chip 151 according to the eighth preferred embodiment, a single second surface trench 152 is formed correspondingly to the multiple first surface trenches 131 formed in a striped manner. The second surface trench 152 is formed in the second surface of the SiC substrate 102 in a manner covering approximately the entire active region 129.

Drain regions 153 of the MOSFET 11 (cathode regions 154 of the Schottky barrier diode 12) and collector regions 155 of the IGBT 9 are formed alternately in a striped manner on the bottom surface of the second surface trench 152.

FIGS. 22A to 22D show sequential steps of a process for manufacturing the semiconductor chip 151 shown in FIG. 21.

First, as shown in FIG. 22A, in accordance with the step shown in FIG. 20A, the high-concentration impurity region 114 is formed on a surface of the wafer SiC substrate 102, and then a first high-concentration impurity region 143 as a base of the buffer region 115 and the drift region 116 are epitaxially grown sequentially to form the n⁻-type SiC base layer 103.

Figure 22B:
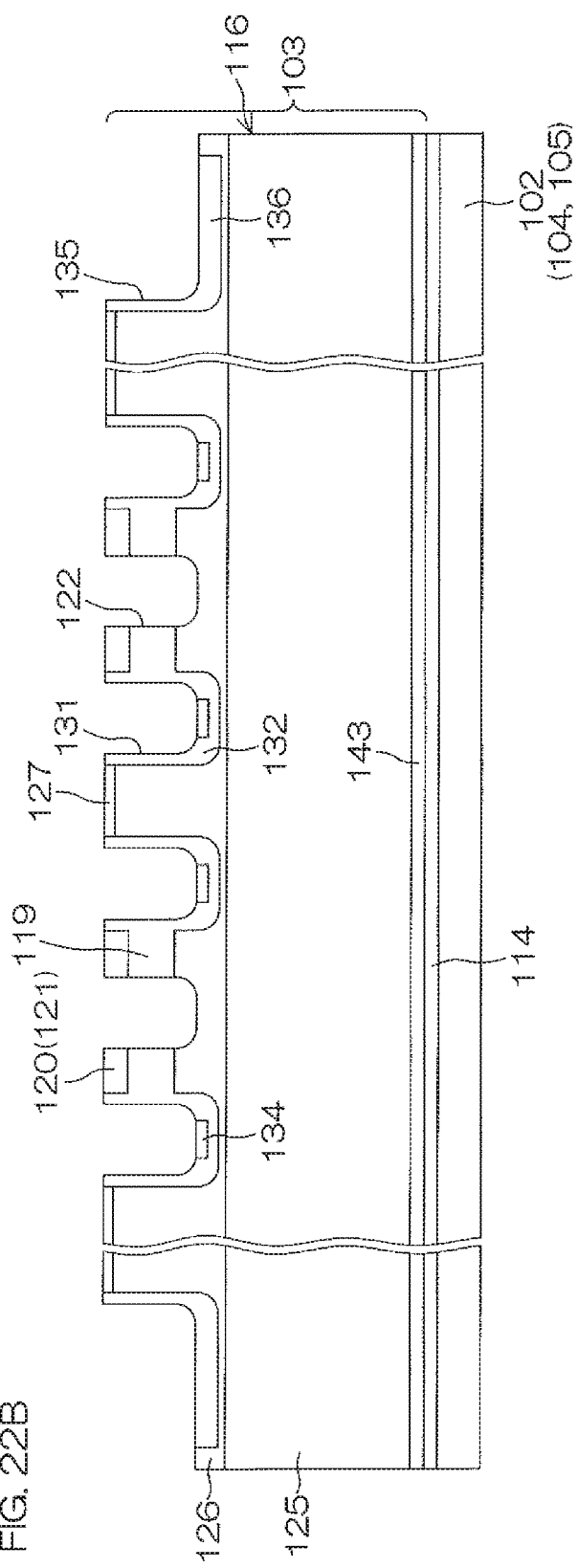
FIG. 22B shows a step following that shown in FIG. 22A.

Next, as shown in FIG. 22B, in accordance with the step shown in FIG. 20B, hard mask formation and ion implantation are conducted according to the shapes of the channel region 119 and the emitter region 120 (source region 121) as well as the types of impurities. This causes the channel region 119 and the emitter region 120 (source region 121) to be formed in the SiC base layer 103.

Next, a hard mask is formed according to the patterns of the gate trench 122, the first surface trench 131, and the annular trench 135 and then, through etching using the hard mask, the gate trench 122, the first surface trench 131, and the annular trench 135 are simultaneously formed to have the same depth.

Next, impurities are selectively implanted into the inner surfaces of the first surface trench 131 and the annular trench 135 to form the p-type layer 132 and the guard ring 136 simultaneously. Further, impurities are selectively formed on the bottom surface of the first surface trench 131 to form the contact layer 134.

Figure 22C:
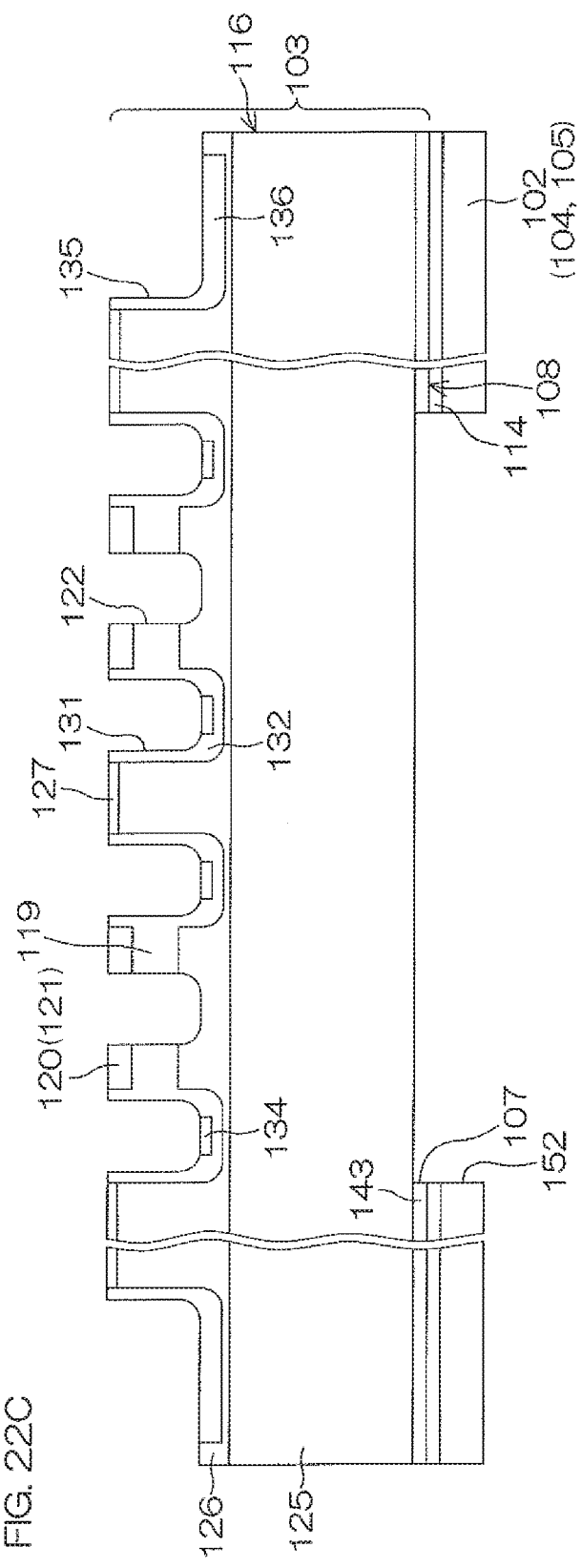
FIG. 22C shows a step following that shown in FIG. 22B.

Next, as shown in FIG. 22C, in accordance with the step shown in FIG. 20C, a hard mask is formed and patterned on the second surface of the SiC substrate 102 and then dry-etched at least until the drift region 116 (base drift region 125) is exposed through the first high-concentration impurity region 143 on the second surface of the SiC substrate 102. This causes the SiC substrate 102 to be selectively dug from the second surface and thereby the second surface trench 152 to be formed.

Figure 22D:
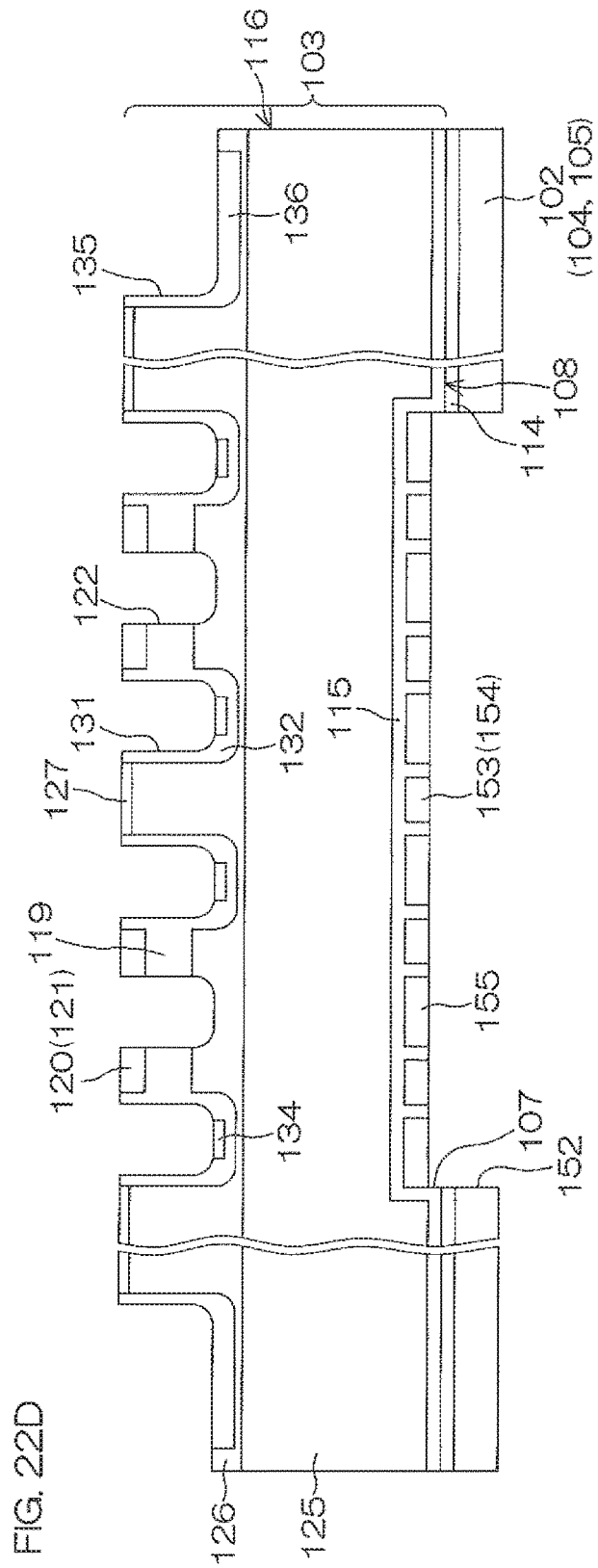
FIG. 22D shows a step following that shown in FIG. 22C.

Next, as shown in FIG. 22D, in accordance with the step shown in FIG. 20D, n-type impurities are implanted into the bottom surface of the second surface trench 152 to form the buffer region 115. Next, p-type impurities are implanted into the bottom surface of the second surface trench 152 to form the collector regions 155 in the SiC base layer 103. Further, n-type impurities are implanted into the bottom surface of the second surface trench 152 to form the drain regions 153 (cathode regions 154) in the SiC base layer 103.

Thereafter, the SiC base layer 103 is annealed. This causes the n-type impurities and the p-type impurities implanted into the drift region 116, the channel region 119, the emitter region 120 (source region 121), the contact layer 134, the buffer region 115, the collector regions 155, and the drain regions 153 (cathode regions 154) to be activated.

Subsequently, in accordance with the above-described method or a known semiconductor manufacturing technique, the gate insulating film 123, the gate electrode 124, the field insulating film 128, the emitter electrode 137, the collector electrode 110, etc., are formed to obtain the semiconductor chip 151 shown in FIG. 21.

As described heretofore, the semiconductor chip 151 can also achieve the same operational advantages as the above-described semiconductor chips 8, 71, and 101.

Next, a semiconductor chip 161 according to a ninth preferred embodiment will be described.

Figure 23:
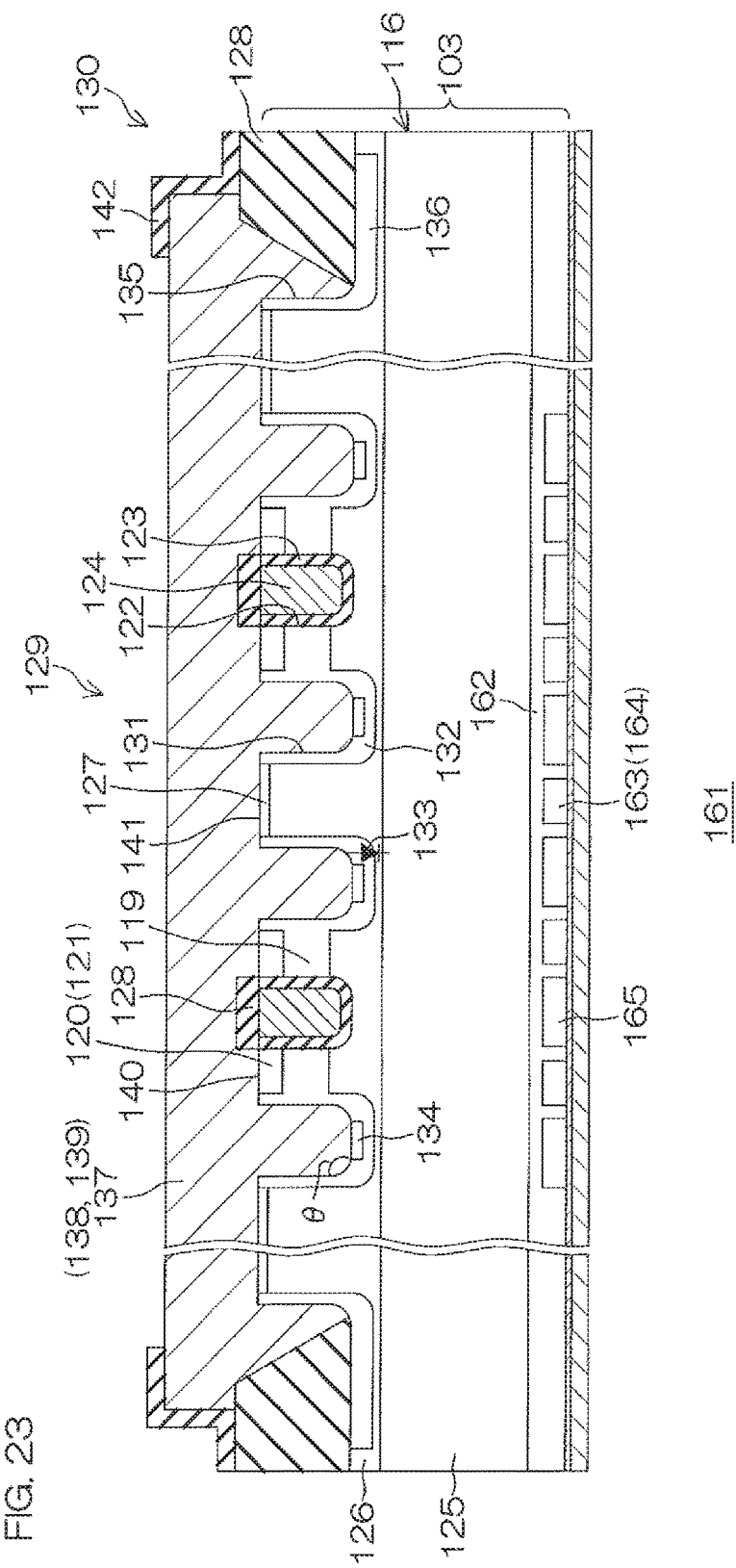
FIG. 23 is a schematic cross-sectional view of a semiconductor chip according to a ninth preferred embodiment of the present invention.

FIG. 23 is a schematic cross-sectional view of the semiconductor chip 161 according to the ninth preferred embodiment of the present invention. In FIG. 23, portions corresponding to those shown in FIG. 18 are designated by the same reference signs to omit the description thereof.

In the semiconductor chips 101 and 151 according to the above-described seventh and eighth preferred embodiments, the SiC substrate 102 is provided to support the SiC base layer 103 thereon. On the other hand, in the semiconductor chip 161 according to the ninth preferred embodiment, the SiC substrate 102 is not provided, so that the entire second surface of the SiC base layer 103 is exposed.

A buffer region 162 is formed over the entire second surface of the exposed SiC base layer 103. In the buffer region 162, drain regions 163 of the MOSFET 11 (cathode regions 164 of the Schottky barrier diode 12) and collector regions 165 of the IGBT 9 are formed alternately in a striped manner so as to be exposed on the second surface of the SiC base layer 103.

FIGS. 24A to 24F show sequential steps of a process for manufacturing the semiconductor chip 161 shown in FIG. 23.

First, as shown in FIG. 24A, only the base drift region 125 is epitaxially grown on a surface of a wafer substrate 166 to form the n⁻-type SiC base layer 103. The substrate 166 used is not limited to an SiC substrate, but may adopt various substrates.

Next, as shown in FIG. 24B, a technique such as grinding, dry etching, or sand blasting is used to grind the substrate 166 until the second surface of the SiC base layer 103 is exposed to thereby remove the substrate 166.

Next, as shown in FIG. 24C, epitaxial growth or ion implantation is used to form the low-resistance drift region 126 and the surficial drift region 127 sequentially on the base drift region 125.

Next, as shown in FIG. 24D, n-type impurities are implanted into the entire second surface of the SiC base layer 103 to form the buffer region 162.

Figure 24E:
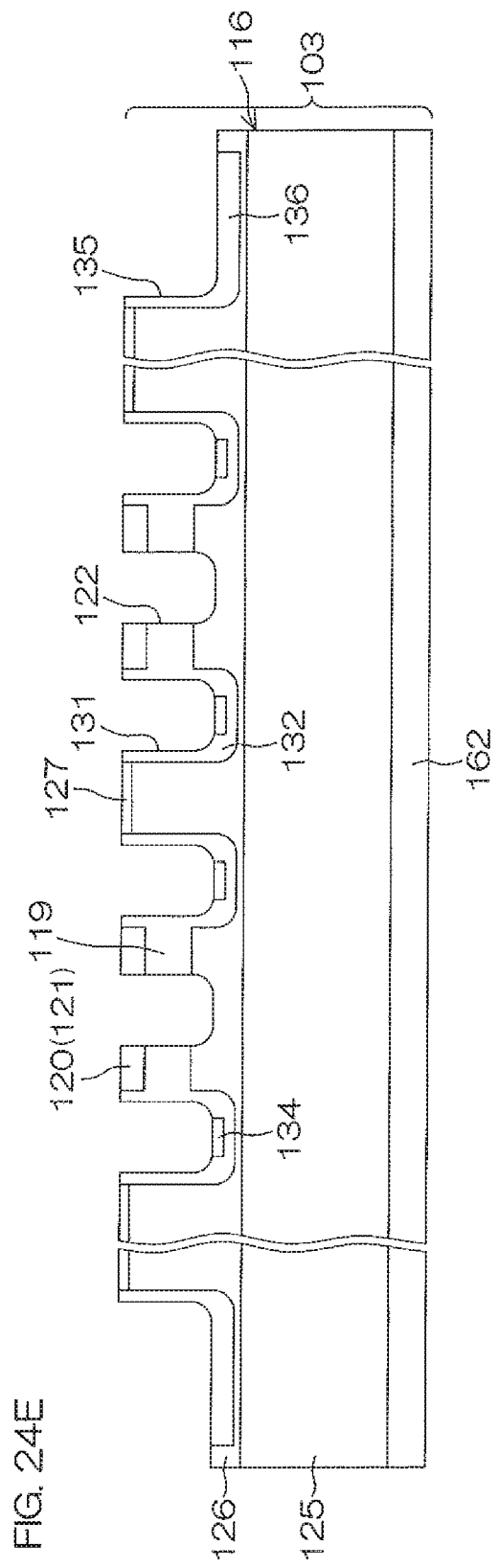
FIG. 24E shows a step following that shown in FIG. 24D.

Next, as shown in FIG. 24E, in accordance with the step shown in FIG. 20B, hard mask formation and ion implantation are conducted according to the shapes of the channel region 119 and the emitter region 120 (source region 121) as well as the types of impurities. This causes the channel region 119 and the emitter region 120 (source region 121) to be formed in the SiC base layer 103.

Next, a hard mask is formed according to the patterns of the gate trench 122, the first surface trench 131, and the annular trench 135 and then, through etching using the hard mask, the gate trench 122, the first surface trench 131, and the annular trench 135 are simultaneously formed to have the same depth.

Next, impurities are selectively implanted into the inner surfaces of the first surface trench 131 and the annular trench 135 to form the p-type layer 132 and the guard ring 136 simultaneously. Further, impurities are selectively formed on the bottom surface of the first surface trench 131 to form the contact layer 134.

Figure 24F:
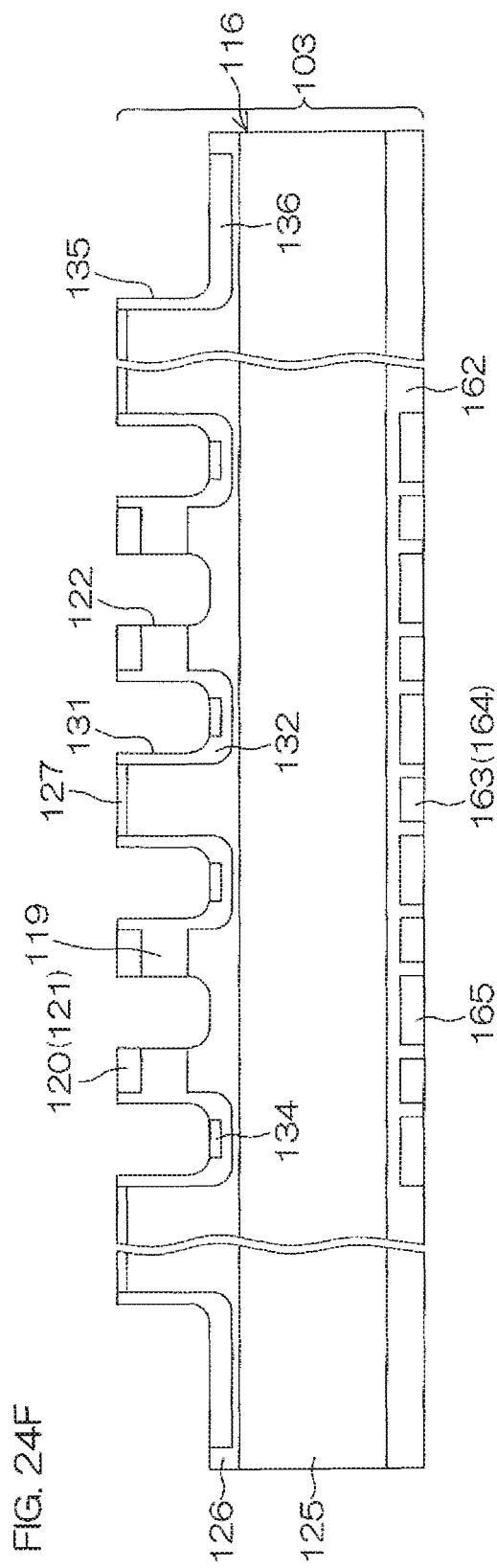
FIG. 24F shows a step following that shown in FIG. 24E.

Next, as shown in FIG. 24F, in accordance with the step shown in FIG. 20D, p-type impurities are implanted into the second surface of the SiC base layer 103 to form the collector regions 65 in the SiC base layer 103. Further, n-type impurities are implanted into the second surface of the SiC base layer 103 to form the drain regions 163 (cathode regions 164) in the SiC base layer 103.

Thereafter, the SiC base layer 103 is annealed. This causes the n-type impurities and the p-type impurities implanted into the drift region 116, the channel region 119, the emitter region 120 (source region 121), the contact layer 134, the buffer region 162, the collector regions 165, and the drain regions 163 (cathode regions 164) to be activated.

Subsequently, in accordance with the above-described method or a known semiconductor manufacturing technique, the gate insulating film 123, the gate electrode 124, the field insulating film 128, the emitter electrode 137, the collector electrode 110, etc., are formed to obtain the semiconductor chip 161 shown in FIG. 23.

As described heretofore, the semiconductor chip 161 can also achieve the same operational advantages as the above-described semiconductor chips 8, 71, 101, and 151.

Although the preferred embodiments of the present invention have heretofore been described, the present invention can be embodied in still other forms.

For example, an arrangement may be adopted in which the conductive type of the semiconductor portions in the IGBT 9, the body diode 10, the MOSFET 11, and the Schottky barrier diode 12 is inverted. In the IGBT 9, for example, the p-type portions may be n-type, while the n-type portions may be p-type.

In the seventh to ninth preferred embodiments, the unit cells of the IGBT 9 and the MOSFET 11 and the unit cells of the Schottky barrier diode 12 are arranged alternately. However, the arrangement is not particularly limited, and two or more of the latter unit cells may be arranged between a pair of the former unit cells, for example.

The features understood from the disclosure of the above-described preferred embodiments may also be combined between different preferred embodiments. Further, the components presented in the preferred embodiments may be combined within the scope of the present invention.

The preferred embodiments of the present invention are merely specific examples used to clarify the technical contents of the present invention, and the present invention should not be understood as being limited to these specific examples, and the spirit and scope of the present invention is to be limited solely by the appended claims.

DESCRIPTION OF SIGNS

1 Semiconductor package
2 Resin package

3 Gate terminal
4 Emitter terminal
5 Collector terminal
6 Island (of the collector terminal)
7 Terminal portion (of the collector terminal)
8 Semiconductor chip
9 IGBT
10 Body diode
11 MOSFET
12 Schottky barrier diode
13 Bonding wire
14 Bonding wire
15 IGBT chip
16 MOSFET chip
17 Schottky barrier diode chip
18 Bonding wire
19 Bonding wire
20 Bonding wire
21 Bonding wire
22 Bonding wire
23 SiC semiconductor layer
24 First surface (of the SiC semiconductor layer)
25 Second surface (of the SiC semiconductor layer)
26 Emitter electrode
27 Collector electrode
28 Source electrode
29 Drain electrode
30 Anode electrode
31 Cathode electrode
32 SiC substrate
33 SiC base layer
34 Drain region
35 Cathode region
36 Trench
37 Collector region
38 Metal silicide
39 Channel region
40 Base surficial portion
41 Emitter region
42 Source region
43 Channel contact region
44 Gate insulating film
45 Gate electrode
46 Interlayer insulating film
47 Contact hole
48 Contact hole
49 Ohmic contact portion
50 Schottky joint portion
51 Hard mask
52 SiC substrate
53 P$^+$-type portion
54 N$^+$-type portion
55 Gate trench
56 Gate insulating film
57 Gate electrode
58 Inverter circuit
59 Three-phase motor
59U U-phase (of the three-phase motor)
59V V-phase (of the three-phase motor)
59W W-phase (of the three-phase motor)
60 DC power supply
61 Switching unit
62 High-voltage wire
63 Low-voltage wire
64 Series circuit
65 Series circuit
66 Series circuit
67H High-side transistor
67L Low-side transistor
68H High-side transistor
68L Low-side transistor
69H High-side transistor
69L Low-side transistor
71 Semiconductor chip
72 Step
73 Convex portion
74 Buffer layer
75 Drift layer
76 First portion (of the buffer layer)
77 Second portion (of the buffer layer)
78 High-concentration impurity region
79 First high-concentration impurity layer
80 Second high-concentration impurity layer
101 Semiconductor chip
102 SiC substrate
103 SiC base layer
104 Drain region
105 Cathode region
106 Second surface trench
107 Step
108 Convex portion
109 Collector region
110 Collector electrode
111 Metal silicide
112 Drain electrode
113 Cathode electrode
114 High-concentration impurity region
115 Buffer region
116 Drift region
117 First portion (of the buffer region)
118 Second portion (of the buffer region)
119 Channel region
120 Emitter region
121 Source region
122 Gate trench
123 Gate insulating film
124 Gate electrode
125 Base drift region
126 Low-resistance drift region
127 Surficial drift region
128 Field insulating film
129 Active region
130 Field region
131 First surface trench
132 P-type layer
133 pn diode
134 Contact layer
135 Annular trench
136 Guard ring
137 Emitter electrode
138 Source electrode
139 Anode electrode
140 Ohmic contact portion
141 Schottky joint portion
142 Surface protection film
143 First high-concentration impurity region
151 Semiconductor chip
152 Second surface trench
153 Drain region
154 Cathode region
155 Collector region
161 Semiconductor chip
162 Buffer region
163 Drain region 164 Cathode region
165 Collector region
166 Substrate

The invention claimed is:

1. A semiconductor device having an SiC-IGBT and an SiC-MOSFET in a single semiconductor chip, comprising:
a second conductive-type SiC base layer having a first surface and a second surface, the second surface of the second conductive-type SiC base layer being on a second conductive-type SiC substrate, the second conductive-type SiC substrate having a first surface facing the second surface of the SiC base layer and a second surface opposite the first surface of the SiC substrate and defining a drain region of the SiC-MOSFET;
a trench etched in the second surface of the SiC substrate;
first conductive-type impurities implanted in a bottom surface of the trench so as to form a collector region in the bottom surface, the collector region having a first surface extending along the second surface of the SiC base layer and a second surface extending along a thickness direction of the SiC base layer;
first conductive-type impurities implanted in the first surface of the SiC base layer so as to form a channel region in a surficial portion of the SiC base layer; and
second conductive-type impurities implant into the first surface of the SiC base layer so as to form an emitter region in a surficial portion of the channel region, the emitter region serving also as a source region of the SiC-MOSFET, wherein
the SiC base layer includes a first region having a first impurity concentration in contact with the channel region and a second region having a second impurity concentration higher than the first impurity concentration and surrounding the collector region such that the second region is in contact with both the first surface and the second surface of the collector region, and
the second region of the SiC base layer is independent from the drain region.

2. The semiconductor device according to claim 1, wherein the SiC base layer is exposed to the trench.

3. The semiconductor device according to claim 1, wherein a plurality of the trenches are formed in a striped manner.

4. The semiconductor device according to claim 1, wherein a deepest portion of the trench is at a position nearer the first surface of the SiC base layer with respect to an interface between the SiC substrate and the SiC base layer.

5. The semiconductor device according to claim 1, wherein a deepest portion of the trench is at a position nearer the second surface of the SiC substrate with respect to an interface between the SiC substrate and the SiC base layer.

6. A semiconductor device having an SiC-IGBT and an SiC-MOSFET in a single semiconductor chip, comprising:
a second conductive-type SiC base layer having a first surface and a second surface, the second surface of the second conductive-type SiC base layer being on a second conductive-type SiC substrate having a first surface facing the second surface of the SiC base layer and a second surface opposite the first surface of the SiC substrate;
a trench etched in the second surface of the SiC substrate;
first conductive-type impurities implanted in a bottom surface of the trench so as to form a collector region in the bottom surface, the collector region having a first surface extending along the second surface of the SiC base layer and a second surface extending along a thickness direction of the SiC base layer;
second conductive-type impurities implanted in the bottom surface of the trench so as to form a drain region in the bottom surface;
first conductive-type impurities implanted in the first surface of the SiC base layer so as to form a channel region in a surficial portion of the SiC base layer; and
second conductive-type impurities implanted in the first surface of the SiC base layer so as to form an emitter region in a surficial portion of the channel region, the emitter region serving also as a source region of the SiC-MOSFET, wherein
the SiC base layer includes a first region having a first impurity concentration in contact with the channel region and a second region having a second impurity concentration higher than the first impurity concentration and surrounding the collector region such that the second region is in contact with both the first surface and the second surface of the collector region, and
the second region of the SiC base layer is independent from the drain region.

7. The semiconductor device according to claim 6, wherein the SiC base layer is exposed to the trench.

8. The semiconductor device according to claim 6, wherein a plurality of the trenches are disposed in a striped manner.

9. The semiconductor device according to claim 6, wherein a deepest portion of the trench is at a position nearer the first surface of the SiC base layer with respect to an interface between the SiC substrate and the SiC base layer.

10. The semiconductor device according to claim 6, wherein a deepest portion of the trench is at a position nearer the second surface of the SiC substrate with respect to an interface between the SiC substrate and the SiC base layer.

* * * * *